US009343705B2

(12) United States Patent
Yonehara et al.

(10) Patent No.: US 9,343,705 B2
(45) Date of Patent: May 17, 2016

(54) LIGHT EMITTING ELEMENT AND LIGHT EMITTING DEVICE INCLUDING A CONDUCTIVE SECTION

(71) Applicant: KABUSHIKI KAISHA TOSHIBA, Tokyo (JP)

(72) Inventors: Toshiya Yonehara, Fukuoka (JP); Tomio Ono, Kanagawa (JP); Tomoaki Sawabe, Tokyo (JP); Keiji Sugi, Kanagawa (JP); Daimotsu Kato, Tokyo (JP); Shintaro Enomoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/638,585

(22) Filed: Mar. 4, 2015

(65) Prior Publication Data

US 2015/0179983 A1  Jun. 25, 2015

Related U.S. Application Data

(63) Continuation of application No. PCT/JP2013/005521, filed on Sep. 18, 2013.

(30) Foreign Application Priority Data

Sep. 24, 2012 (JP) .................................. 2012-210189

(51) Int. Cl.
*H01L 51/52* (2006.01)
*H01L 51/00* (2006.01)
(52) U.S. Cl.
CPC ........ *H01L 51/5275* (2013.01); *H01L 51/0096* (2013.01); *H01L 51/5221* (2013.01);
(Continued)

(58) Field of Classification Search
CPC ............ H01L 51/5275; H01L 51/0096; H01L 51/5221; H01L 51/5262; H01L 51/5231; H01L 2251/558; H01L 51/5268
See application file for complete search history.

(56) References Cited

U.S. PATENT DOCUMENTS 6,660,411 B2  12/2003 Sato et al.
6,707,248 B1 * 3/2004 Burroughes ........ H01L 51/5231
313/504

(Continued)

FOREIGN PATENT DOCUMENTS

CN    1340217 A    3/2002
EP    1 968 133 A2  9/2008

(Continued)

OTHER PUBLICATIONS

Office Action issued by the Taiwanese Intellectual Property Office on May 11, 2015, for Taiwanese Patent Application No. 102134296, and English-language translation thereof.

(Continued)

*Primary Examiner* — John P Dulka
(74) *Attorney, Agent, or Firm* — Finnegan, Henderson, Farabow, Garrett & Dunner, LLP

(57) ABSTRACT

According to one embodiment, a light emitting element includes a first electrode, a second electrode, a light emitting layer, and a conductive section. The second electrode is provided opposite to the first electrode. The light emitting layer is provided between the first electrode and the second electrode. The second electrode includes a plurality of layers, and the plurality of layers include a first layer. The conductive section pierces the first layer in thickness direction. The conductive section includes a conductive material. Each of the plurality of layers includes at least one of Al, Al alloy, Ag, Ag alloy, alkali metals, and alkaline-earth metals and being different from one another.

19 Claims, 46 Drawing Sheets

(52) U.S. Cl.
CPC ........ *H01L51/5231* (2013.01); *H01L 51/5262*
(2013.01); *H01L 51/5268* (2013.01); *H01L 2251/558* (2013.01)

(56) References Cited

U.S. PATENT DOCUMENTS

| | | | |
|---|---|---|---|
| 6,765,350 B1 * | 7/2004 | Burroughes | ........ H01L 51/5231 313/504 |
| 2004/0245919 A1 | 12/2004 | Kim | |
| 2006/0108580 A1 | 5/2006 | Yoshida et al. | |
| 2008/0218069 A1 * | 9/2008 | Kim | .................... H01L 27/3209 313/506 |
| 2008/0238297 A1 | 10/2008 | Oota | |
| 2012/0193613 A1 | 8/2012 | Kadoma et al. | |
| 2012/0229020 A1 * | 9/2012 | Yonehara | ............ H01L 51/5072 313/504 |

FOREIGN PATENT DOCUMENTS

| | | |
|---|---|---|
| EP | 2 498 580 A1 | 9/2012 |
| JP | 2006-92936 | 4/2006 |
| TW | 200908787 A | 2/2009 |
| TW | 201235351 A1 | 9/2012 |
| TW | 201238109 A1 | 9/2012 |
| WO | WO 00/48258 | 8/2000 |

OTHER PUBLICATIONS

Reineke et al., "While organic light-emitting diodes with fluorescent tube efficiency," Nature (May 14, 2009), 459:234-239.
International Search Report issued by the European Patent Office in International Application No. PCT/JP2013/005521; mailed Jan. 27, 2014, 4 pages.
Notification of Transmittal of the International Search Report and the Written Opinion of the International Searching Authority, or the Declaration, issued by the European Patent Office in International Application No. PCT/JP2013/005521, mailed Jan. 27, 2014, 8 pages.
Akiyoshi Mikami, "Optical Design of Enhanced Light Extraction Efficiency in Multi-Stacked OLEDs Coupled with High Refractive-Index Medium and Back-Cavity Structure", SID 2012 Digest, 51.1, pp. 683-686.
Goto, et al., "Optical Analysis of Surface-Plasmon Loss in OLED with Multi-Cathode Structure", Japan Society of Applied Physics, 59 (2012) p. 12-277.
Notification of Comments issued by the Korean Patent Office on Dec. 2. 2015, in counterpart Korean Patent Application No. 10-2015-7007008.

* cited by examiner

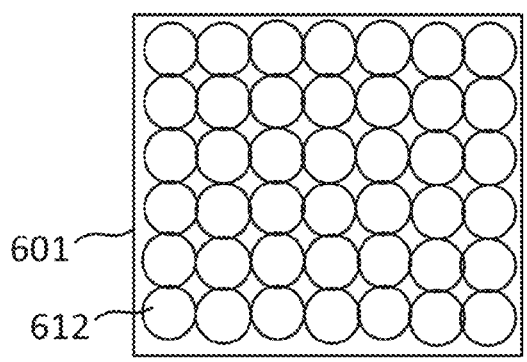
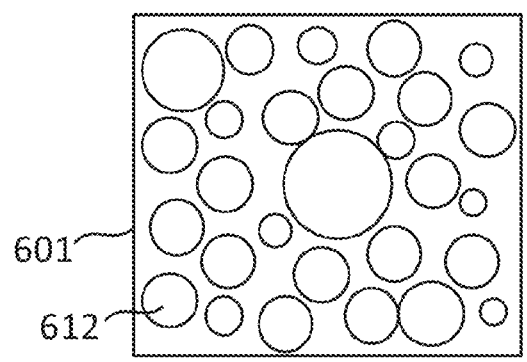
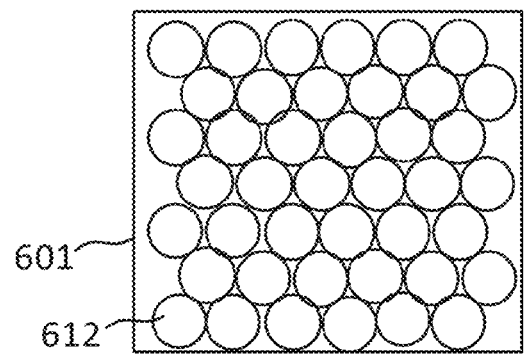
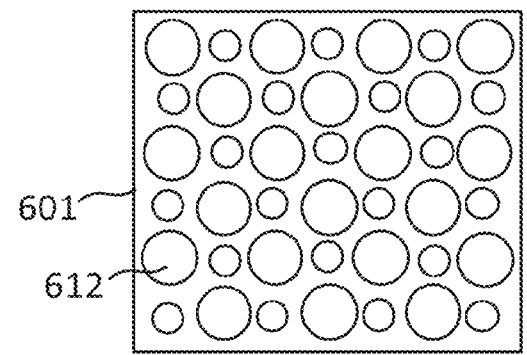
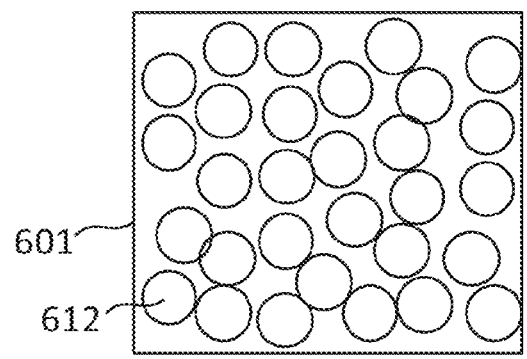

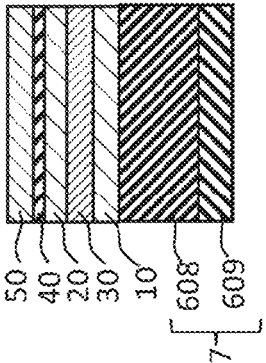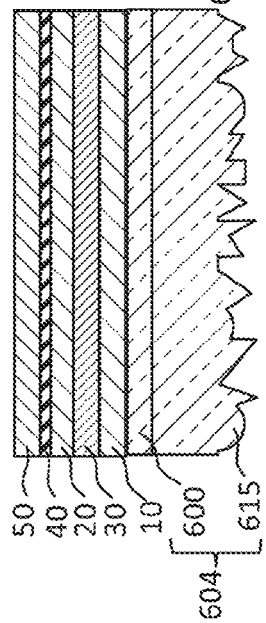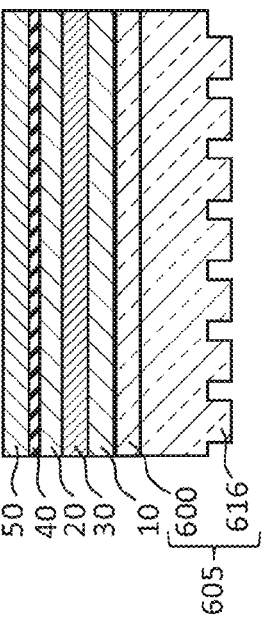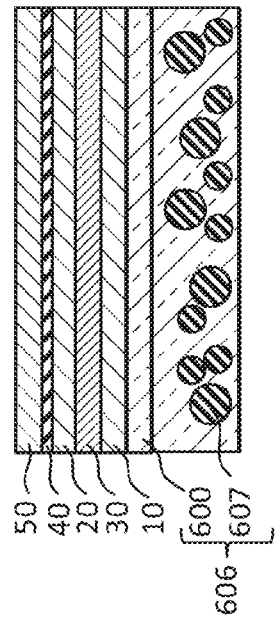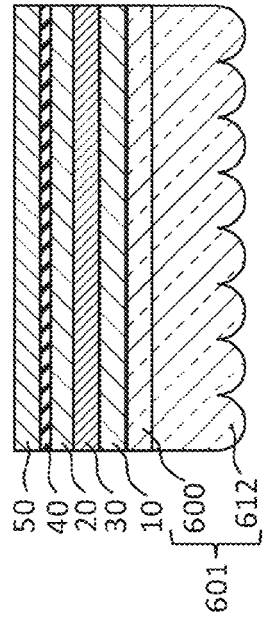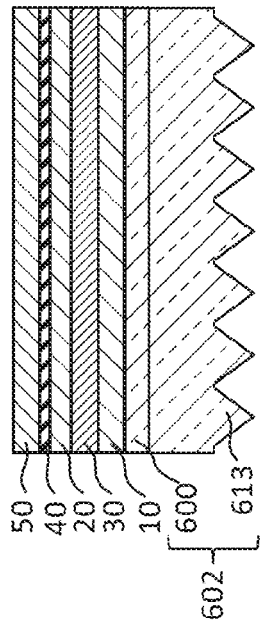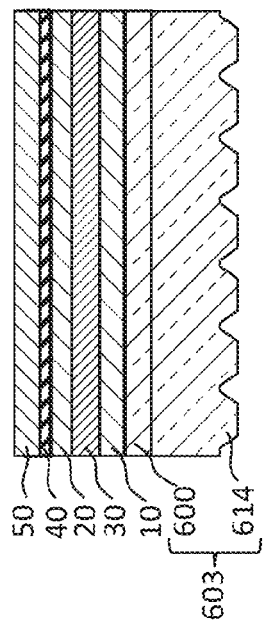

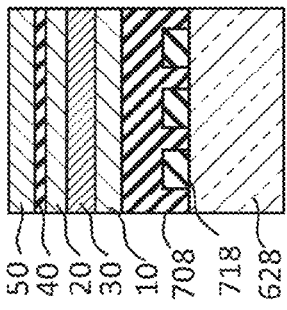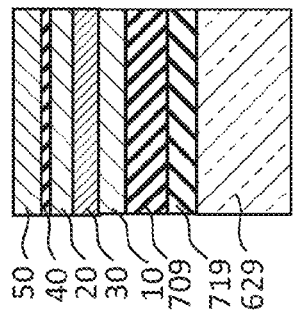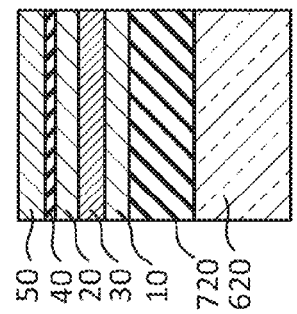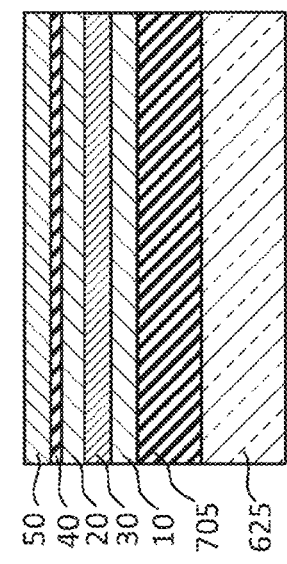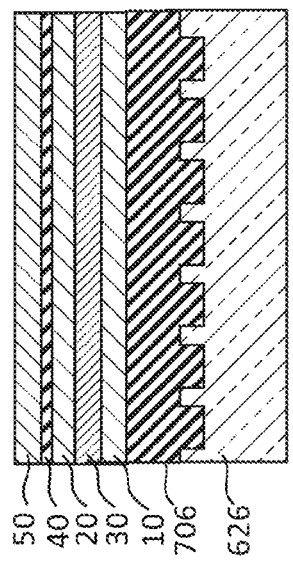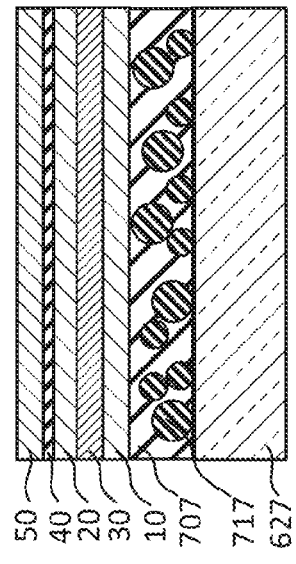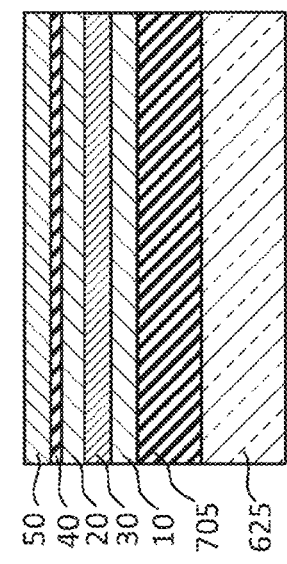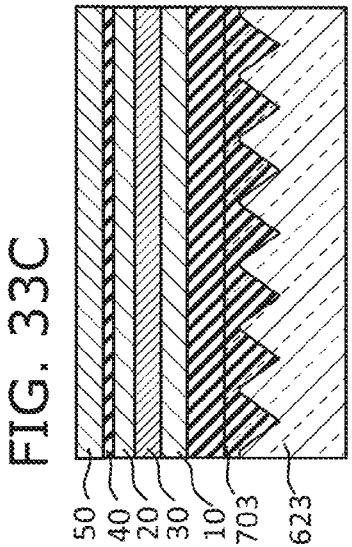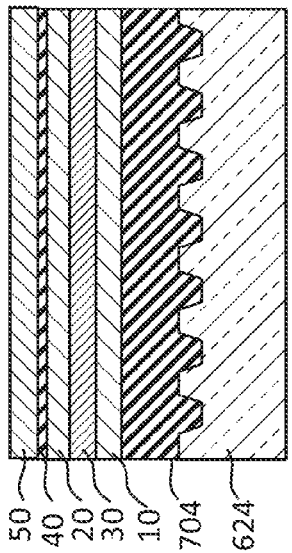

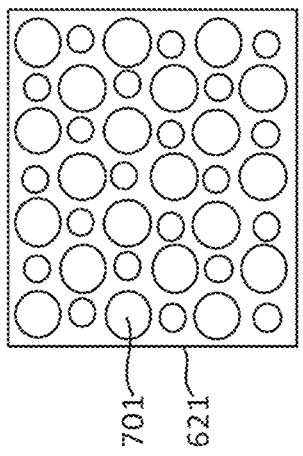
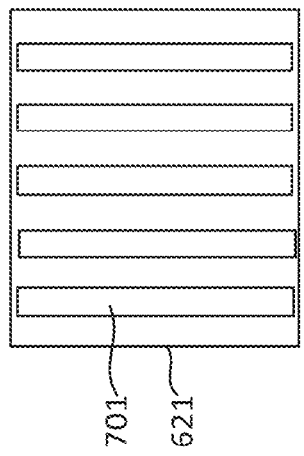
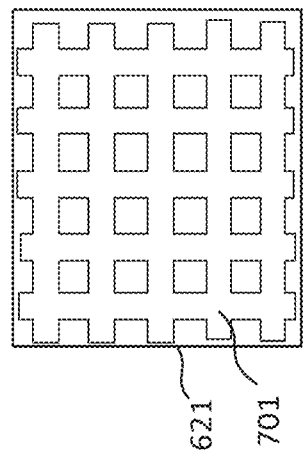
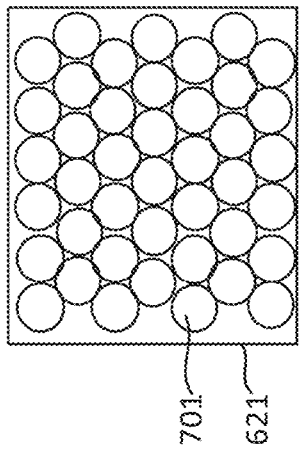
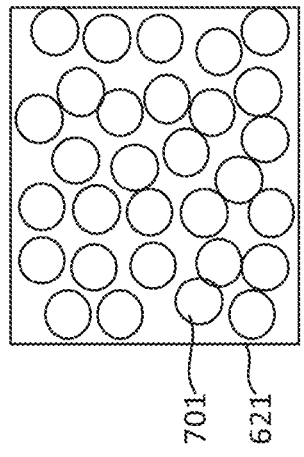
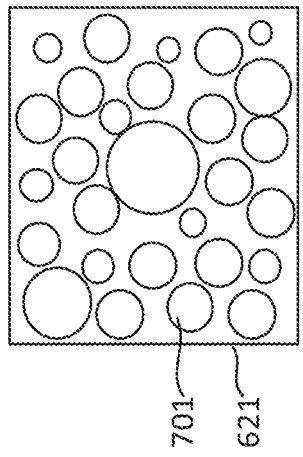
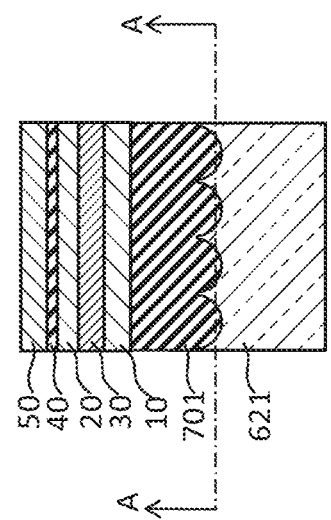
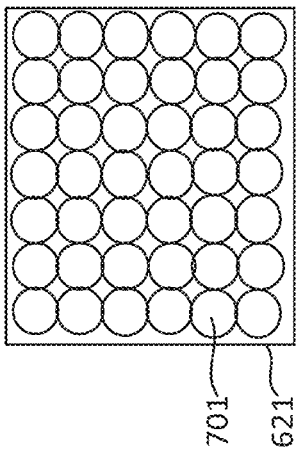

LIGHT EMITTING ELEMENT AND LIGHT EMITTING DEVICE INCLUDING A CONDUCTIVE SECTION

CROSS-REFERENCE TO RELATED APPLICATIONS

This application is based upon and claims the benefit of priority from Japanese Patent Application No. 2012-210189, filed on Sep. 24, 2012, and PCT Patent Application PCT/JP2013/005521, filed on Sep. 18, 2013; the entire contents of which are incorporated herein by reference.

FIELD

Embodiments described herein relate generally to a light emitting element and a light emitting device.

BACKGROUND

The organic electroluminescent element is known as an example of the light emitting element.

The organic electroluminescent element includes a cathode electrode, an anode electrode, and a light emitting layer provided between the cathode electrode and the anode electrode.

In the organic electroluminescent element, a voltage is applied between the cathode electrode and the anode electrode. Thus, electrons are injected from the cathode electrode into the light emitting layer, and holes are injected from the anode electrode into the light emitting layer. The injected electrons and holes are recombined, and excitons are generated by the recombination. When the exciton undergoes radiative deactivation, light is generated.

In light emitting elements such as the organic electroluminescent element, improvement in light extraction efficiency is desired.

BRIEF DESCRIPTION OF THE DRAWINGS

FIGS. 30A to 30E are schematic views illustrating cross-section of FIG. 29A;

FIGS. 32A to 32G are schematic views illustrating organic electroluminescent elements according to variations of the fifth embodiment;

FIGS. 33A to 33J are schematic views illustrating organic electroluminescent elements according to a sixth embodiment;

FIGS. 34A to 34H are schematic views illustrating cross-section of FIG. 33A;

DETAILED DESCRIPTION

Figure 1:
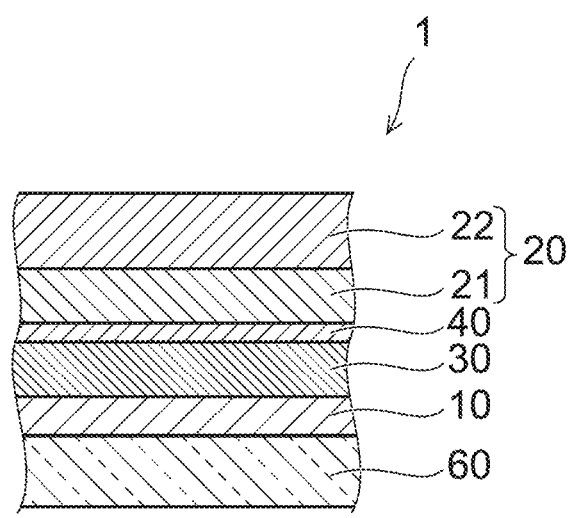
FIG. 1 is a schematic cross-sectional view illustrating a light emitting element according to a first embodiment.

According to one embodiment, a light emitting element includes a first electrode, a second electrode, a light emitting layer, and a conductive section. The second electrode is provided opposite to the first electrode. The light emitting layer provided between the first electrode and the second electrode. The second electrode includes a plurality of layers. The conductive section pierces the first layer in thickness direction. The conductive section includes a conductive material. The second electrode includes a plurality of layers. Each of the plurality of layers includes at least one selected from the group consisting of Al, Al alloy, Ag, Ag alloy, alkali metals, and alkaline-earth metals and being different from one another.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

In the following description, as an example of the light emitting element, an organic electroluminescent element usable for displays (display devices) and illumination devices is taken. However, the light emitting element is not limited to an organic electroluminescent element. The embodiments are applicable to a light emitting element including a light emitting layer having a refractive index of 1.6 or more and 2.2 or less.

First Embodiment

FIG. 1 is a schematic sectional view for illustrating a light emitting element according to a first embodiment.

As shown in FIG. 1, an organic electroluminescent element 1 as an example of the light emitting element includes a first electrode 10, a second electrode 20, a light emitting layer 30, and a first functional layer 40.

The first electrode 10 is transmissive to light emitted from the light emitting layer 30.

The first electrode 10 functions as e.g. an anode. The thickness dimension (length along the stacking direction) of the first electrode 10 can be set to e.g. 50 nanometers (nm) or more.

The first electrode 10 includes e.g. an oxide containing at least one element selected from the group consisting of In, Sn, Zn, and Ti. The first electrode 10 is e.g. an ITO (indium tin oxide) film.

The second electrode 20 is provided opposite to the first electrode 10.

The second electrode 20 functions as e.g. a cathode.

As described below, the second electrode 20 includes a plurality of layers. The plurality of layers contain at least one selected from the group consisting of Al, Al alloy, Ag, Ag alloy, alkali metals, and alkaline-earth metals and being different from one another.

Alternatively, the first electrode 10 may be used as a cathode, and the second electrode 20 may be used as an anode.

The second electrode 20 includes a first layer 21 and a second layer 22.

The first layer 21 is provided on the side provided with the light emitting layer 30. The second layer 22 is provided on an opposite side of the first layer from a side opposing the light emitting layer. That is, the first layer 21 is provided between the first functional layer 40 and the second layer 22.

The first layer 21 can be formed from a conductive material having low plasmon loss.

Examples of the material having low plasmon loss can include a material containing at least one selected from the group consisting of alkali metals and alkaline-earth metals.

For instance, the first layer 21 can be made of a material including at least one of the alkali metals and the alkaline-earth metals, and the second layer 22 can be made of a material including at least one selected from the group consisting of Al, Ag, and Ag alloy.

The thickness dimension of the first layer 21 can be set to 1 nanometer (nm) or more and 100 nanometers (nm) or less.

The first layer 21 may be provided partly on the surface of the second layer 22, or may be provided so as to cover the surface of the second layer 22. However, if the first layer 21 covers the surface of the second layer 22, the plasmon loss can be further reduced.

In this case, the thickness dimension of the first layer 21 can be set to 10 nanometer (nm) or more. Then, the first layer 21 can be provided so as to cover the surface of the second layer 22. Thus, the thickness dimension of the first layer 21 is preferably set to 10 nanometer (nm) or more and 100 nanometers (nm) or less.

The details on such as the reduction of plasmon loss, the material of the first layer 21, and the thickness dimension of the first layer 21 will be described later.

The second layer 22 is provided on the opposite side of the first layer 21 from the side provided with the first functional layer 40.

The material of the second layer 22 is not particularly limited as long as it is conductive.

Here, if the first layer 21 is formed from an alkali metal or the like, the first layer 21 may have high electrical resistance. Then, if the second layer 22 is formed from a material having low electrical resistance, the driving voltage can be reduced. For instance, the second layer 22 can be made of a material containing at least one selected from the group consisting of Al, Al alloy, Ag, and Ag alloy (e.g., magnesium silver alloy).

The thickness dimension of the second layer 22 is not particularly limited. However, if it is made too thin, then in the second electrode 20, a large potential difference may occur between the near side and the far side with respect to the portion connected to the external power supply. If a large potential difference occurs between the near side and the far side with respect to the portion connected to the external power supply, brightness unevenness may occur.

Thus, the thickness dimension of the second layer 22 can be set to e.g. approximately 150 nanometers (nm).

The organic electroluminescent element 1 according to this embodiment has a second electrode 20 including a first layer 21 containing a material having low plasmon loss and a second layer 22 containing a material having low electrical resistance. Thus, the plasmon loss can be reduced. Accordingly, the light extraction efficiency can be improved.

The light emitting layer 30 is provided between the first electrode 10 and the first functional layer 40. The light emitting layer 30 emits light containing a component of the wavelength of visible light. The thickness dimension of the light emitting layer 30 can be set to e.g. 10 nanometers (nm) or more.

The light emitting layer 30 can be formed from e.g. an organic material. The light emitting layer 30 contains such as $Alq_3$, F8BT, and PPV. The light emitting layer 30 can be made of a mixed material of a host material and a dopant added to the host material. The host material can be based on such as CBP, BCP, TPD, PVK, and PPT. The dopant material can be based on such as Flrpic, $Ir(ppy)_3$, $Ir(MDQ)_2(acac)$, Ir(piq) and Flr6.

Alternatively, the light emitting layer 30 can be formed from a material containing no dopant.

The light emitting layer 30 can be made of one layer, or can be made by stacking a plurality of layers formed from different materials.

The first functional layer 40 is provided between the light emitting layer 30 and the first layer 21.

The thickness dimension of the first functional layer 40 is not particularly limited. The thickness dimension of the first functional layer 40 can be set to e.g. approximately 1 nanometer (nm).

The first functional layer 40 functions as e.g. an electron injection layer. The first functional layer 40 functioning as an electron injection layer can contain such as LiF and CsF.

The first functional layer 40 functions as e.g. an electron transport layer.

The first functional layer 40 can be made by stacking a layer functioning as an electron injection layer and a layer functioning as an electron transport layer. The layer functioning as an electron transport layer contains such as $Alq_3$, BAlq, $POPy_2$, Bphen, and 3TPYMB.

The first functional layer 40 is not necessarily needed, but can be provided as necessary.

The organic electroluminescent element 1 illustrated in FIG. 1 includes a substrate 60 on the opposite side of the first electrode 10 from the side provided with the light emitting layer 30. That is, the first electrode 10 is provided between the substrate 60 and the light emitting layer 30. The substrate 60 is transmissive to light emitted from the light emitting layer 30. The substrate 60 is e.g. a glass substrate.

The organic electroluminescent element 1 is an organic electroluminescent element of the bottom emission type. The light emitted from the light emitting layer 30 is extracted primarily from the first electrode 10 side (substrate 60 side).

Furthermore, a second functional layer, not shown, can also be provided between the first electrode 10 and the light emitting layer 30.

The second functional layer functions as e.g. a hole injection layer. The second functional layer functioning as a hole injection layer contains such as PEDPOT:PPS, CuPc, and $MoO_3$.

The second functional layer functions as e.g. a hole transport layer. The second functional layer functioning as a hole transport layer contains such as α-NPD, TAPC, m-MTDATA, TPD, and TCTA.

The second functional layer may be made by stacking a layer functioning as a hole injection layer and a layer functioning as a hole transport layer.

The thickness dimension of the second functional layer is not particularly limited. The thickness dimension of the second functional layer can be set to e.g. approximately 1 nanometer (nm). The second functional layer is provided as necessary.

Furthermore, a plurality of microlenses, not shown, can also be provided on the surface of the substrate 60 on the opposite side from the side provided with the first electrode 10. The shape of the microlens is not particularly limited. For instance, the microlens can be shaped like a hemisphere. In the case where a plurality of microlenses are provided on the substrate 60, a microlens sheet with a plurality of microlenses arranged like a matrix can be formed in advance, and then affixed to the substrate 60.

Furthermore, it is also possible to provide a scattering layer which changes a path of light on the substrate 60.

Next, the aforementioned reduction of plasmon loss is further described.

Figure 2A:
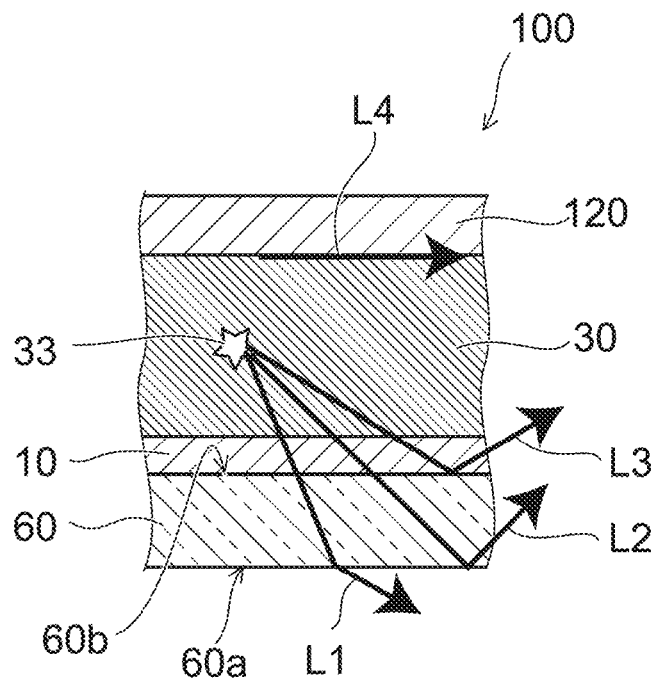
FIGS. 2A and 2B are schematic views illustrating the loss of light generated at a light emitting position 33 in the light emitting layer 30 provided in an organic electroluminescent element 100 according to a comparative example.
Figure 2B:
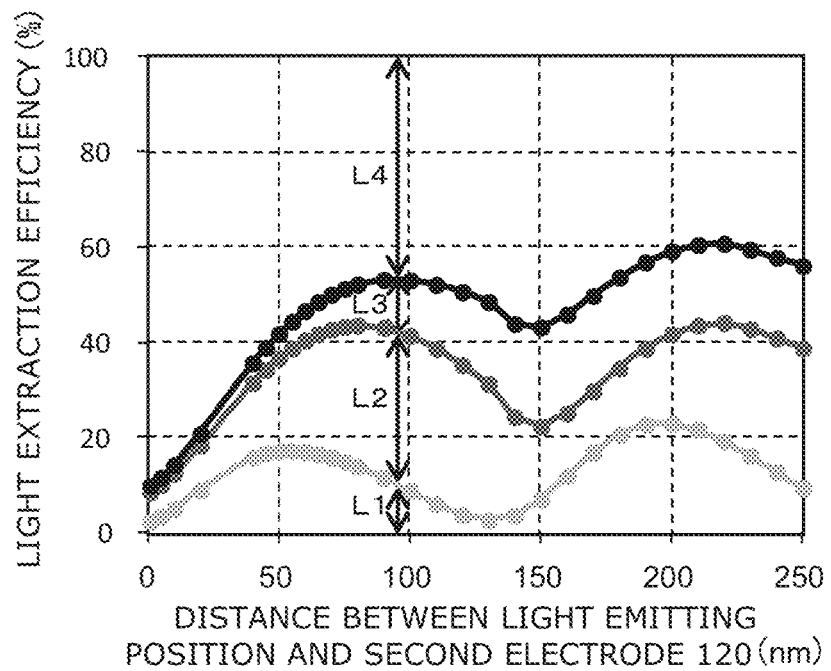

FIGS. 2A and 2B are schematic views illustrating the loss of light generated at a light emitting position 33 in the light emitting layer 30 provided in an organic electroluminescent element 100 according to a comparative example.

Here, FIG. 2A is a schematic sectional view illustrating the trace of light generated at the light emitting position 33 in the light emitting layer 30. FIG. 2B is a graph illustrating the loss in each optical mode. FIG. 2B shows an example simulation result for light extraction efficiency. The horizontal axis of FIG. 2B represents the distance from the light emitting position 33 to the second electrode 120. The vertical axis of FIG. 2B represents the light extraction efficiency. The condition of the simulation was set as follows. The first electrode 10 was assumed to be made of ITO. The thickness dimension of the first electrode 10 was set to 110 nanometers (nm). The refractive index of the light emitting layer 30 was set to 1.9. The thickness dimension of the light emitting layer 30 was given by adding 80 nanometers (nm) to each distance from the light emitting position 33 to the second electrode 120 (each distance on the horizontal axis of FIG. 2B). The second electrode 120 was assumed to be made of Al. The thickness dimension of the second electrode 120 was set to 150 nanometers (nm). The refractive index of the substrate 60 was set to 1.5. The wavelength of light generated at the light emitting position 33 in the light emitting layer 30 was set to 525 nanometers (nm).

As shown in FIG. 2A, the organic electroluminescent element 100 according to the comparative example includes a first electrode 10, a second electrode 120 made of metal (Al), a light emitting layer 30, and a substrate 60. That is, the organic electroluminescent element 100 according to the comparative example has the configuration of a typical organic electroluminescent element. Thus, the organic electroluminescent element 100 according to the comparative example does not include the aforementioned second electrode 20 including a first layer 21 and a second layer 22.

As shown in FIG. 2A, in the organic electroluminescent element 100, traces of light generated at the light emitting position 33 in the light emitting layer 30 are broadly classified into four types. The light generated at the light emitting position 33 includes an external mode component L1, a substrate mode component L2, a thin film layer mode component L3, and a loss component L4 in the second electrode 120 made of metal. In the following, the "loss component L4 in the second electrode 120 made of metal" is simply referred to as "loss component L4".

The external mode component L1 is a component that can be extracted to the outside of the organic electroluminescent element 100. The substrate mode component L2 is a component reaching the substrate 60 but totally reflected at the interface between the substrate 60 and outside air. The thin film layer mode component L3 is a component reaching the first electrode 10 but totally reflected at the interface between the first electrode 10 and the substrate 60. In this case, the substrate mode component L2 can be extracted to the outside from a surface of the substrate 60 other than the surface 60a in contact with outside air and the surface 60b in contact with the first electrode 10, such as from a surface crossing the surface 60a or the surface 60b. Likewise, the thin film layer mode component L3 can also be extracted to the outside from the first electrode 10. That is, the external mode component L1, the substrate mode component L2, and the thin film layer mode component L3 are components that can be extracted to the outside.

In contrast, the loss component L4 is a component lost by the second electrode 120 made of metal.

Here, the light incident on the second electrode 120 includes propagating light and non-propagating light.

The propagating light and the non-propagating light are components of light emitted from the light emitting layer 30.

The propagating light is light that could propagate to infinity in an absorption-free medium.

The non-propagating light is light with the intensity attenuated exponentially with the propagation distance.

In the case where a boundary with different refractive indices exists between the light emitting position 33 and the second electrode 120, part of the propagating light may turn to non-propagating light by total reflection and reach the second electrode 120.

The loss component L4 includes the loss of propagating light and the loss of non-propagating light.

The loss of propagating light (hereinafter referred to as propagating light loss) is a loss due to absorption by the second electrode 120. The propagating light loss does not depend on the distance between the light emitting position 33 and the second electrode 120.

The loss of non-propagating light (hereinafter referred to as non-propagating light loss) is caused by interaction of evanescent light with electrons in the metal of the second electrode 120. This non-propagating light loss is called plasmon loss. The plasmon loss (non-propagating light loss) depends on the distance between the light emitting position 33 and the second electrode 120. As the distance between the light emitting position 33 and the second electrode 120 becomes longer, the plasmon loss becomes lower.

As shown in FIG. 2B, the external mode component L1, the substrate mode component L2, the thin film layer mode component L3, and the loss component L4 vary with e.g. the distance from the light emitting position 33 to the second electrode 120.

The light extraction efficiency of the organic electroluminescent element 100 can be improved by reducing the plasmon loss portion of the loss component L4 that cannot be extracted to the outside. The plasmon loss can be reduced by lengthening the distance between the light emitting position 33 and the second electrode 120.

In this case, as in the organic electroluminescent element 1 illustrated in FIG. 1, a first functional layer 40 functioning as an electron injection layer or electron transport layer can be provided between the second electrode 120 and the light emitting layer 30. Then, the distance between the light emitting position 33 and the second electrode 120 can be lengthened by increasing the thickness dimension of the first functional layer 40.

However, to reduce the plasmon loss, the thickness dimension of the first functional layer 40 needs to be set to approximately 200 nanometers (nm). This may increase the voltage drop and raise the driving voltage.

Thus, the organic electroluminescent element 1 according to this embodiment is configured to include a second electrode 20 including a first layer 21 containing a material having low plasmon loss and a second layer 22 containing a material having low electrical resistance. Accordingly, the plasmon loss can be reduced by the first layer 21, and the driving voltage can be reduced by the second layer 22.

Figure 3:
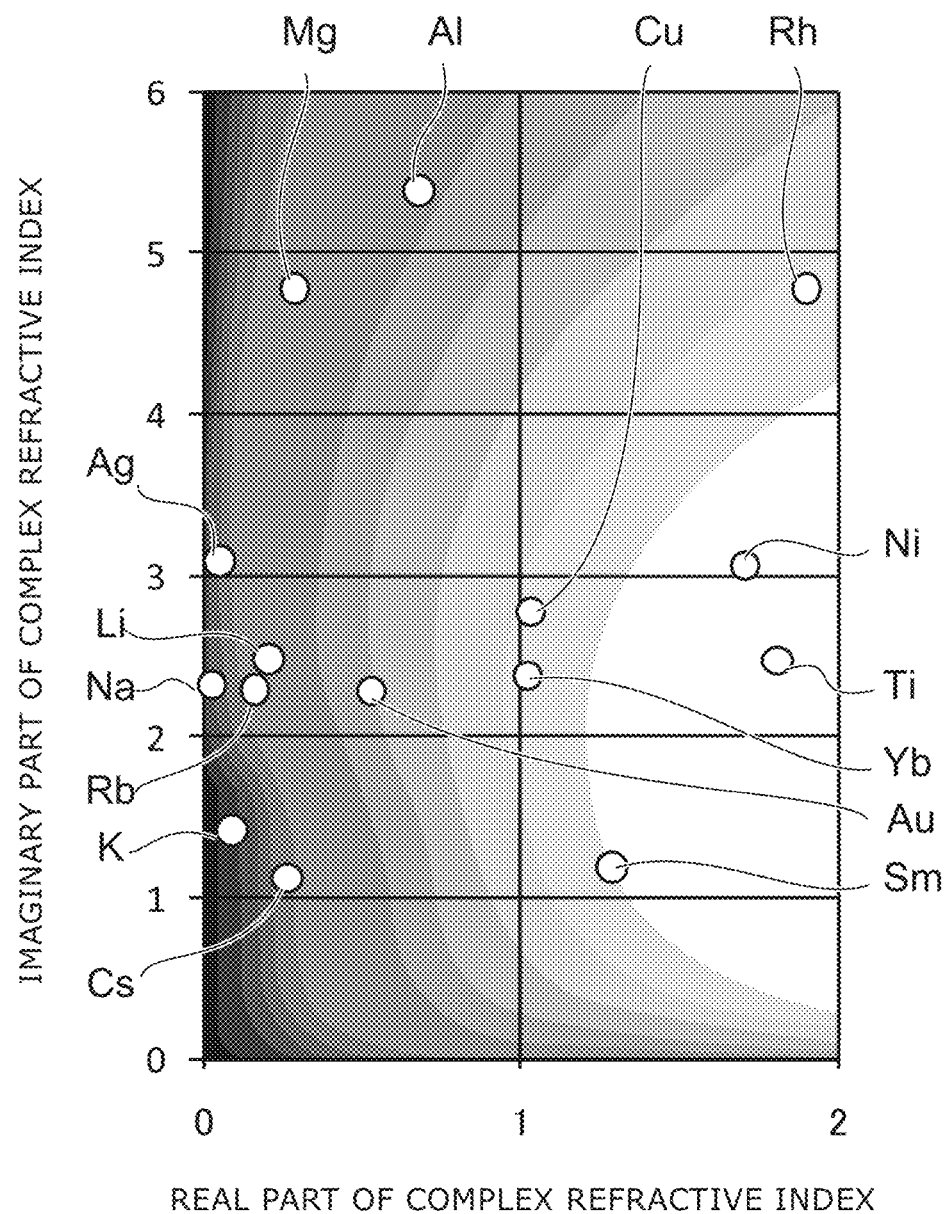
FIG. 3 is a graph illustrating the relationship between the material contained in the first layer 21 and the light extraction efficiency.

FIG. 3 is a graph illustrating the relationship between the material contained in the first layer 21 and the light extraction efficiency.

The horizontal axis of FIG. 3 represents the real part of the complex refractive index of the first layer 21. The vertical axis of FIG. 3 represents the imaginary part of the complex refractive index of the first layer 21.

The symbols in FIG. 3 represent respective materials.

In FIG. 3, the magnitude of the light extraction efficiency is represented by monotone shading. Here, higher light extraction efficiency is represented by darker shading, and lower light extraction efficiency is represented by lighter shading.

FIG. 3 shows an example simulation result for light extraction efficiency.

The condition of the simulation was set as follows. The first electrode 10 was assumed to be made of ITO. The second layer 22 was assumed to be made of Ag. The wavelength of light generated at the light emitting position 33 in the light emitting layer 30 was set to 525 nanometers (nm). The thickness dimension of the first layer 21 was set to 20 nanometers (nm). The thickness dimension of the second layer 22 was set to 150 nanometers (nm). The material contained in the first layer 21 was changed, and the light extraction efficiency for each material was determined.

As seen from FIG. 3, the light extraction efficiency can be improved if the material contained in the first layer 21 is an alkali metal such as Li, Na, K, Rb, and Cs, compared with such as Al and Au.

The light extraction efficiency can be improved also for an alkaline-earth metal such as Mg, compared with such as Al and Au.

In this case, the first layer 21 only needs to contain at least one of alkali metals and alkaline-earth metals. For instance, the first layer 21 may be made of one (single element) of the alkali metals and the alkaline-earth metals. Alternatively, for instance, the first layer 21 may be made of an alloy containing at least one of the alkali metals and the alkaline-earth metals.

The first layer 21 can contain an element other than the alkali metals and the alkaline-earth metals. However, if the element other than the alkali metals and the alkaline-earth metals is contained in an excessively large amount, the plasmon loss may be increased. Thus, in the case where the first layer 21 contains an element other than the alkali metals and the alkaline-earth metals, the added amount is preferably made smaller so that the light extraction efficiency is not made lower than that for such as Al and Au.

Here, in the example illustrated in FIG. 3, the wavelength of light generated at the light emitting position 33 in the light emitting layer 30 is 525 nanometers (nm).

According to the knowledge obtained by the inventors, the light extraction efficiency varies with the element contained in the first layer 21 and the wavelength component of light. That is, the light extraction efficiency has wavelength dependence.

Next, the wavelength dependence of the light extraction efficiency is described.

FIGS. 4A to 10D are graphs for illustrating the wavelength dependence of the light extraction efficiency.

FIGS. 4A to 10D show example simulation results.

The horizontal axis in FIGS. 4A to 10D represents the thickness dimension of the first layer 21. The vertical axis in FIGS. 4A to 10D represents the light extraction efficiency. L11 and L11' in FIGS. 4A to 10D represent the external mode component L1, and L12 and L12' represent the sum of the external mode component L1 and the substrate mode component L2. L13 and L13' represent the sum of the external mode component L1, the substrate mode component L2, and the thin film layer mode component L3. L11, L12, and L13 represent the case where a first layer 21 made of a prescribed material is provided. L11', L12', and L13' represent the case where a second electrode 120 made of Ag is provided.

Here, with the decrease of plasmon loss, the loss component L4 is reduced. The reduction of the loss component L4 results in increasing the external mode component L1, the substrate mode component L2, and the thin film layer mode component L3.

Thus, in FIGS. 4A to 10D, the state of L11, L12, and L13 higher than L11', L12', and L13' indicates improvement in light extraction efficiency.

In FIGS. 4A to 10D, the figures with the suffix A show the case where the wavelength of light generated at the light emitting position 33 in the light emitting layer 30 is 450 nanometers (nm). The figures with the suffix B show the case where the wavelength of light is 500 nanometers (nm). The figures with the suffix C show the case where the wavelength of light is 550 nanometers (nm). The figures with the suffix D show the case where the wavelength of light is 600 nanometers (nm).

In FIGS. 4A to 10D, the first electrode 10 was assumed to be made of ITO. The thickness dimension of the first electrode 10 was set to 110 nanometers (nm). The refractive index of the light emitting layer 30 was set to 1.8. The thickness dimension of the light emitting layer 30 was set to 140 nanometers (nm). The thickness dimension of the first layer 21 was set to 20 nanometers (nm). The second layer 22 was assumed to be made of Ag. The thickness dimension of the second layer 22 was set to 150 nanometers (nm). The light emitting position 33 was set to the position of 40 nanometers (nm) into the light emitting layer 30 from the surface of the light emitting layer 30 on the side provided with the second electrode 20.

FIGS. 4A to 4D show the case where the first layer 21 is made of Li.

Figure 4A:
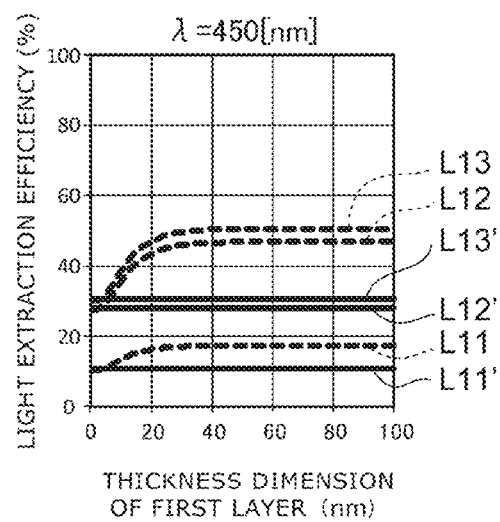
FIGS. 4A to 4D are graphs for illustrating the wavelength dependence of the light extraction efficiency.
Figure 4B:
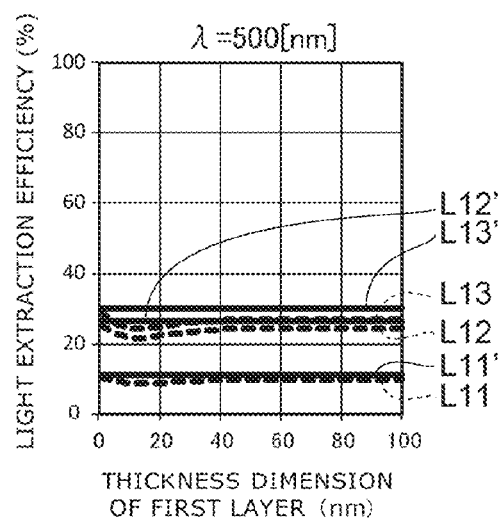
Figure 4C:
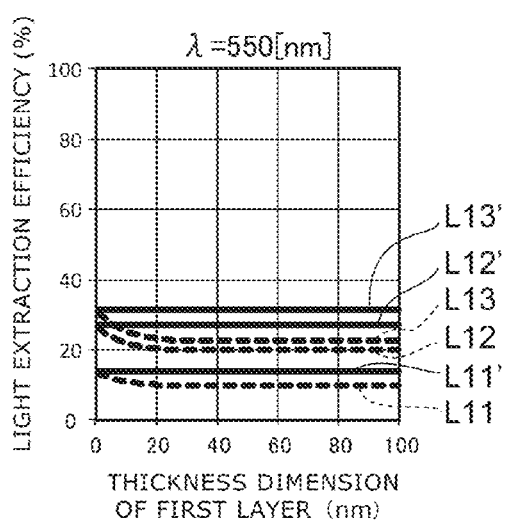
Figure 4D:
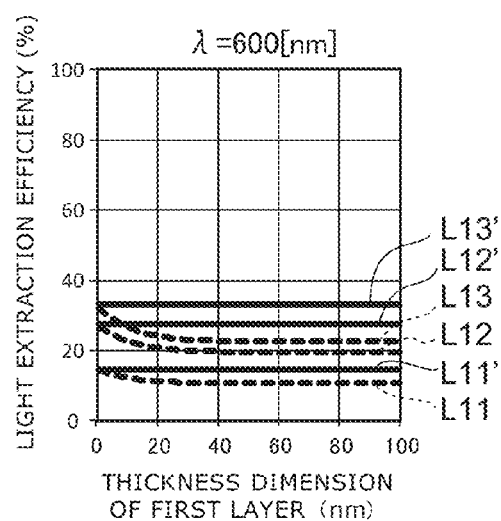

As seen from FIG. 4A, in the case where the wavelength of light generated at the light emitting position 33 in the light emitting layer 30 is short, the plasmon loss can be reduced by using a first layer 21 containing Li. Thus, the light extraction efficiency can be improved.

FIGS. 5A to 5D show the case where the first layer 21 is made of Na.

Figure 5A:
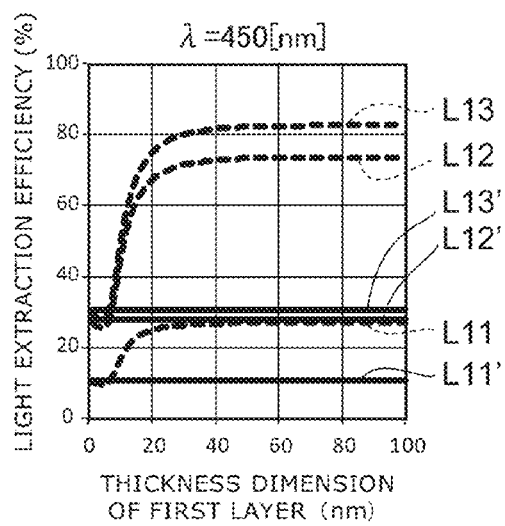
FIGS. 5A to 5D are graphs for illustrating the wavelength dependence of the light extraction efficiency.
Figure 5B:
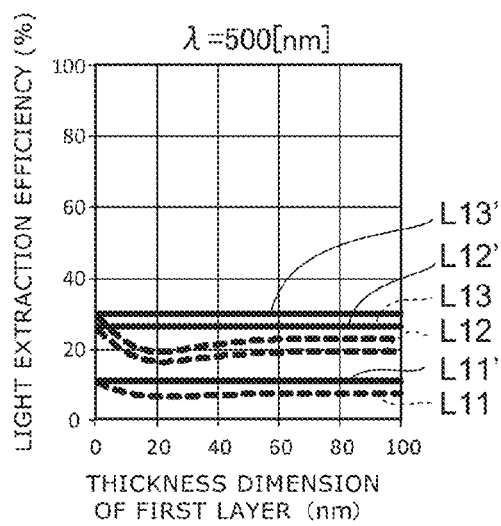
Figure 5C:
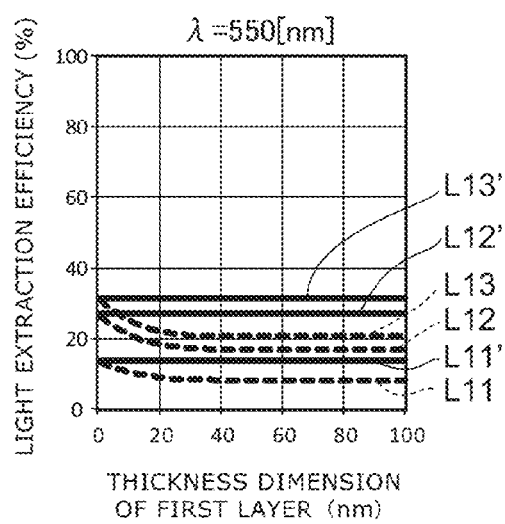
Figure 5D:
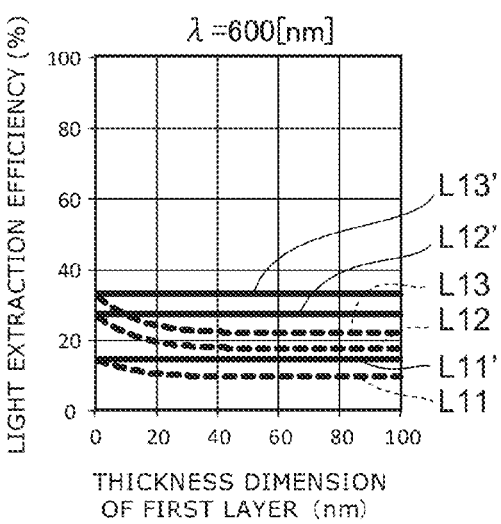
Figure 6A:
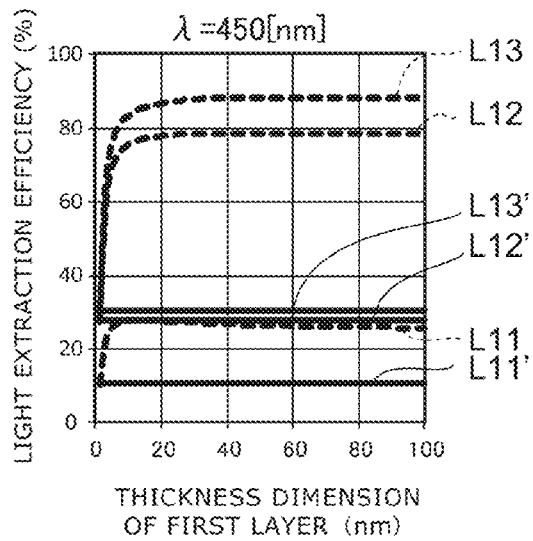
FIGS. 6A to 6D are graphs for illustrating the wavelength dependence of the light extraction efficiency.
Figure 6B:
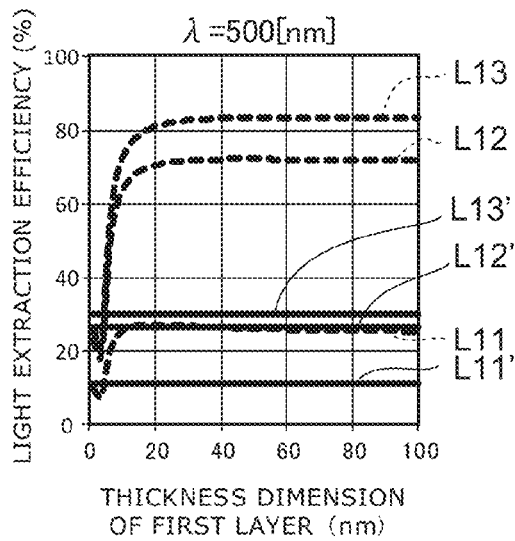
Figure 6C:
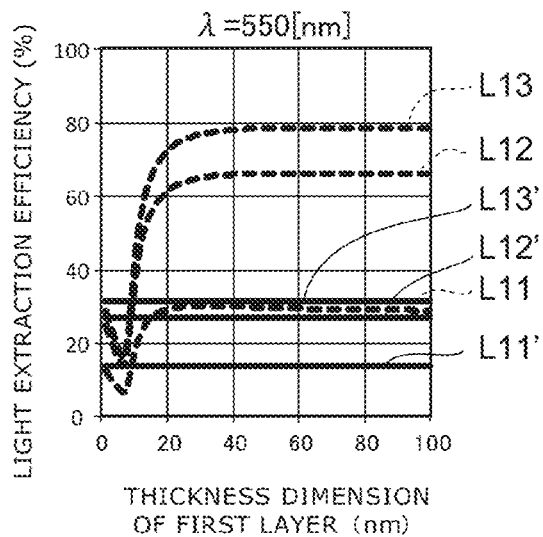
Figure 6D:
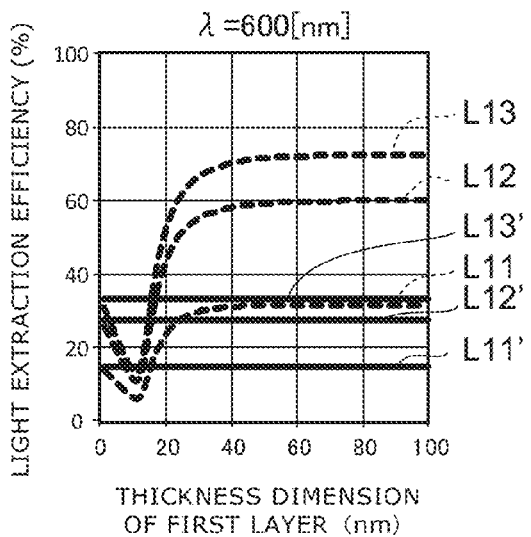
Figure 7A:
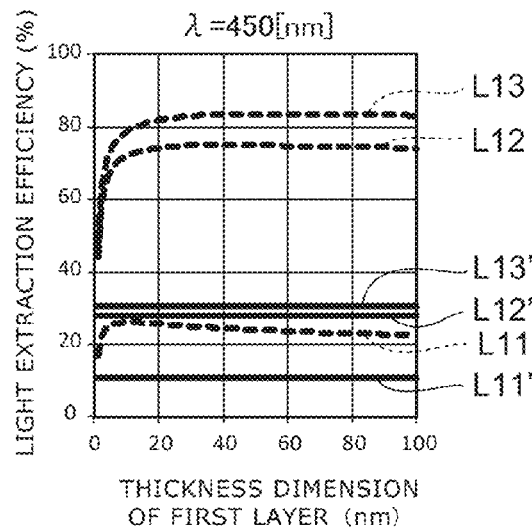
FIGS. 7A to 7D are graphs for illustrating the wavelength dependence of the light extraction efficiency.
Figure 7B:
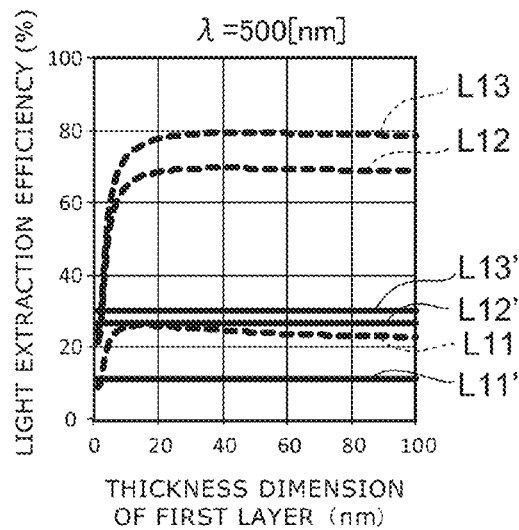
Figure 7C:
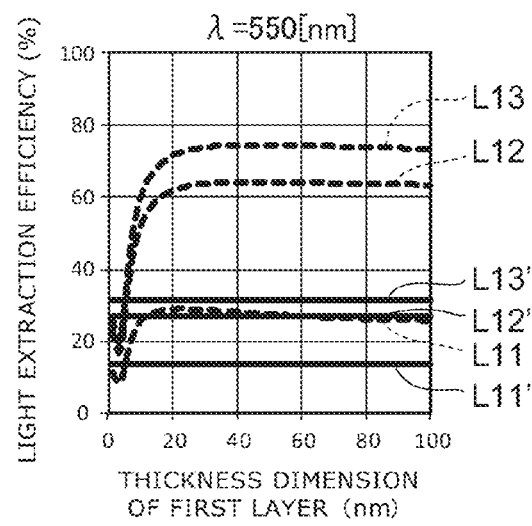
Figure 7D:
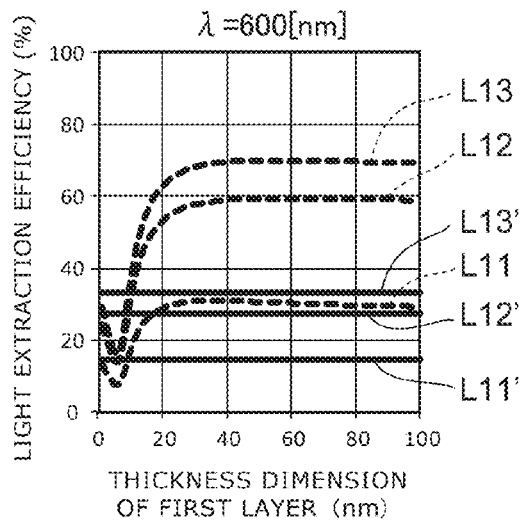
Figure 8A:
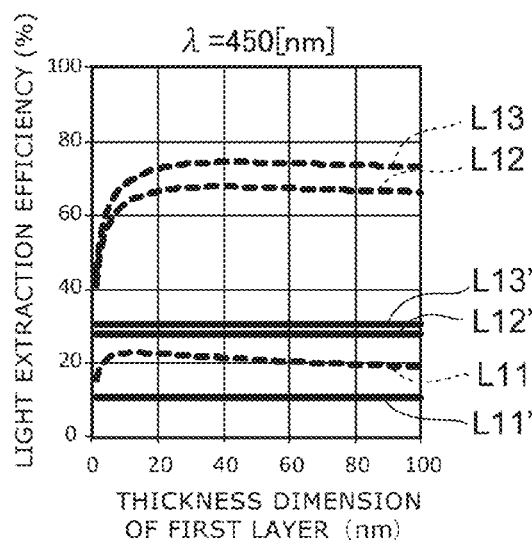
FIGS. 8A to 8D are graphs for illustrating the wavelength dependence of the light extraction efficiency.
Figure 8B:
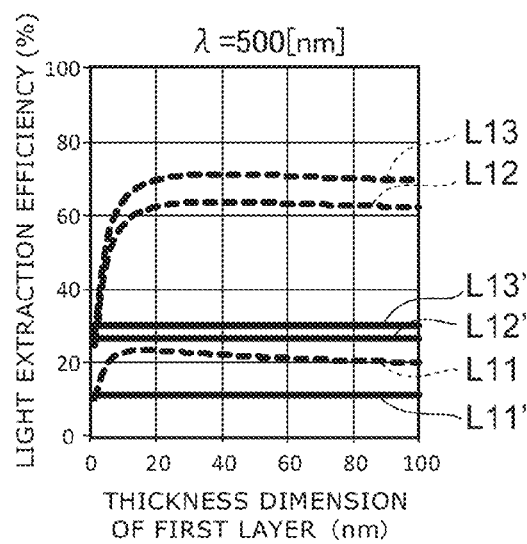
Figure 8C:
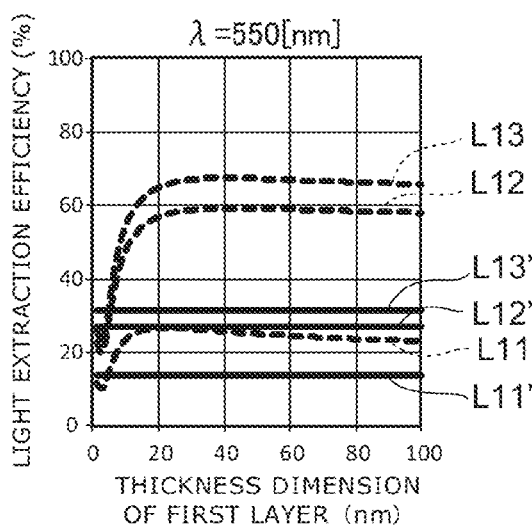
Figure 8D:
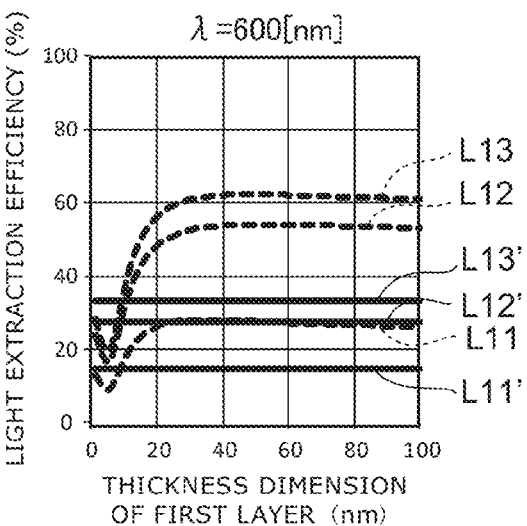
Figure 9A:
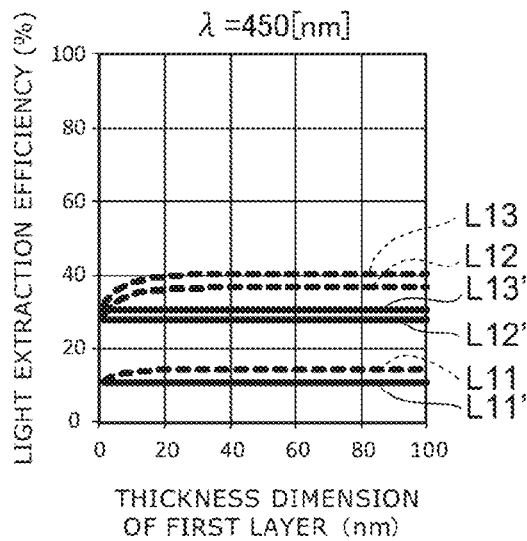
FIGS. 9A to 9D are graphs for illustrating the wavelength dependence of the light extraction efficiency.
Figure 9B:
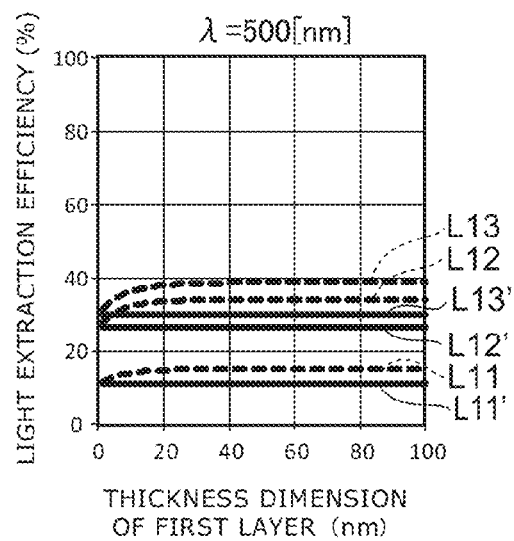
Figure 9C:
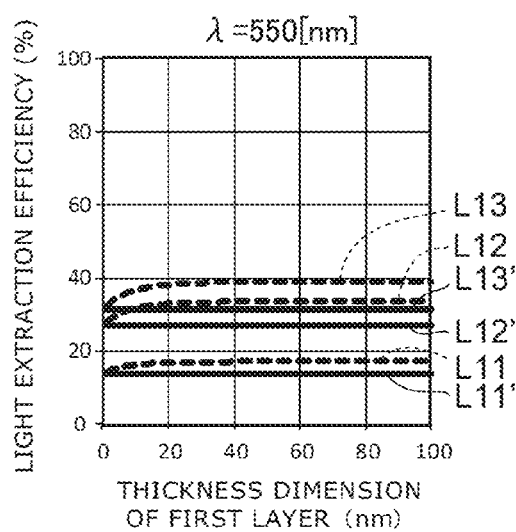
Figure 9D:
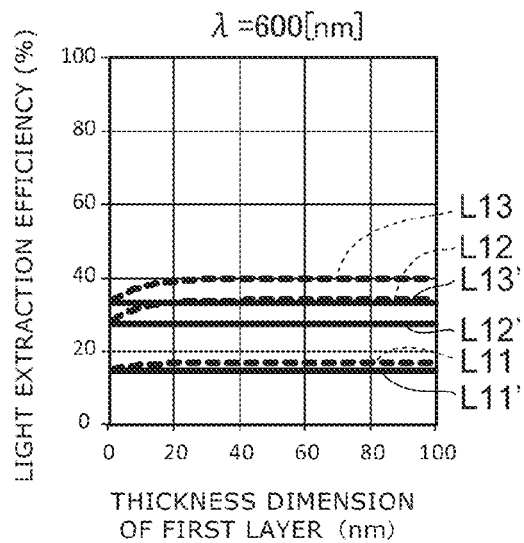

As seen from FIG. 5A, in the case where the wavelength of light generated at the light emitting position 33 in the light emitting layer 30 is short, the plasmon loss can be reduced by using a first layer 21 containing Na. Thus, the light extraction efficiency can be improved.

FIGS. 6A to 6D show the case where the first layer 21 is made of K.

As seen from FIGS. 6A to 6D, the plasmon loss can be reduced in a wide wavelength range by using a first layer 21 containing K. Thus, the light extraction efficiency can be improved. That is, by using a first layer 21 containing K, the wavelength dependence of the light extraction efficiency can be reduced.

FIGS. 7A to 7D show the case where the first layer 21 is made of Rb.

As seen from FIGS. 7A to 7D, the plasmon loss can be reduced in a wide wavelength range by using a first layer 21 containing Rb. Thus, the light extraction efficiency can be improved. That is, by using a first layer 21 containing Rb, the wavelength dependence of the light extraction efficiency can be reduced.

FIGS. 8A to 8D show the case where the first layer 21 is made of Cs.

As seen from FIGS. 8A to 8D, the plasmon loss can be reduced in a wide wavelength range by using a first layer 21 containing Cs. Thus, the light extraction efficiency can be improved. That is, by using a first layer 21 containing Cs, the wavelength dependence of the light extraction efficiency can be reduced.

FIGS. 9A to 9D show the case where the first layer 21 is made of Mg.

As seen from FIGS. 9A to 9D, the plasmon loss can be reduced in a wide wavelength range by using a first layer 21 containing Mg. Thus, the light extraction efficiency can be improved. That is, by using a first layer 21 containing Mg, the wavelength dependence of the light extraction efficiency can be reduced.

FIGS. 10A to 10D show the case where the first layer 21 is made of Ca.

Figure 10A:
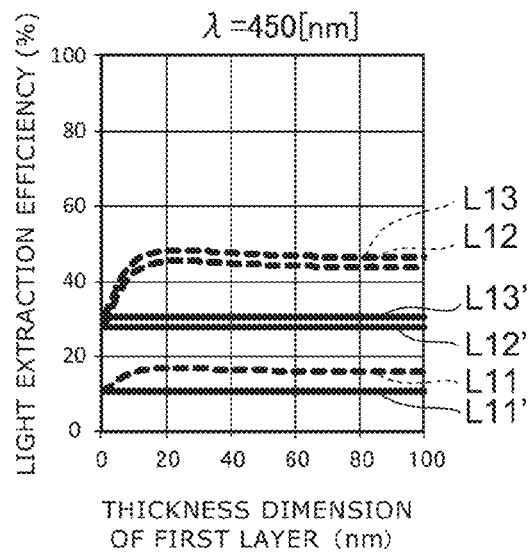
FIGS. 10A to 10D are graphs for illustrating the wavelength dependence of the light extraction efficiency.
Figure 10B:
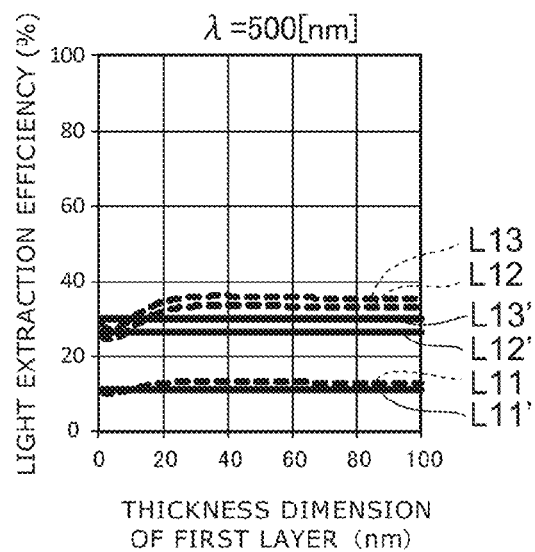
Figure 10C:
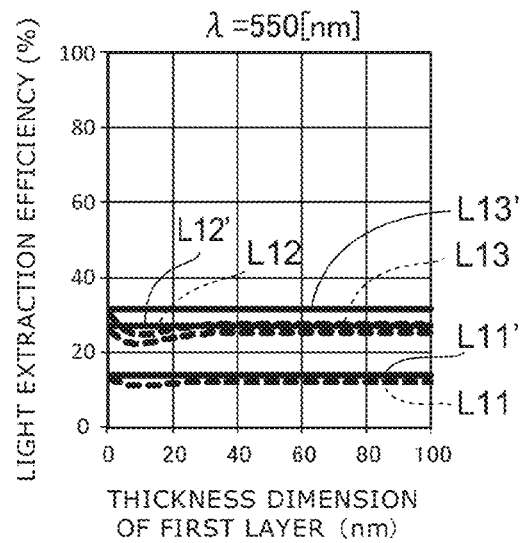
Figure 10D:
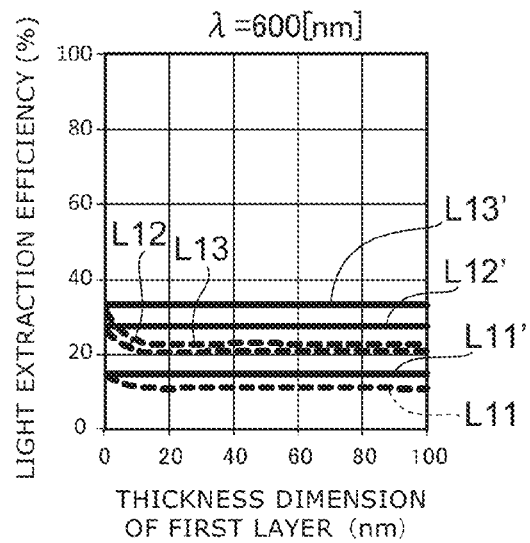

As seen from FIG. 10A, in the case where the wavelength of light generated at the light emitting position 33 in the light emitting layer 30 is short, the plasmon loss can be reduced by using a first layer 21 containing Ca. Thus, the light extraction efficiency can be improved. In this case, the wavelength dependence of the light extraction efficiency is lower than that for L1 and Na.

FIGS. 11A to 17D are graphs for illustrating the wavelength dependence of the light extraction efficiency.

FIGS. 11A to 17D show example simulation results.

In FIGS. 11A to 17D, the second layer 22 was assumed to be made of Al. The rest of the condition and the symbols are the same as those for FIGS. 4A to 10D.

FIGS. 11A to 11D show the case where the first layer 21 is made of Li.

Figure 11A:
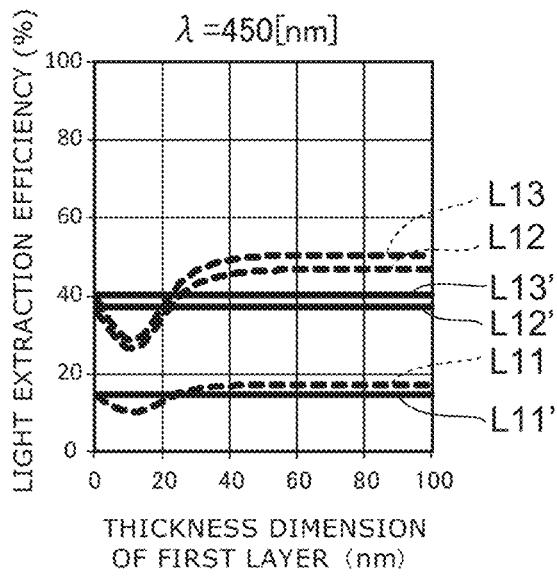
FIGS. 11A to 11D are graphs for illustrating the wavelength dependence of the light extraction efficiency.
Figure 11B:
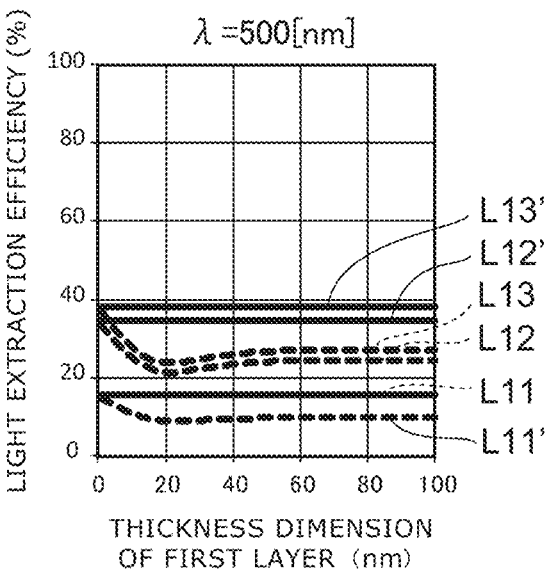
Figure 11C:
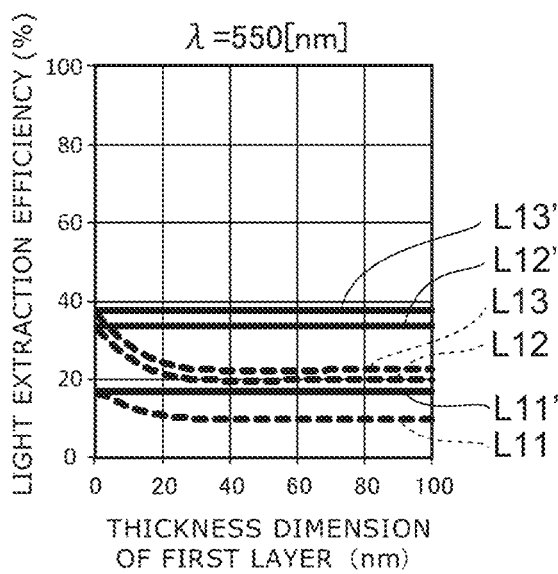
Figure 11D:
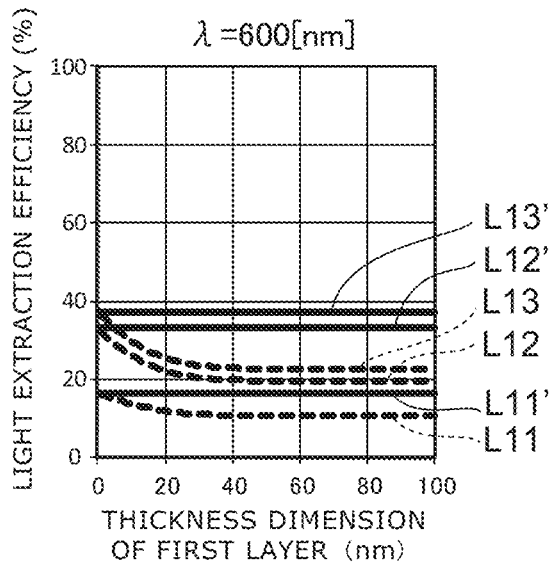

As seen from FIG. 11A, in the case where the wavelength of light generated at the light emitting position 33 in the light emitting layer 30 is short, the plasmon loss can be reduced by using a first layer 21 containing Li. Thus, the light extraction efficiency can be improved.

FIGS. 12A to 12D show the case where the first layer 21 is made of Na.

Figure 12A:
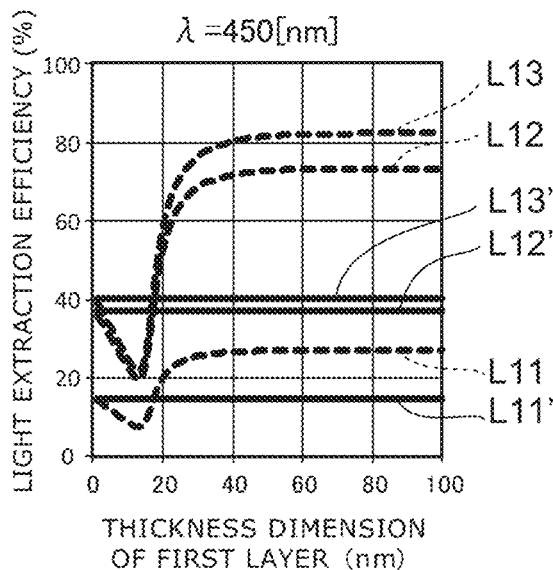
FIGS. 12A to 12D are graphs for illustrating the wavelength dependence of the light extraction efficiency.
Figure 12B:
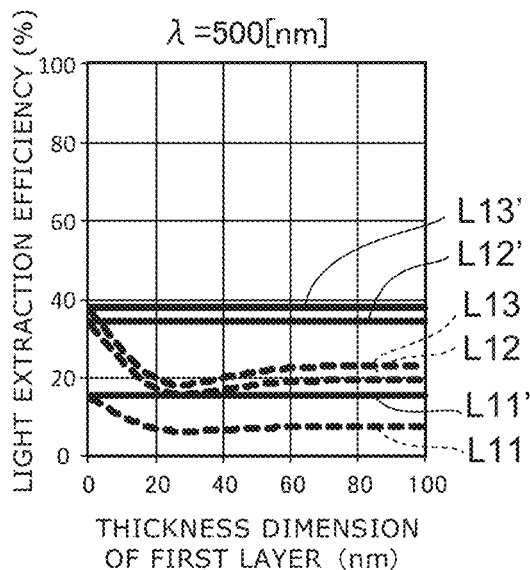
Figure 12C:
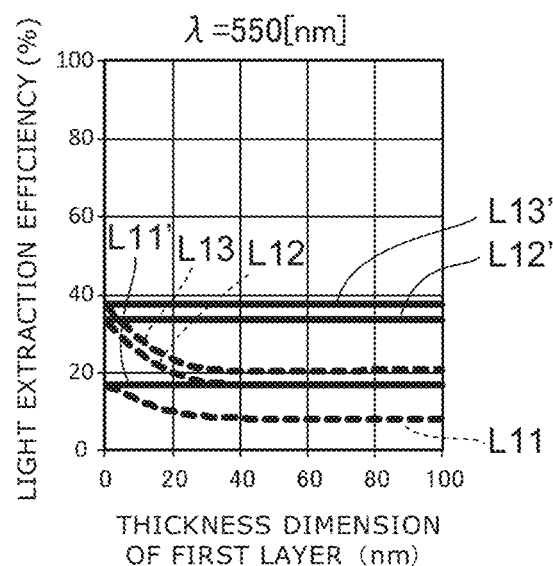
Figure 12D:
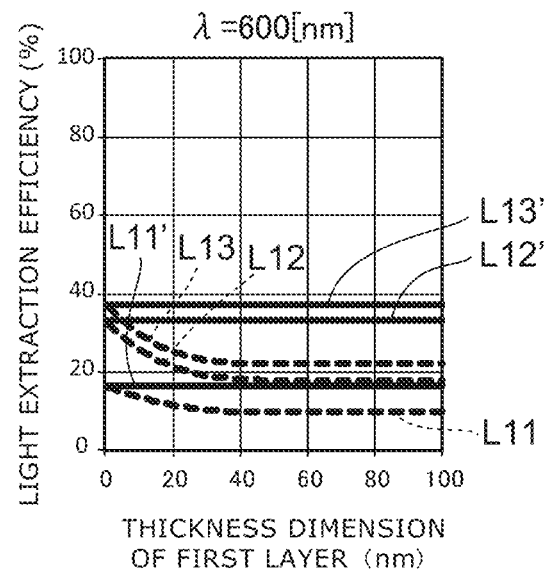
Figure 13A:
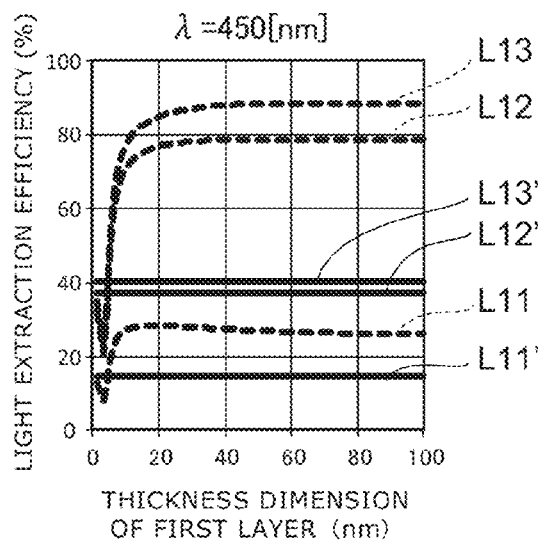
FIGS. 13A to 13D are graphs for illustrating the wavelength dependence of the light extraction efficiency.
Figure 13B:
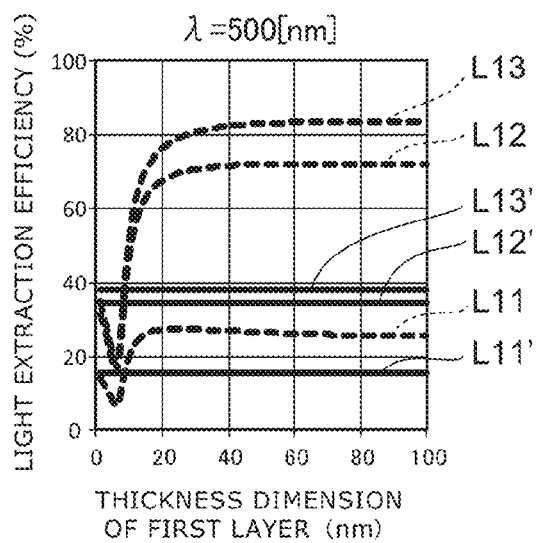
Figure 13C:
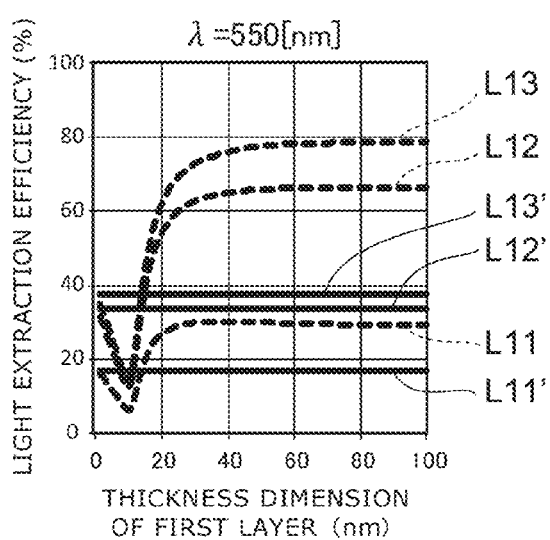
Figure 13D:
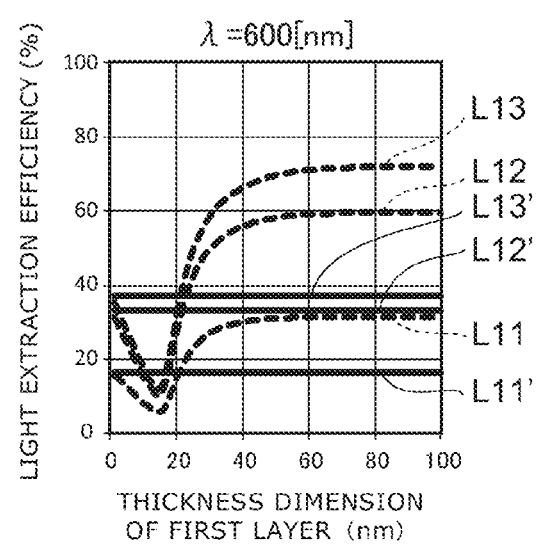
Figure 14A:
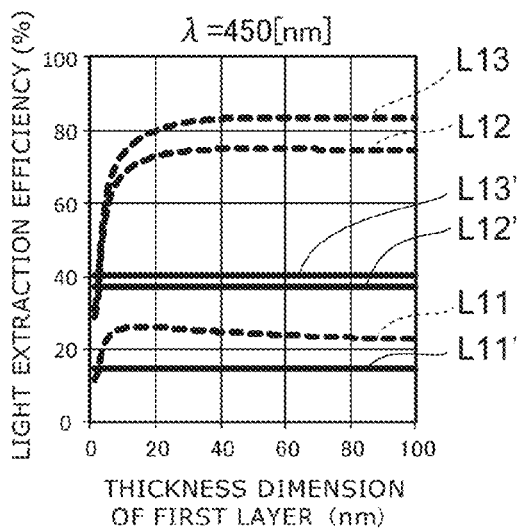
FIGS. 14A to 14D are graphs for illustrating the wavelength dependence of the light extraction efficiency.
Figure 14B:
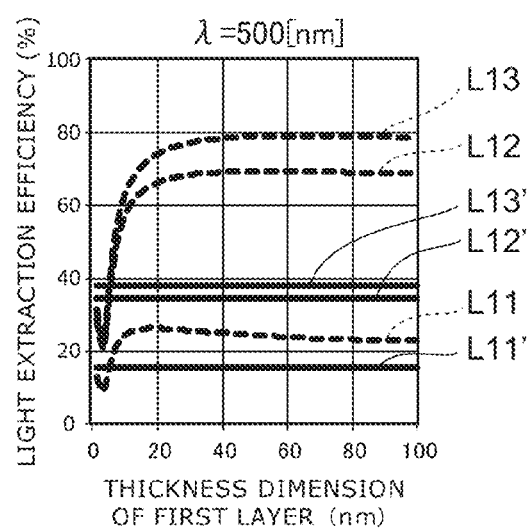
Figure 14C:
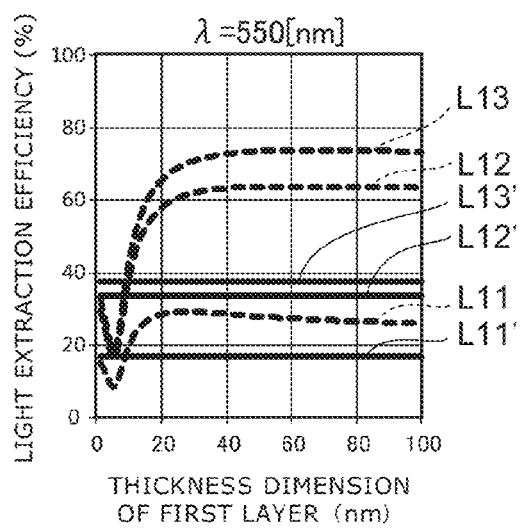
Figure 14D:
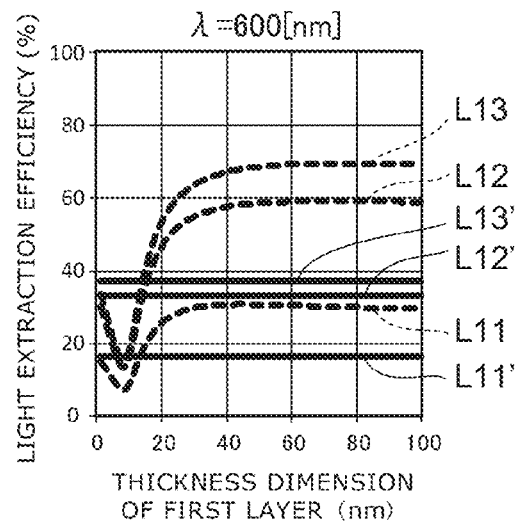
Figure 15A:
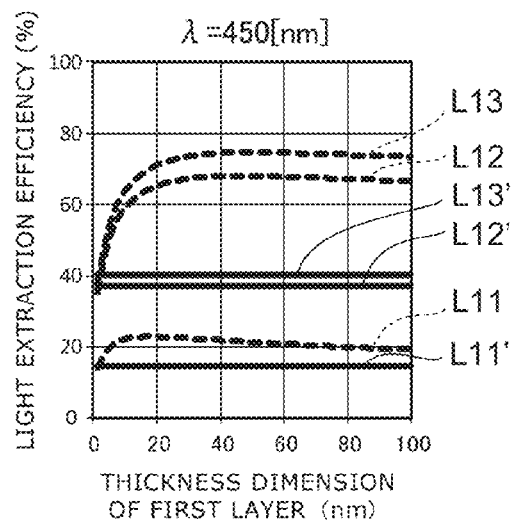
FIGS. 15A to 15D are graphs for illustrating the wavelength dependence of the light extraction efficiency.
Figure 15B:
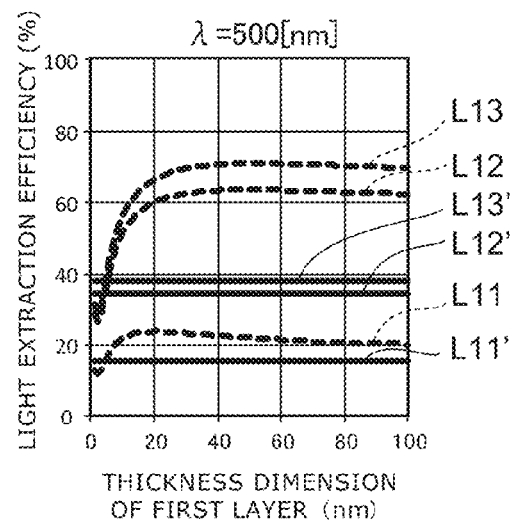
Figure 15C:
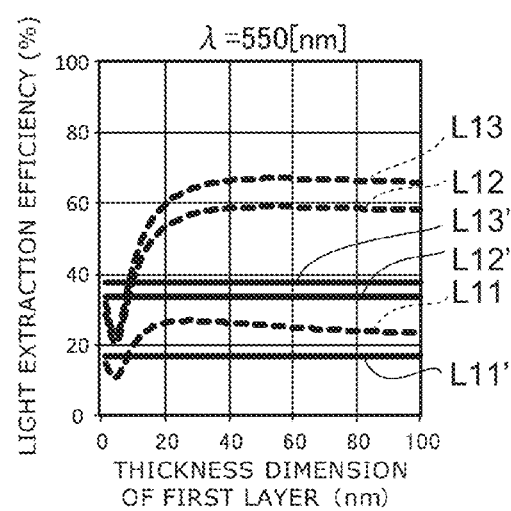
Figure 15D:
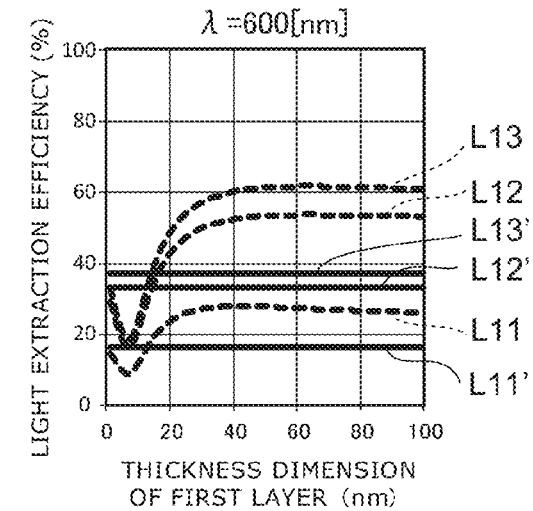
Figure 16A:
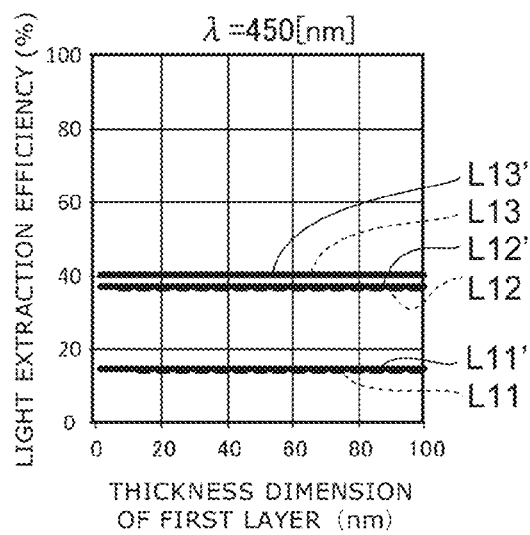
FIGS. 16A to 16D are graphs for illustrating the wavelength dependence of the light extraction efficiency.
Figure 16B:
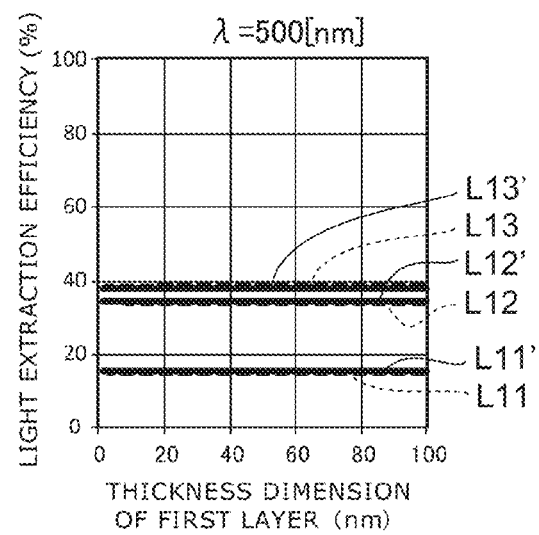
Figure 16C:
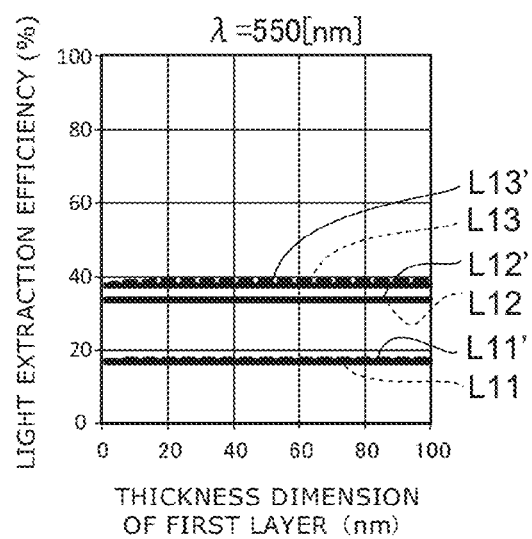
Figure 16D:
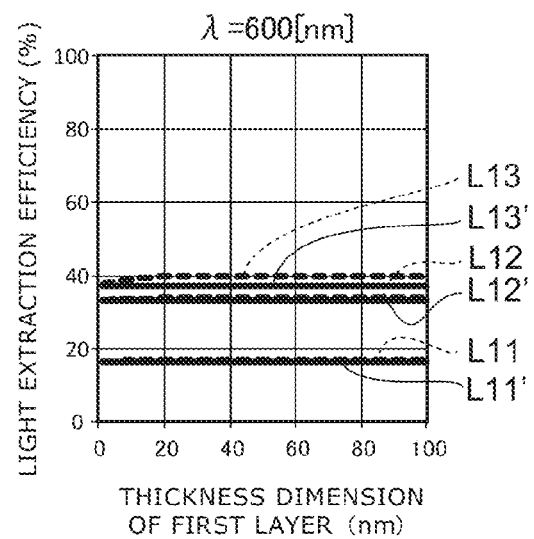

As seen from FIG. 12A, in the case where the wavelength of light generated at the light emitting position 33 in the light emitting layer 30 is short, the plasmon loss can be reduced by using a first layer 21 containing Na. Thus, the light extraction efficiency can be improved.

FIGS. 13A to 13D show the case where the first layer 21 is made of K.

As seen from FIGS. 13A to 13D, the plasmon loss can be reduced in a wide wavelength range by using a first layer 21 containing K. Thus, the light extraction efficiency can be improved. That is, by using a first layer 21 containing K, the wavelength dependence of the light extraction efficiency can be reduced.

FIGS. 14A to 14D show the case where the first layer 21 is made of Rb.

As seen from FIGS. 14A to 14D, the plasmon loss can be reduced in a wide wavelength range by using a first layer 21 containing Rb. Thus, the light extraction efficiency can be improved. That is, by using a first layer 21 containing Rb, the wavelength dependence of the light extraction efficiency can be reduced.

FIGS. 15A to 15D show the case where the first layer 21 is made of Cs.

As seen from FIGS. 15A to 15D, the plasmon loss can be reduced in a wide wavelength range by using a first layer 21 containing Cs. Thus, the light extraction efficiency can be improved. That is, by using a first layer 21 containing Cs, the wavelength dependence of the light extraction efficiency can be reduced.

FIGS. 16A to 16D show the case where the first layer 21 is made of Mg.

As seen from FIGS. 16A to 16D, the plasmon loss can be reduced in a wide wavelength range by using a first layer 21 containing Mg. Thus, the light extraction efficiency can be improved. That is, by using a first layer 21 containing Mg, the wavelength dependence of the light extraction efficiency can be reduced.

FIGS. 17A to 17D show the case where the first layer 21 is made of Ca.

Figure 17A:
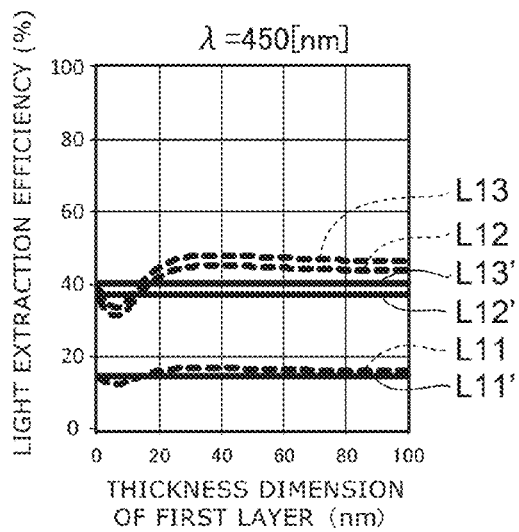
FIGS. 17A to 17D are graphs for illustrating the wavelength dependence of the light extraction efficiency.
Figure 17B:
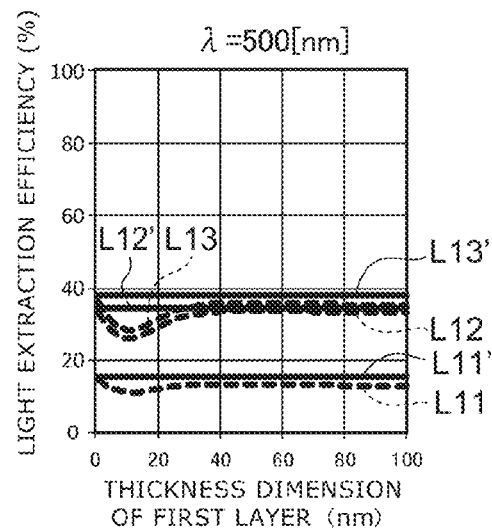
Figure 17C:
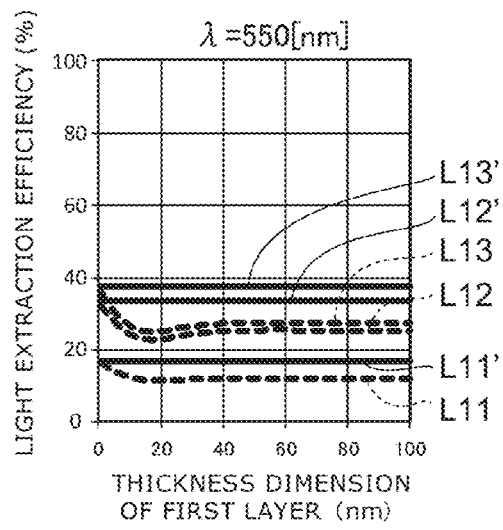
Figure 17D:
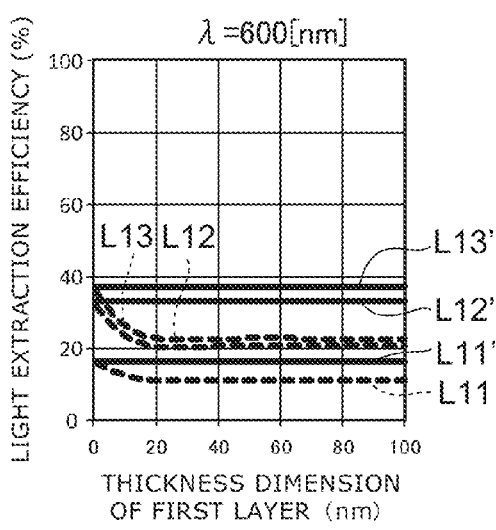

As seen from FIG. 17A, in the case where the wavelength of light generated at the light emitting position 33 in the light emitting layer 30 is short, the plasmon loss can be reduced by using a first layer 21 containing Ca. Thus, the light extraction efficiency can be improved. In this case, the wavelength dependence of the light extraction efficiency is lower than that for Li and Na.

As seen from FIGS. 4A to 17D, if the first layer 21 contains at least one of the alkali metals and the alkaline-earth metals, the plasmon loss can be reduced. Thus, the light extraction efficiency can be improved.

Here, if the first layer 21 contains at least one selected from the group consisting of K, Rb, and Cs, the plasmon loss can be significantly reduced, and the wavelength dependence of the light extraction efficiency can be reduced.

Furthermore, as seen from FIGS. 4A to 17D, if the thickness dimension of the first layer 21 is set to 10 nanometers (nm) or more, the plasmon loss can be reduced. Thus, the light extraction efficiency can be improved.

Furthermore, as seen from FIGS. 4A to 17D, even if the material of the second layer 22 is changed, the plasmon loss can be reduced. Thus, the light extraction efficiency can be improved. Even if the material of the second layer 22 is changed, there is no change in the wavelength dependence of the light extraction efficiency.

This can increase the degree of freedom in selecting the material of the second layer 22. For instance, the material of the second layer 22 can be appropriately selected for the purpose of reducing the driving voltage.

Second Embodiment

Figure 18:
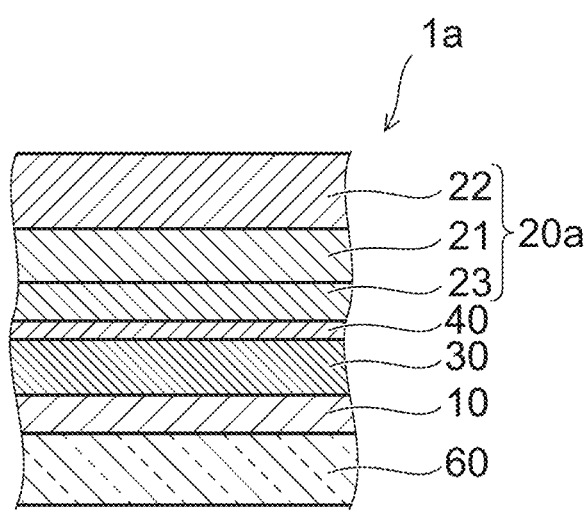
FIG. 18 is a schematic cross-sectional view illustrating a light emitting element according to a second embodiment.

FIG. 18 is a schematic sectional view for illustrating a light emitting element according to a second embodiment.

As shown in FIG. 18, an organic electroluminescent element 1a as an example of the light emitting element includes a first electrode 10, a second electrode 20a, a light emitting layer 30, and a first functional layer 40.

Furthermore, like the aforementioned organic electroluminescent element 1, the organic electroluminescent element 1a can include a substrate 60 on the opposite side of the first electrode 10 from the side provided with the light emitting layer 30.

Furthermore, a second functional layer, not shown, can also be provided between the first electrode 10 and the light emitting layer 30.

Furthermore, a plurality of microlenses, not shown, can also be provided on the surface of the substrate 60 on the opposite side from the side provided with the first electrode 10.

Furthermore, it is also possible to provide a scattering layer which changes a path of light on the substrate 60.

The second electrode 20a is provided opposite to the first electrode 10.

The second electrode 20a functions as e.g. a cathode.

The second electrode 20a includes a first layer 21, a second layer 22, and a third layer 23.

The second electrode 20a is configured so that a third layer 23 is further included on the side provided with the first functional layer 40 of the aforementioned second electrode 20. That is the third layer 23 is provided between the first layer 21 and the light emitting layer 30.

That is, the third layer 23 is provided on the side provided with the light emitting layer 30 of the first layer 21. The material of the third layer 23 is not particularly limited as long as it is conductive. The third layer 23 can be formed from e.g. the same material as the second layer 22.

For instance, the third layer 23 can contain at least one selected from the group consisting of Al, Al alloy, Ag, and Ag alloy.

If the thickness dimension of the third layer 23 is made too large, the plasmon loss may be increased in the third layer 23.

Thus, the thickness dimension of the third layer 23 can be set to e.g. 10 nanometers (nm) or less.

The details on the thickness dimension of the third layer 23 will be described later.

FIGS. 19A to 22D are graphs for illustrating the wavelength dependence of the light extraction efficiency.

FIGS. 19A to 22D show example simulation results.

In FIGS. 19A to 22D, the third layer 23 was assumed to be made of Ag. The thickness dimension of the third layer 23 was set to 1 nanometer (nm).

The rest of the condition and the symbols are the same as those illustrated in FIGS. 4A to 10D.

FIGS. 19A to 19D show the case where the first layer 21 is made of Na.

Figure 19A:
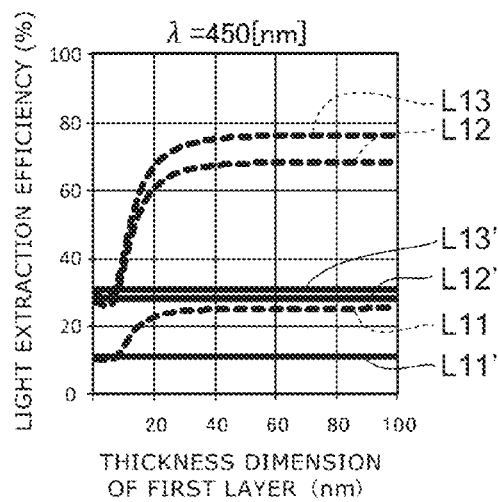
FIGS. 19A to 19D are graphs for illustrating the wavelength dependence of the light extraction efficiency.
Figure 19B:
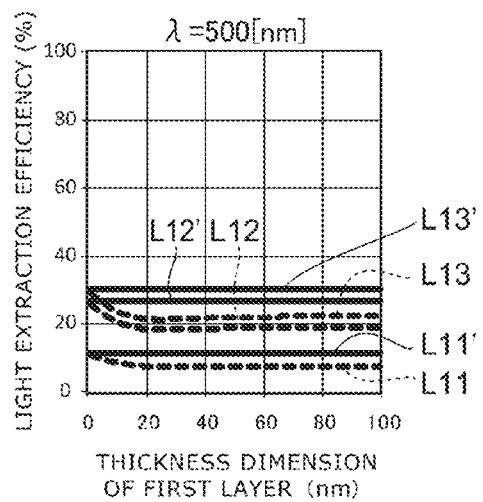
Figure 19C:
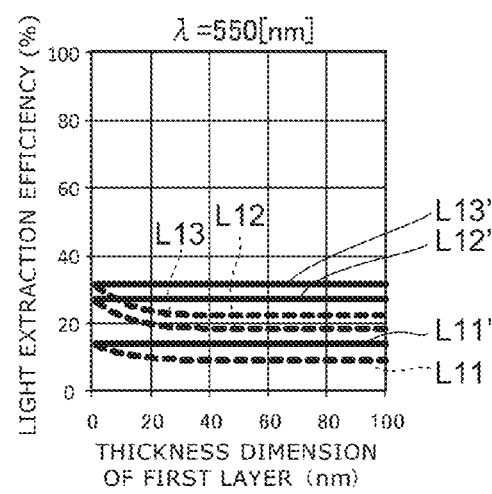
Figure 19D:
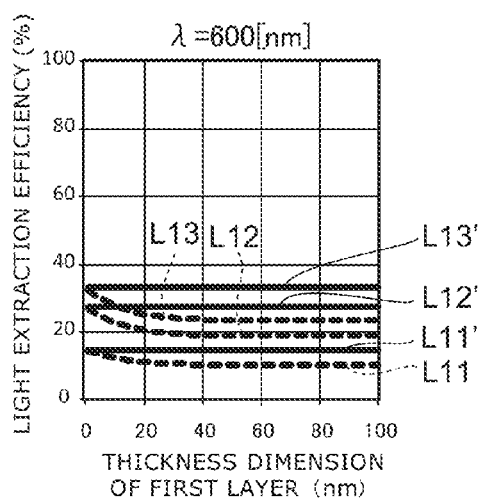
Figure 20A:
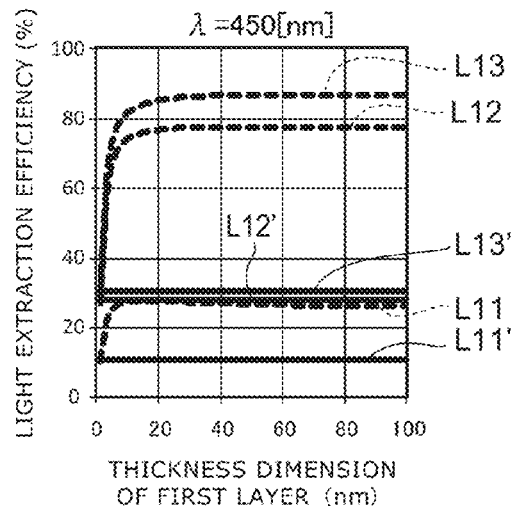
FIGS. 20A to 20D are graphs for illustrating the wavelength dependence of the light extraction efficiency.
Figure 20B:
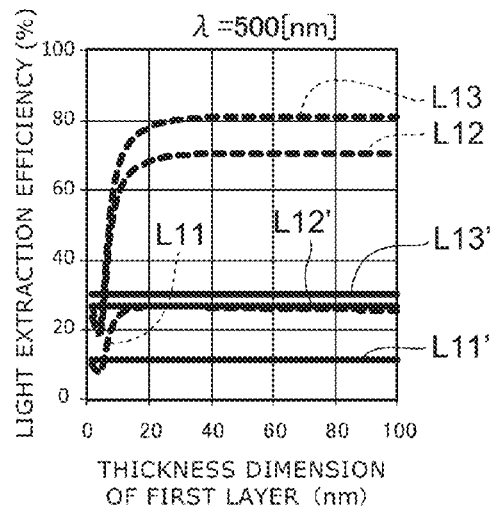
Figure 20C:
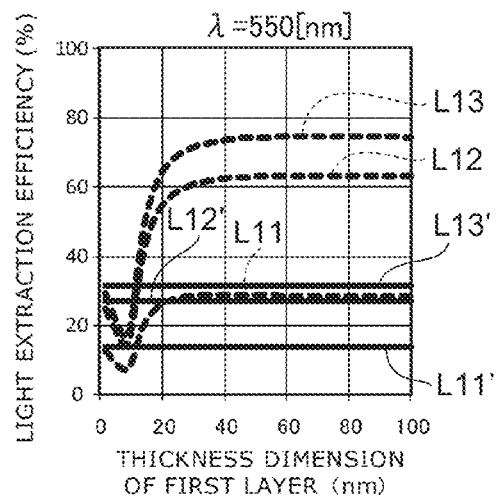
Figure 20D:
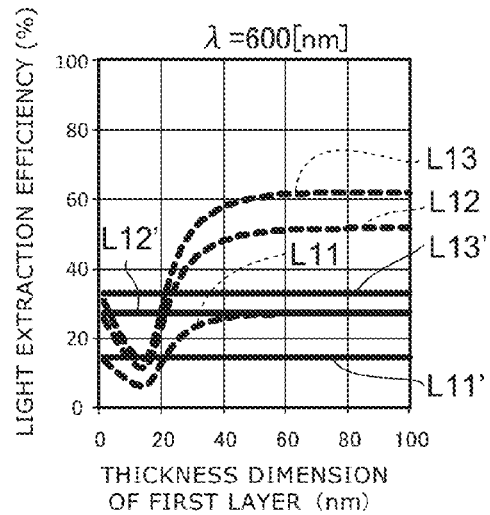
Figure 21A:
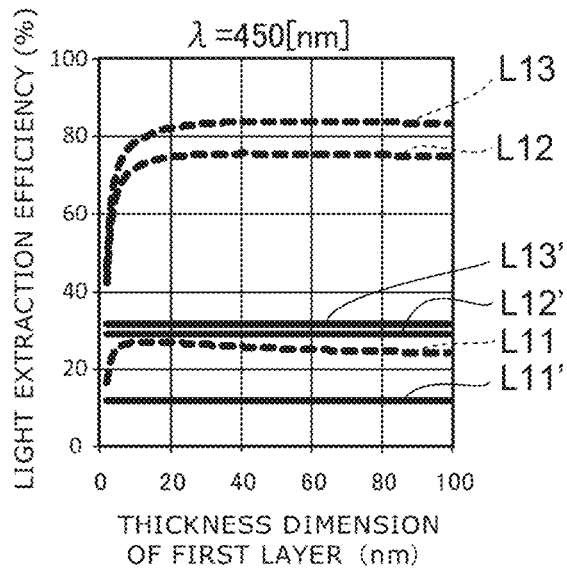
FIGS. 21A to 21D are graphs for illustrating the wavelength dependence of the light extraction efficiency.
Figure 21B:
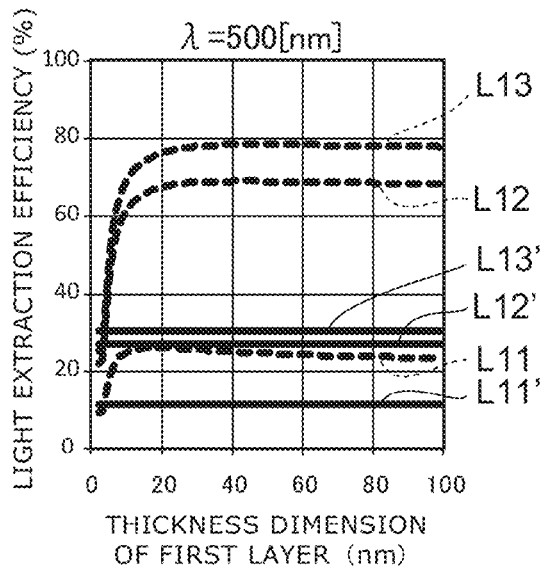
Figure 21C:
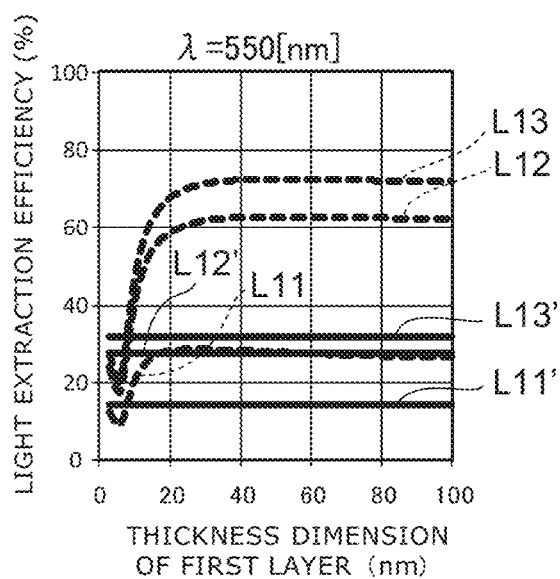
Figure 21D:
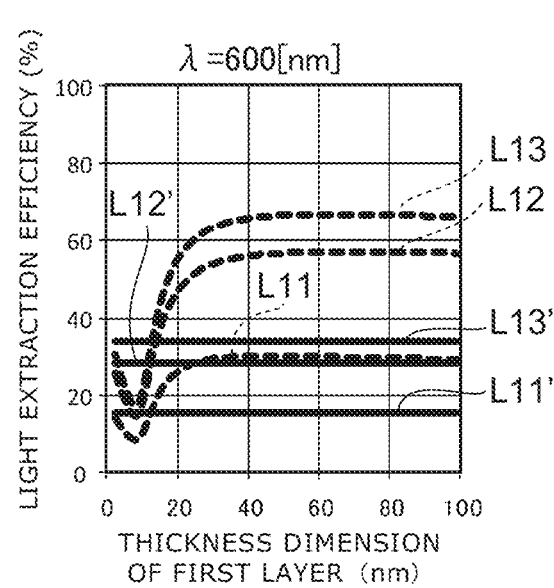
Figure 22A:
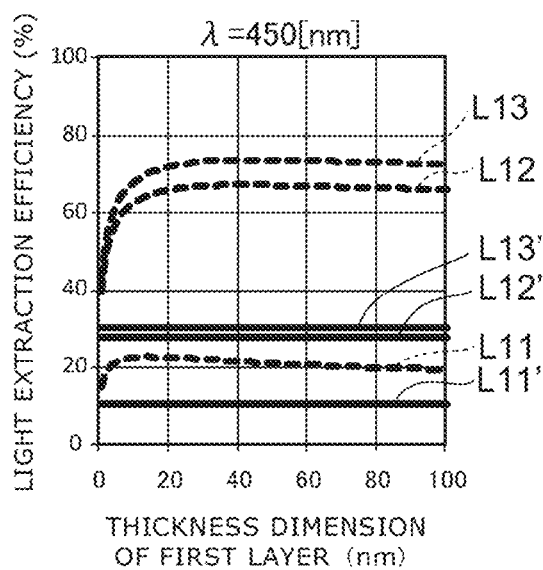
FIGS. 22A to 22D are graphs for illustrating the wavelength dependence of the light extraction efficiency.
Figure 22B:
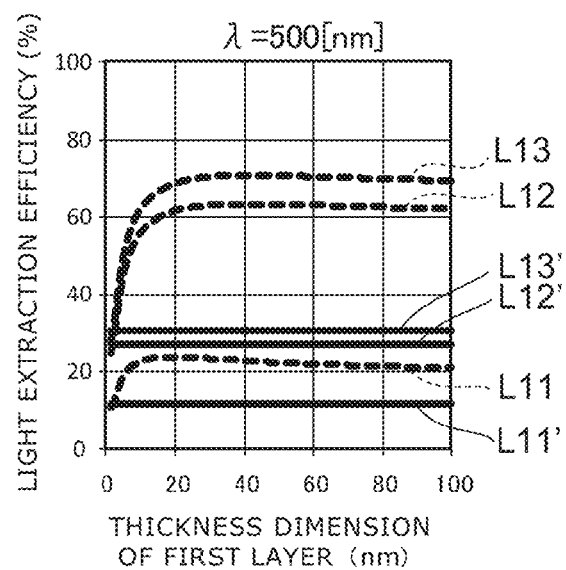
Figure 22C:
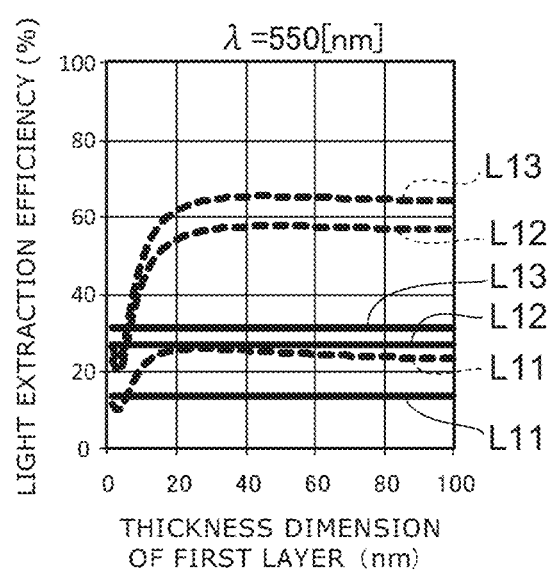
Figure 22D:
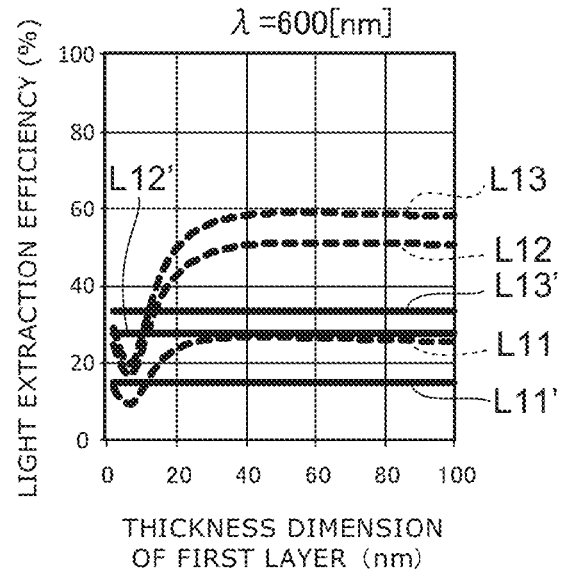

As seen from FIG. 19A, in the case where the wavelength of light generated at the light emitting position 33 in the light emitting layer 30 is short, the plasmon loss can be reduced by using a first layer 21 containing Na. Thus, the light extraction efficiency can be improved.

FIGS. 20A to 20D show the case where the first layer 21 is made of K.

As seen from FIGS. 20A to 20D, the plasmon loss can be reduced in a wide wavelength range by using a first layer 21 containing K. Thus, the light extraction efficiency can be improved. That is, by using a first layer 21 containing K, the wavelength dependence of the light extraction efficiency can be reduced.

FIGS. 21A to 21D show the case where the first layer 21 is made of Rb.

As seen from FIGS. 21A to 21D, the plasmon loss can be reduced in a wide wavelength range by using a first layer 21 containing Rb. Thus, the light extraction efficiency can be improved. That is, by using a first layer 21 containing Rb, the wavelength dependence of the light extraction efficiency can be reduced.

FIGS. 22A to 22D show the case where the first layer 21 is made of Cs.

As seen from FIGS. 22A to 22D, the plasmon loss can be reduced in a wide wavelength range by using a first layer 21 containing Cs. Thus, the light extraction efficiency can be improved. That is, by using a first layer 21 containing Cs, the wavelength dependence of the light extraction efficiency can be reduced.

Next, the thickness dimension of the third layer 23 is further described.

FIGS. 23A to 26B are graphs for illustrating the reduction of plasmon loss in the case of including a second electrode 20 having a two-layer structure and the case of including a second electrode 20a having a three-layer structure.

In FIGS. 23A to 26B, the wavelength of light generated at the light emitting position 33 in the light emitting layer 30 was set to 450 nanometers (nm).

Figure 23A:
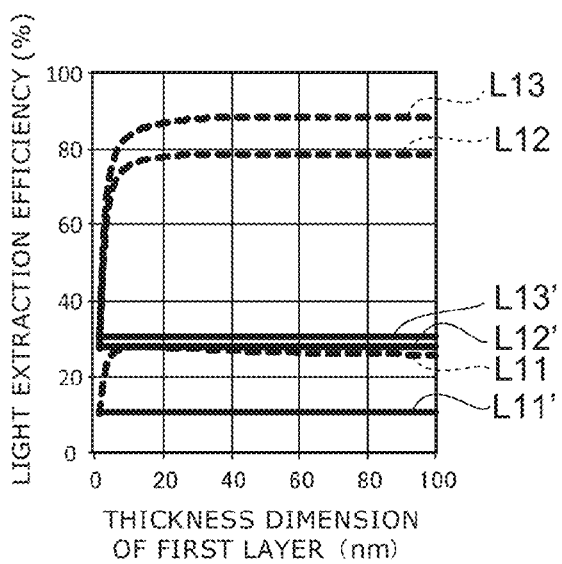
FIGS. 23A to 23C are graphs for illustrating the reduction of plasmon loss in the case of including a second electrode 20 having a two-layer structure and in the case of including a second electrode 20a having a three-layer structure.

FIG. 23A shows the case of including a second electrode 20 having a two-layer structure.

The first layer 21 was assumed to be made of K, and the thickness dimension of the first layer 21 was set to 20 nanometers (nm). The second layer 22 was assumed to be made of Ag, and the thickness dimension of the second layer 22 was set to 150 nanometers (nm).

Figure 23B:
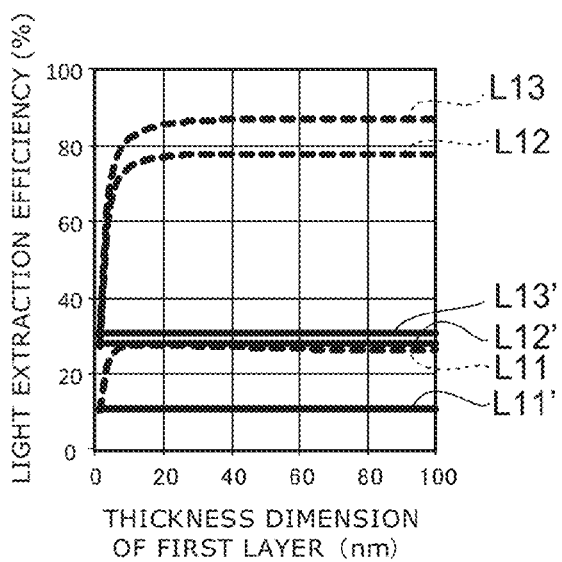

FIG. 23B shows the case of including a second electrode 20a having a three-layer structure.

The first layer 21 and the second layer 22 are similar to those for FIG. 23A.

The third layer 23 was assumed to be made of Ag, and the thickness dimension of the third layer 23 was set to 1 nanometer (nm).

Figure 23C:
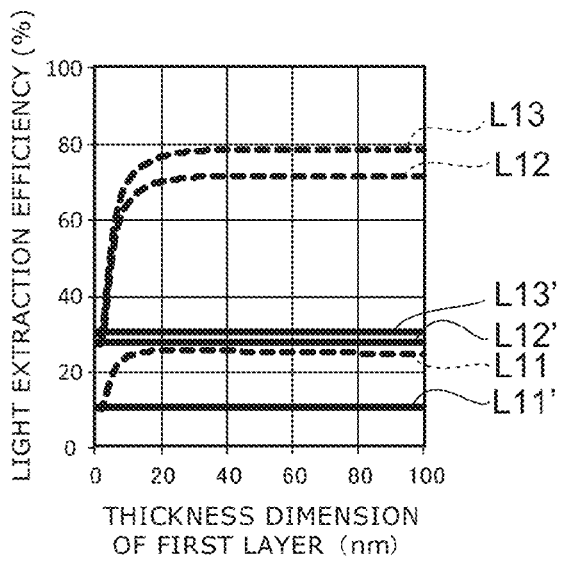

FIG. 23C shows the case of including a second electrode 20a having a three-layer structure.

The first layer 21 and the second layer 22 are similar to those for FIG. 23A.

The third layer 23 was assumed to be made of Al, and the thickness dimension of the third layer 23 was set to 1 nanometer (nm).

The rest of the condition and the symbols are the same as those illustrated in FIGS. 4A to 10D.

As seen from the case of the second electrode 20 having a two-layer structure shown in FIG. 23A and the case of the second electrode 20a having a three-layer structure shown in FIGS. 23B and 23C, the third layer 23, even if provided, has little influence on the reduction of plasmon loss as long as the third layer 23 has a thickness dimension of approximately 1 nanometer (nm).

In this case, as illustrated in FIG. 3, Al is a material having higher plasmon loss than Ag. Thus, the third layer 23 made of Al has a greater influence on the reduction of plasmon loss.

Figure 24A:
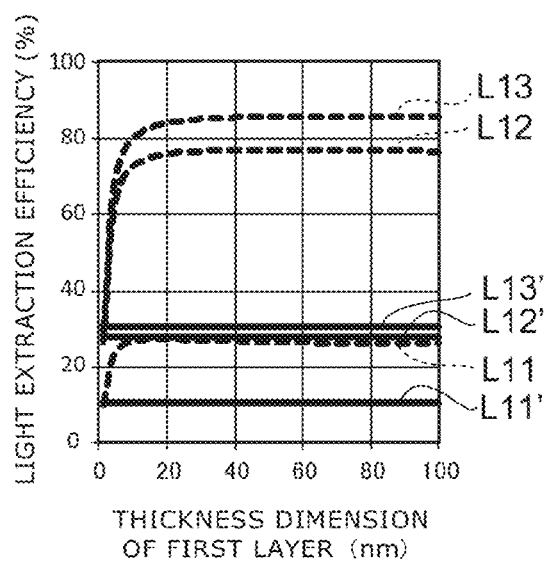
FIGS. 24A and 24B are graphs for illustrating the reduction of plasmon loss in the case of including a second electrode 20 having a two-layer structure and in the case of including a second electrode 20a having a three-layer structure.

FIG. 24A shows the case of including a second electrode 20a having a three-layer structure.

The first layer 21 and the second layer 22 are similar to those for FIG. 23A.

The third layer 23 was assumed to be made of Ag, and the thickness dimension of the third layer 23 was set to 2 nanometers (nm).

Figure 24B:
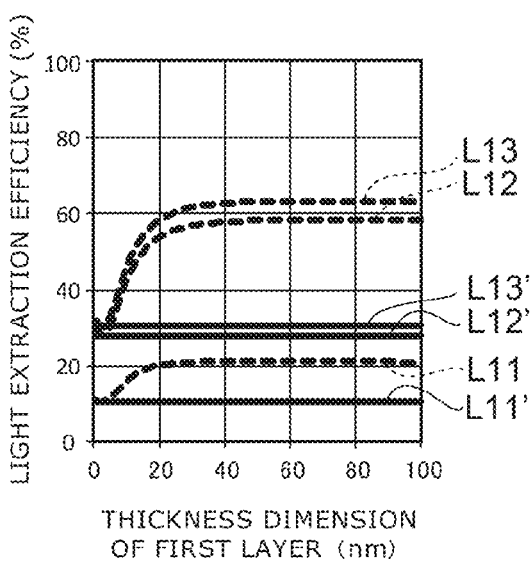

FIG. 24B shows the case of including a second electrode 20a having a three-layer structure.

The first layer 21 and the second layer 22 are similar to those for FIG. 23A.

The third layer 23 was assumed to be made of Al, and the thickness dimension of the third layer 23 was set to 2 nanometers (nm).

The rest of the condition and the symbols are the same as those illustrated in FIGS. 4A to 10D.

As seen from the case of the second electrode 20 having a two-layer structure shown in FIG. 23A and the case of the second electrode 20a having a three-layer structure shown in FIGS. 24A and 24B, the third layer 23, even if provided, has little influence on the reduction of plasmon loss as long as the third layer 23 has a thickness dimension of approximately 2 nanometers (nm).

In this case, as illustrated in FIG. 3, Al is a material having higher plasmon loss than Ag. Thus, the third layer 23 made of Al has a greater influence on the reduction of plasmon loss.

Figure 25A:
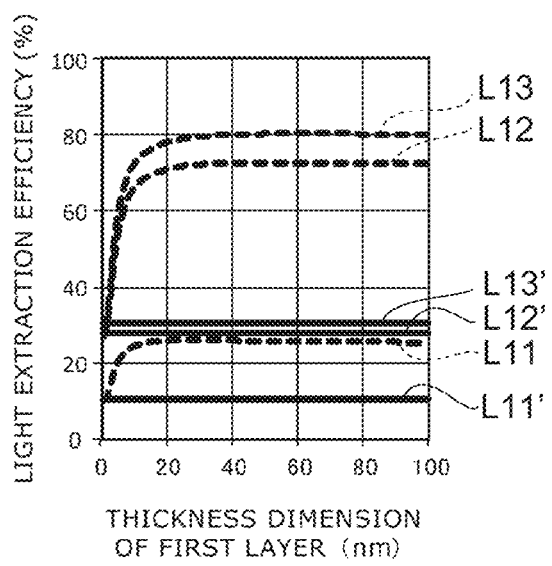
FIGS. 25A and 25B are graphs for illustrating the reduction of plasmon loss in the case of including a second electrode 20a having a three-layer structure.

FIG. 25A shows the case of including a second electrode 20a having a three-layer structure.

The first layer 21 and the second layer 22 are similar to those for FIG. 23A.

The third layer 23 was assumed to be made of Ag, and the thickness dimension of the third layer 23 was set to 5 nanometers (nm).

Figure 25B:
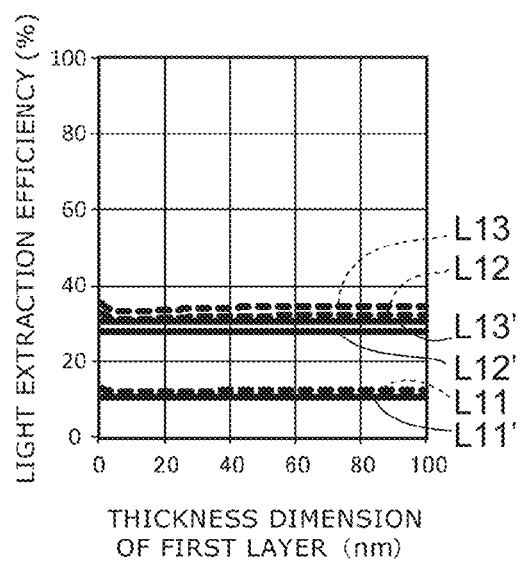

FIG. 25B shows the case of including a second electrode 20a having a three-layer structure.

The first layer 21 and the second layer 22 are similar to those for FIG. 23A.

The third layer 23 was assumed to be made of Al, and the thickness dimension of the third layer 23 was set to 5 nanometers (nm).

The rest of the condition and the symbols are the same as those illustrated in FIGS. 4A to 10D.

As seen from the case of the second electrode 20 having a two-layer structure shown in FIG. 23A and the case of the second electrode 20a having a three-layer structure shown in FIG. 25A, the third layer 23, even if provided, has little influence on the reduction of plasmon loss as long as the third layer 23 is made of Ag and has a thickness dimension of approximately 5 nanometers (nm).

However, as seen from the case of the second electrode 20a having a three-layer structure shown in FIG. 25B, if the third layer 23 is made of Al having high plasmon loss and has a thickness dimension of approximately 5 nanometers (nm), the provision of the third layer 23 has a great influence on the reduction of plasmon loss.

Figure 26A:
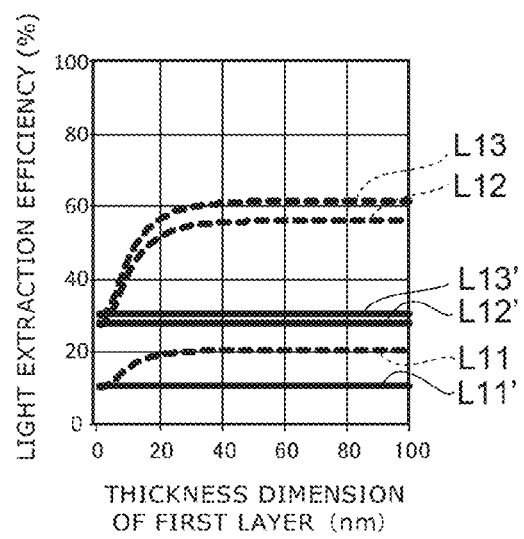
FIGS. 26A and 26B are graphs for illustrating the reduction of plasmon loss in the case of including a second electrode 20a having a three-layer structure.

FIG. 26A shows the case of including a second electrode 20a having a three-layer structure.

The first layer 21 and the second layer 22 are similar to those for FIG. 23A.

The third layer 23 was assumed to be made of Ag, and the thickness dimension of the third layer 23 was set to 10 nanometers (nm).

Figure 26B:
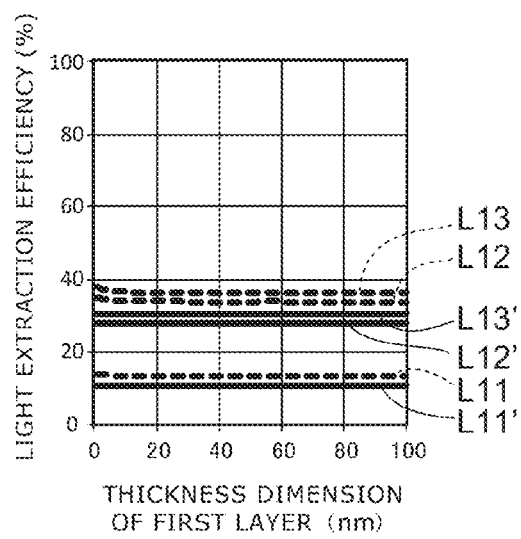

FIG. 26B shows the case of including a second electrode 20a having a three-layer structure.

The first layer 21 and the second layer 22 are similar to those for FIG. 23A.

The third layer 23 was assumed to be made of Al, and the thickness dimension of the third layer 23 was set to 10 nanometers (nm).

The rest of the condition and the symbols are the same as those illustrated in FIGS. 4A to 10.

If at least part of the first layer is located within 30 nanometers (nm) from the surface of the second electrode 20 opposed to the light emitting layer 30, the influence on the reduction of plasmon loss can be suppressed.

For instance, as seen from the case of the second electrode 20 having a two-layer structure shown in FIG. 23A and the case of the second electrode 20a having a three-layer structure shown in FIG. 26A, if the third layer 23 is made of Ag and has a thickness dimension of approximately 10 nanometers (nm), the provision of the third layer 23 has influence on the reduction of plasmon loss.

Furthermore, as seen from the case of the second electrode 20a having a three-layer structure shown in FIG. 26B, if the third layer 23 is made of Al having high plasmon loss and has a thickness dimension of approximately 10 nanometers (nm), the provision of the third layer 23 has a great influence on the reduction of plasmon loss.

As seen from FIGS. 23A to 26B, if the third layer 23 is configured to contain a material having low plasmon loss and to have a thickness dimension of 30 nanometers (nm) or less, and preferably 10 nanometers (nm) or less, then the influence on the reduction of plasmon loss can be suppressed. That is, if at least part of the first layer is located within 10 nanometers (nm) from the surface of the second electrode 20 opposed to the light emitting layer 30, the influence on the reduction of plasmon loss can be suppressed.

In the foregoing, the second electrode 20 having a two-layer structure and the second electrode 20a having a three-layer structure are illustrated. However, the number of stacked layers of the second electrode can be appropriately changed. In this case, the first layer 21 may be made of a plurality of layers, or the second layer 22 or the third layer 23 may be made of a plurality of layers.

Third Embodiment

Figure 27A:
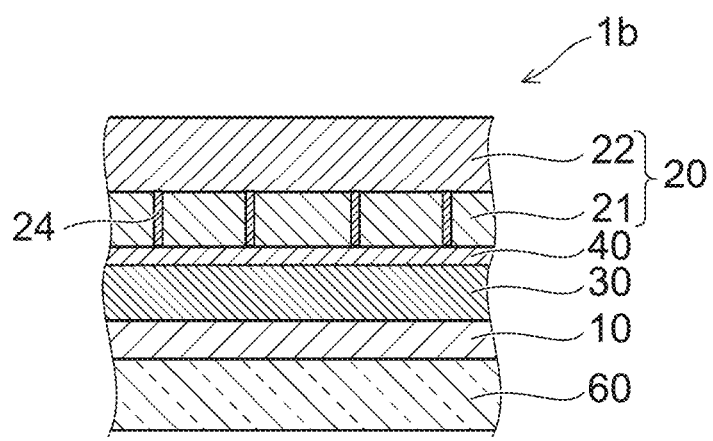
FIGS. 27A and 27B are schematic cross-sectional views for illustrating light emitting elements according to a third embodiment.
Figure 27B:
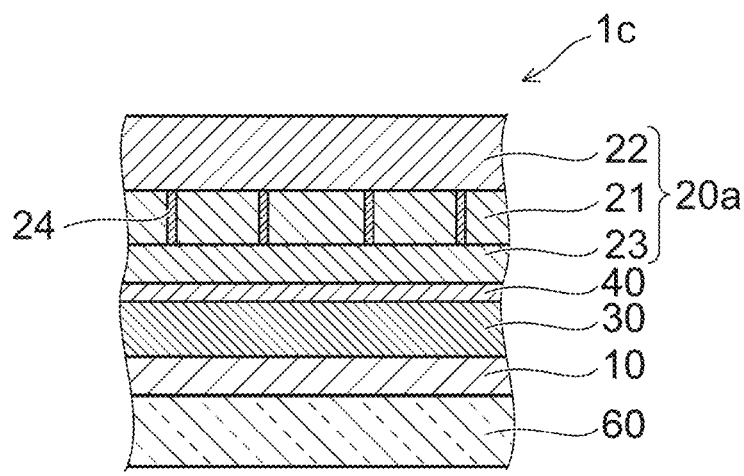

FIGS. 27A and 27B are schematic sectional views for illustrating light emitting elements according to a third embodiment.

FIG. 27A shows the case of including a second electrode 20 having a two-layer structure.

As shown in FIG. 27A, an organic electroluminescent element 1b as an example of the light emitting element includes a first electrode 10, a second electrode 20, a light emitting layer 30, and a first functional layer 40.

Furthermore, like the aforementioned organic electroluminescent element 1, the organic electroluminescent element 1b can include a substrate 60 on the opposite side of the first electrode 10 from the side provided with the light emitting layer 30.

Furthermore, a second functional layer, not shown, can also be provided between the first electrode 10 and the light emitting layer 30.

Furthermore, a plurality of microlenses, not shown, can also be provided on the surface of the substrate 60 on the opposite side from the side provided with the first electrode 10.

Furthermore, it is also possible to provide a scattering layer which changes a path of light on the substrate 60.

Furthermore, the organic electroluminescent element 1b is provided with a conductive section 24 containing a conductive material such as Ag. The conductive section 24 can be provided in a plurality. The conductive section 24 pierces the first layer 21 in the thickness direction. One end portion of the conductive section 24 is in contact with the second layer 22. The other end portion of the conductive section 24 is in contact with the first functional layer 40.

There are cases where the first layer 21 containing a material having low plasmon loss cannot be configured to have sufficiently low electrical resistance. If the first layer 21 has high electrical resistance, a large potential difference may occur between the near side and the far side with respect to the portion connected to the external power supply. If a large potential difference occurs between the near side and the far side with respect to the portion connected to the external power supply, brightness unevenness may occur. Furthermore, the driving voltage may be increased.

Here, the area (cross-sectional area) of the portion of the conductive section 24 exposed from the first layer 21 is small. Thus, even if the conductive section 24 is exposed from the first layer 21, the increase of plasmon loss can be suppressed.

In this embodiment, electrons can be supplied to the first functional layer 40 through the conductive section 24. Thus, even in the case where the first layer 21 has high electrical resistance, the occurrence of brightness unevenness and the increase of driving voltage can be suppressed.

FIG. 27B shows the case of including a second electrode 20a having a three-layer structure.

As shown in FIG. 27B, an organic electroluminescent element 1c as an example of the light emitting element includes a first electrode 10, a second electrode 20a, a light emitting layer 30, and a first functional layer 40.

Furthermore, like the aforementioned organic electroluminescent element 1, the organic electroluminescent element 1c can include a substrate 60 on the opposite side of the first electrode 10 from the side provided with the light emitting layer 30.

Furthermore, a second functional layer, not shown, can also be provided between the first electrode 10 and the light emitting layer 30.

Furthermore, a plurality of microlenses, not shown, can also be provided on the surface of the substrate 60 on the opposite side from the side provided with the first electrode 10.

Furthermore, it is also possible to provide a scattering layer which changes a path of light on the substrate 60.

The organic electroluminescent element 1c can also be provided with a conductive section 24. The conductive section 24 can be provided in a plurality. The conductive section 24 pierce the first layer 21 in the thickness direction. One end portion of the conductive section 24 is in contact with the second layer 22. The other end portion of the conductive section 24 is in contact with the third layer 23.

In this embodiment, electrons can be supplied to the first functional layer 40 through the conductive section 24 and the third layer 23. Thus, even in the case where the first layer 21 has high electrical resistance, the occurrence of brightness unevenness and the increase of driving voltage can be suppressed.

Fourth Embodiment

Figure 28:
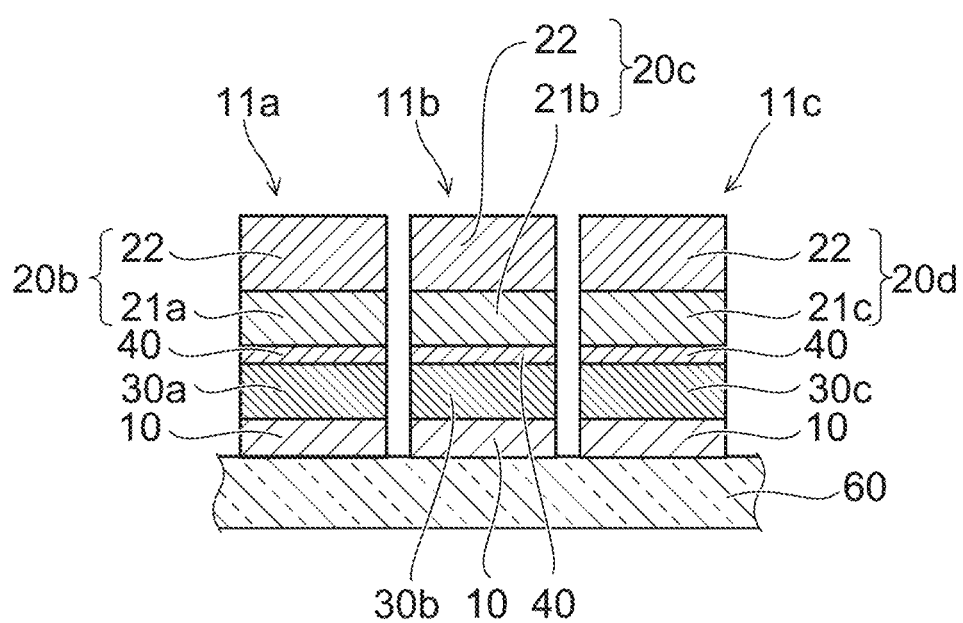
FIG. 28 is a schematic cross-sectional view for illustrating a light emitting element according to a fourth embodiment.

FIG. 28 is a schematic sectional view for illustrating a light emitting device according to a fourth embodiment.

The light emitting device includes a plurality of organic electroluminescent elements. In at least two of the plurality of organic electroluminescent elements, the light emitting layers have different light emission wavelength regions. In this embodiment, the light emitting device includes three organic electroluminescent elements 11a, 11b, and 11c.

As shown in FIG. 28, the organic electroluminescent element 11a includes a first electrode 10, a second electrode 20b, a light emitting layer 30a, and a first functional layer 40. The second electrode 20b includes a first layer 21a and a second layer 22.

The organic electroluminescent element 11b includes a first electrode 10, a second electrode 20c, a light emitting layer 30b, and a first functional layer 40. The second electrode 20c includes a first layer 21b and a second layer 22.

The organic electroluminescent element 11c includes a first electrode 10, a second electrode 20d, a light emitting layer 30c, and a first functional layer 40. The second electrode 20d includes a first layer 21c and a second layer 22.

As described above, the light emitting layer 30a, 30b, 30c includes a host material and a dopant. In this case, if the kind of dopant is changed, the wavelength component contained in the light emitted from the light emitting layer 30a, 30b, 30c is changed.

Furthermore, as described above, in accordance with the kind of the element contained in the first layer 21a, 21b, 21c, wavelength dependence occurs in the light extraction efficiency.

For instance, in the case where light rich in long wavelength components is emitted from the light emitting layer 30a, the element included in the first layer 21a is configured to be such as K, Rb, and Cs. This can improve the light extraction efficiency.

In the case where light rich in short wavelength components is emitted from the light emitting layer 30c, the element included in the first layer 21c is configured to be such as Li, Na, K, Rb, Cs, and Ca. This can improve the light extraction efficiency.

In the case where light containing long wavelength components and short wavelength components is emitted from the light emitting layer 30b, the element included in the first layer 21b is configured to be such as K, Rb, and Cs. This can improve the light extraction efficiency.

That is, depending on at least one of the wavelength component of the light emitted from the light emitting layer 30a, 30b, 30c and the kind of dopant included in the light emitting layer 30a, 30b, 30c, the kind of the element included in the first layer 21a, 21b, 21c can be appropriately selected.

In other words, depending on at least one of the wavelength component of the light emitted from the light emitting layer 30a, 30b, 30c and the kind of dopant included in the light emitting layer 30a, 30b, 30c, the kind of the alkali metal or alkaline-earth metal included in the first layer 21a, 21b, 21c can be selected.

Fifth Embodiment

FIGS. 29A to 29I are schematic views illustrating an organic electroluminescent elements according to a fifth embodiment. FIGS. 30A to 30E are schematic views illustrating one cross-section of FIG. 29A. FIGS. 31A to 31E are schematic views illustrating one cross-section of FIG. 29F.

In the embodiment, the organic electroluminescent element has a light extraction structure converting the substrate mode component L2 to the external mode component L1. The light extraction structure is formed from, for example, a substrate having a refractive index equivalent to or less than a refractive index of the first electrode 10 or the organic light emitting layer 30. The refractive index of the substrate can be, for example, n=1.5.

Figure 29G:
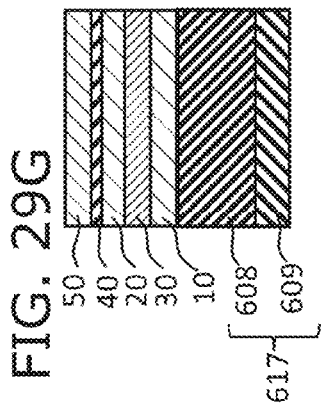
FIGS. 29A to 29I are schematic views illustrating organic electroluminescent elements according to a fifth embodiment.
Figure 29H:
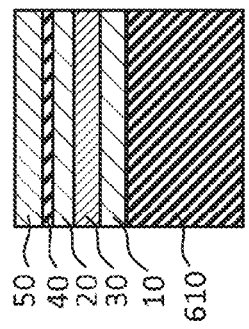
Figure 29I:
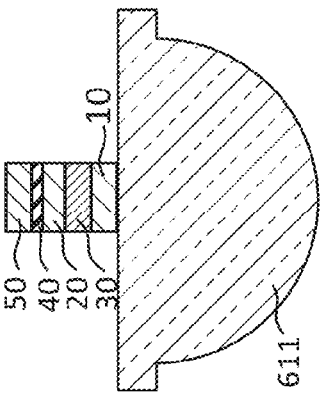
Figure 29D:
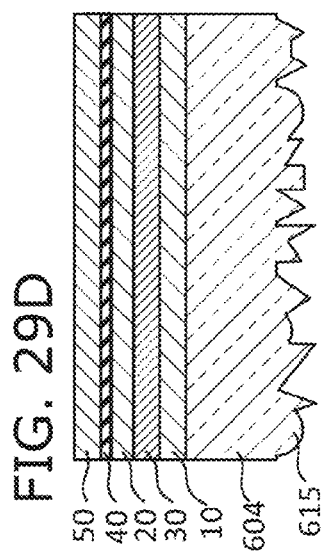
Figure 29E:
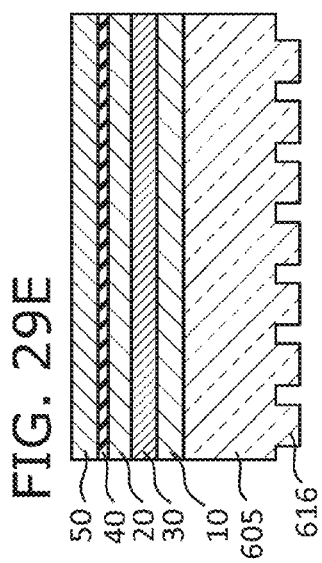
Figure 29F:
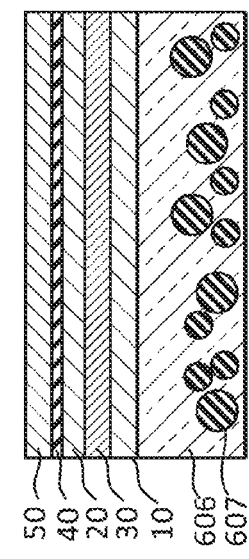
Figure 29A:
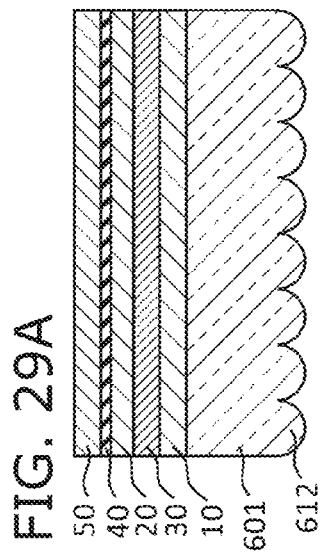

As shown in FIG. 29A, the organic electroluminescent element can include a substrate 601 including microlenses 612 as the light extraction structure. The first electrode 10 is provided between the substrate 601 and the organic light emitting layer 30. The microlenses 612 of the substrate 601 are provided on a plane opposite to a plane opposing the first electrode 10.

The microlenses 612 can be arranged as shown in FIGS. 30A to 30E in one plane perpendicular to a stacking direction of the substrate 601, the first electrode 10 and the organic light emitting layer 30. As with FIG. 30A, the microlenses 612 with the same degree of size can be arranged in a square lattice configuration on the one plane. As with FIG. 30B, the microlenses 612 with the same degree of size can be arranged in a hexagonal lattice configuration on the one plane. As with FIG. 30C, the microlenses 612 with the same degree of size can be arranged randomly on the one plane. As with FIG. 30D, the microlenses 612 with different sizes can be arranged in random configuration on the one plane. As with FIG. 30E, the microlenses 612 with different sizes can be arranged regularly on the one plane, for example the large microlenses 612 can be in a square lattice configuration and small microlenses 612 can be arranged in a square lattice configuration in gaps between the large microlenses.

Figure 29B:
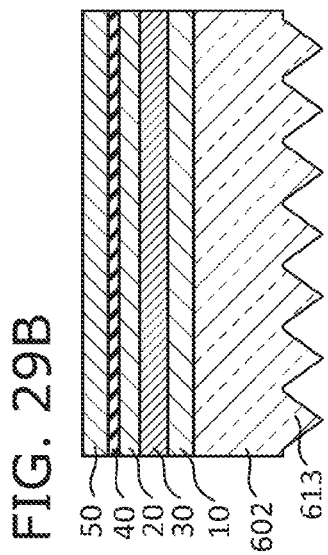

As shown in FIG. 29B, the organic electroluminescent element may include a substrate 602 having a pyramidal portion 613 as the light extraction structure. The first electrode 10 is provided between the substrate 602 and the organic light emitting layer 30. The pyramidal portion 613 of the substrate 602 is provided on a plane opposite to a plane opposing the first electrode 10. The pyramidal portion 613 can be, for example a pyramid such as a trigonal pyramid and a square pyramid, and a cone.

Figure 29C:
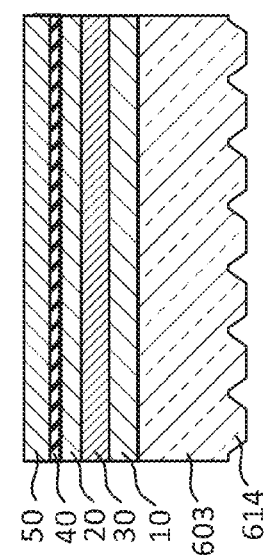
Figure 31A:
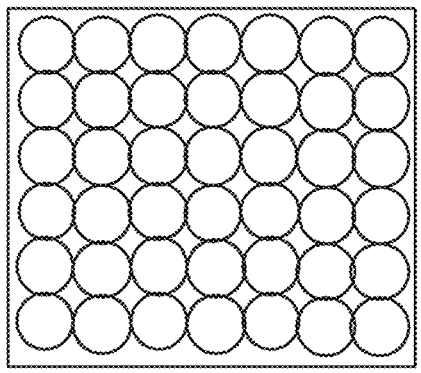
FIGS. 31A to 31E are schematic views illustrating cross-section of FIG. 29F.
Figure 31D:
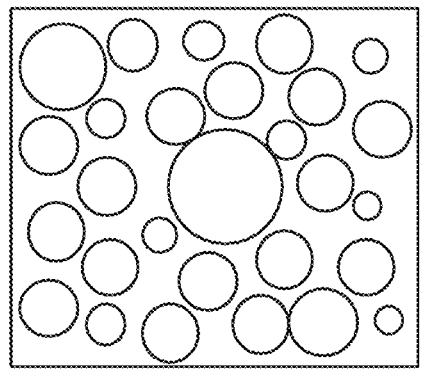
Figure 31B:
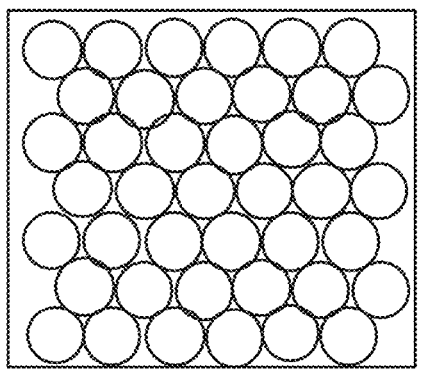
Figure 31E:
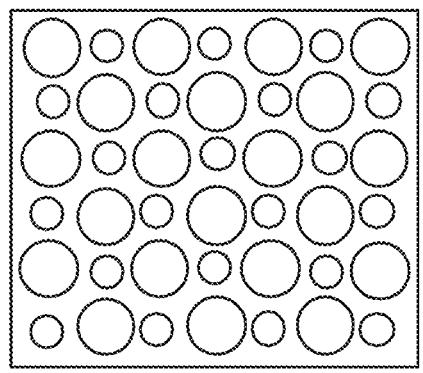
Figure 31C:
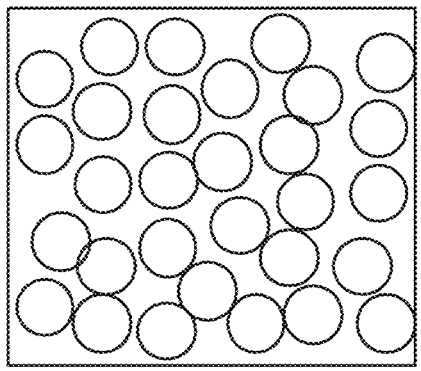

As shown in FIG. 29C, the organic electroluminescent element may include a substrate 603 having a frustum portion 614 as the light extraction structure. The first electrode 10 is provided between the substrate 603 and the organic light emitting layer 30. The frustum portion 614 of the substrate 603 is provided on a plane opposite to a plane opposing the first electrode 10. The frustum portion 614 can be, for example a pyramid frustum such as a trigonal pyramid frustum and a square pyramid frustum, and a cone.

The pyramidal portion 613 and the frustum portion 614 shown in FIGS. 29B and 29C may be arranged regularly or in random configuration similarly to the microlenses 612 shown in FIG. 29A. The pyramidal portion 613 and the frustum portion 614 may be of the same degree of size and may be arranged with different sizes.

As shown in FIG. 29D, the organic electroluminescent element may include a substrate 604 having an irregular concavoconvex portion 615 as the light extraction structure. The first electrode 10 is provided between the substrate 604 and the organic light emitting layer 30. The concavoconvex portion 615 of the substrate 604 is provided on a plane opposite to a plane opposing the first electrode 10. The concavoconvex portion 615 may be a shape combining, for example, a pyramidal body, a pyramid and a curved surface regularly or randomly.

The concavoconvex structure such as the microlens 612, the pyramidal portion 613, the frustum portion 614 and the concavoconvex portion 615 shown in FIGS. 29A to 29D prevents a total internal reflection by changing a traveling direction of the light between the substrate and the exterior. That is, the microlens 612, the pyramidal portion 613, the frustum portion 614 and the concavoconvex portion 615 convert the substrate mode component L2 to the external mode component L1.

As shown in FIG. 29E, the organic electroluminescent element may include a substrate 605 having a diffraction grating portion 615 as the light extraction structure. The first electrode 10 is provided between the substrate 605 and the organic light emitting layer 30. The diffraction grating portion 616 of the substrate 605 is provided on a plane opposite to a plane opposing the first electrode 10. When light is incident on the diffraction grating portion 616, diffraction phenomena due to interference of the light occur to change the traveling direction of the light. That is, the diffraction grating portion 616 converts the substrate mode component L2 to the external mode component L1.

As shown in FIG. 29F, the organic electroluminescent element may include a substrate 606 having a microsphere 607 as the light extraction structure. A diameter of the microsphere 607 can be, for example, larger than a wavelength of visible light, for example, 1 micrometer or more. The first electrode 10 is provided between the substrate 606 and the organic light emitting layer 30. The microsphere 607 may be on a side of a plane opposing the first electrode layer 10 of the substrate 606, and may be on a side opposite to a plane opposing the first electrode 10. The substrate 606 can include, for example, a substance and a resin layer sticking the substance with paste. The microsphere 607 can be, for example, air contained in the resin layer. When light is incident on the microsphere 607, the traveling direction of the light is changed due to refraction. That is, the microsphere 607 converts the substrate mode component L2 to the external mode component L1.

The microsphere 607 can be arranged as shown in FIGS. 31A to 31E on one plane perpendicular to a stacking direction of the substrate 601, the first electrode 10 and the organic light emitting layer 30. That is, the microsphere 607 may be arranged regularly in a square lattice configuration or a hexagonal lattice configuration, and may be arranged randomly. The microsphere 607 may be of the same degree of size and may be arranged with different sizes.

As shown in FIG. 29G, the organic electroluminescent element may include a substrate 617 including a support layer 608 and a light scattering layer 609 as the light extraction structure. The first electrode 10 is provided between the support layer 608 and the organic light emitting layer 30. The support layer 608 is provided between the first electrode 10 and the scattering layer 609. Alternatively, the first electrode 10 may be provided between the scattering layer 609 and the organic light emitting layer 30, and the scattering layer 609 may be provided between the first electrode 10 and the support layer 608.

As shown in FIG. 29H, the organic electroluminescent element may include a light scattering substrate 610 as the light extraction structure. The first electrode 10 is provided between the substrate 610 and the organic light emitting layer 30.

In FIGS. 29G and 29H, light incident on the scattering layer 609 or the substrate 610 changes the traveling direction of the light into various directions by scattering. That is, the scattering layer 609 or the substrate 610 converts the substrate mode component L2 to the external mode component L1.

As shown in FIG. 29I, the organic electroluminescent element may include a hemisphere lens 611 having a diameter larger than cross-section of a stacked structure of the first electrode 10, the organic light emitting layer 30 and the second electrode 20 as the light extraction structure. Since light is incident almost perpendicularly to an interface between the hemisphere lens 611 and the exterior, total internal reflection does not occur on this interface. Therefore, the hemisphere lens 611 converts the substrate mode component L2 to the external mode component L1.

FIGS. 32A to 32G are schematic views illustrating organic electroluminescent elements according to variations of the fifth embodiment, and corresponds to FIGS. 29A to 29G, respectively. As shown in these variations, it is also possible to provide a layer formed from a film or the like including the microlens 612, the pyramidal portion 613, the frustum portion 614, the concavoconvex portion 615 and the diffraction grating portion 616 on the support layer 600 to be a substrate. It is also possible to form the substrate 606 including the microsphere 607 from the film or the like. It is also possible to provide a film formed from the film or the like including the scattering layer 609 on the support layer 608 to be a substrate.

Sixth Embodiment

FIGS. 33A to 33J are schematic views illustrating organic electroluminescent elements according to an eighth embodiment. FIGS. 34A to 34H are schematic views illustrating one cross-section of FIG. 33A. FIGS. 35A to 35G are schematic views illustrating one cross-section of FIG. 33H.

In the embodiment, the organic electroluminescent element has a light extraction structure converting the thin film mode component L3 to the substrate mode component L2 and the external mode component L1. The light extraction structure includes a substrate and a high refractive index layer. The substrate opposes the first electrode, and the high refractive index layer is provided between the substrate and the first electrode 10. The high refractive index layer is formed from a high refractive index material having a refractive index equivalent to or more than a refractive index of the first electrode layer 10 or the organic light emitting layer 30.

A plane of the high refractive index layer opposing the substrate can have a concavoconvex structure such as, for example, a microlens, a pyramidal portion, a frustum portion and a concavoconvex portion.

As shown in FIG. 33A, a plane of a high refractive index layer 701 opposing a substrate 621 may include a microlens being convex toward the plane opposing the first electrode 10.

As shown in FIG. 34A, a convex portion can be arranged as shown in FIGS. 34B to 34H in an AA plane which is one planar surface perpendicular to a stacking direction of the substrate 601, the first electrode 10 and the organic light emitting layer 30. That is, as shown in FIGS. 34B to 34D, the convex portion may be arranged regularly in a square lattice configuration or a hexagonal lattice configuration, and may be arranged randomly. As shown in FIGS. 34E to 34F, the convex portion may be of the same degree of size and may be arranged with different sizes. Furthermore, as shown in FIG. 34G, the convex portions extending in one direction parallel to the AA plane may be arranged in parallel each other. Furthermore, as shown in FIG. 34H, the convex portions extending in one direction parallel to the AA plane may be formed in a lattice configuration.

As shown in FIG. 33B, a plane of a high refractive index layer 702 opposing a substrate 622 may have a microlens concave to the plane opposing the first electrode.

As shown in FIG. 33C, a plane of a high refractive index layer 703 opposing a substrate 623 may have a pyramidal portion convex to the plane opposing the first electrode 10.

As shown in FIG. 33D, a plane of a high refractive index layer 704 opposing a substrate 624 may have a frustum portion convex or concave to the plane opposing the first electrode 10.

As shown in FIG. 33E, a plane of a high refractive index layer 705 opposing a substrate 625 may have a concavoconvex portion having an irregular concavoconvex shape.

The high refractive index layer can be configured to be as follows other than having the concavoconvex structure.

As shown in FIG. 33F, a plane of a high refractive index layer 706 opposing a substrate 626 may have a lattice grating or a stripe grating.

As shown in FIG. 33G, a high refractive index layer 707 may have microsphere 717. For example, the microsphere has a diameter of a wavelength of visible light or more.

Figure 35B:
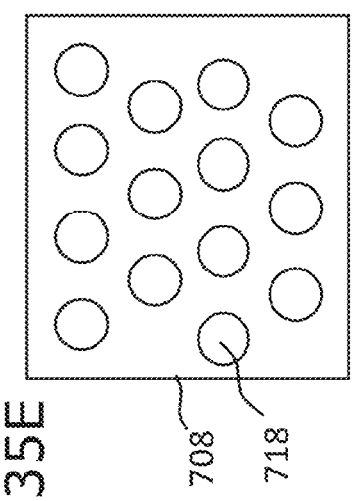
FIGS. 35A to 35G are schematic views illustrating cross-section of FIG. 33H.
Figure 35C:
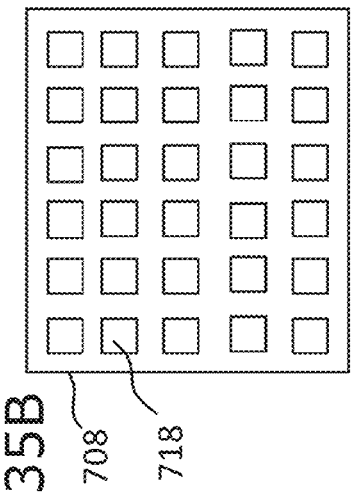
Figure 35A:
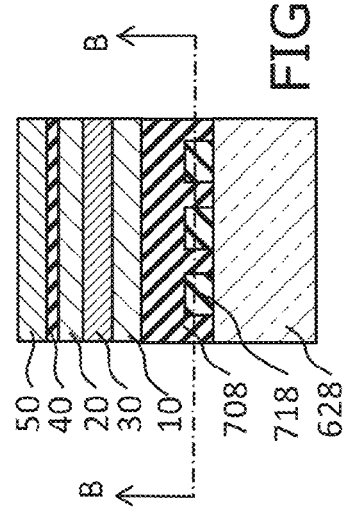
Figure 35E:
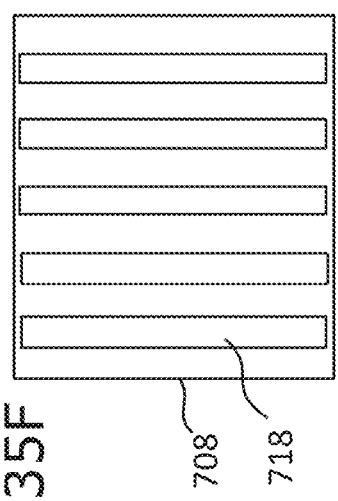
Figure 35F:
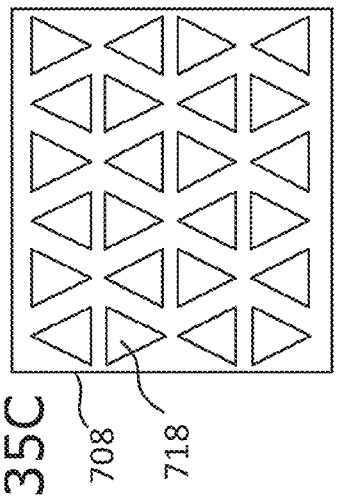
Figure 35D:
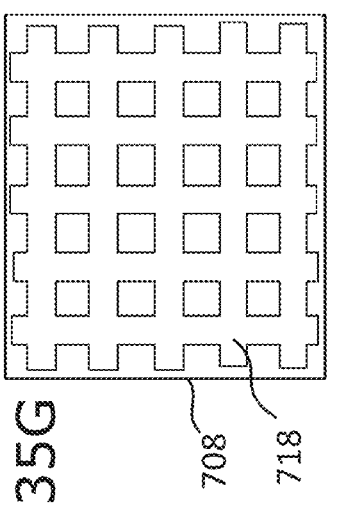
Figure 35G:
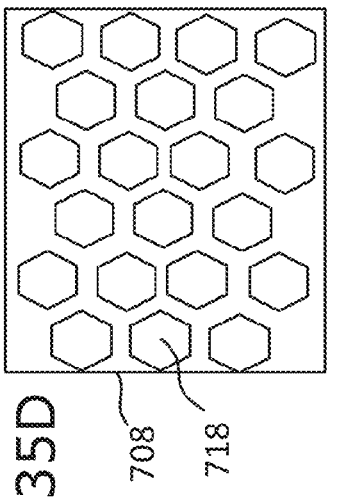
Figure 36A:
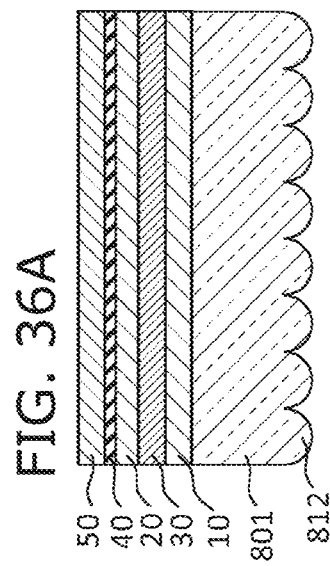
FIGS. 36A to 36I are schematic views illustrating organic electroluminescent elements according to a seventh embodiment.
Figure 36B:
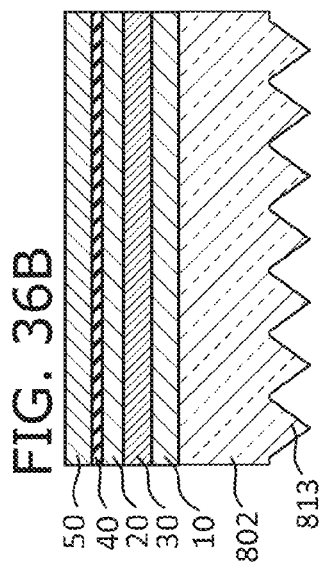
Figure 36C:
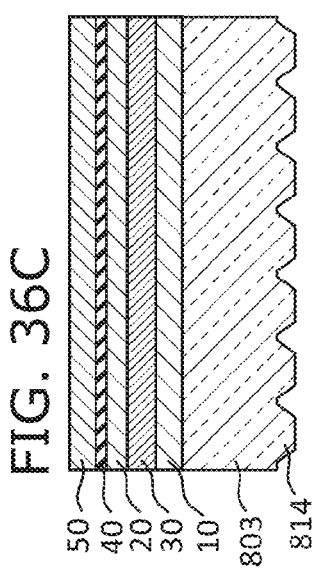
Figure 36D:
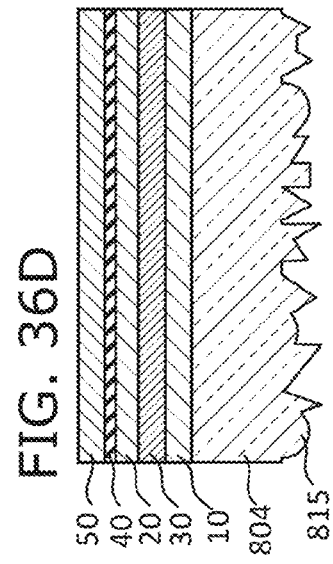
Figure 36E:
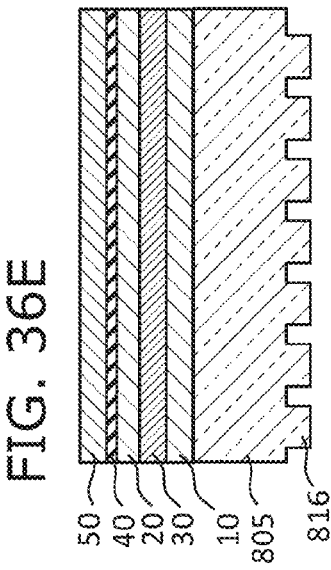
Figure 36F:
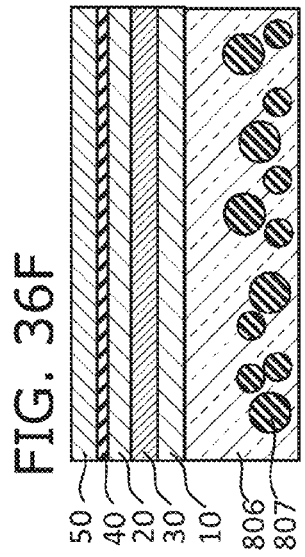
Figure 36G:
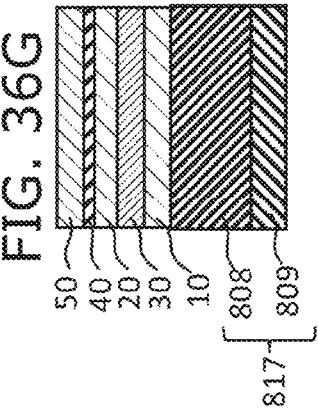
Figure 36H:
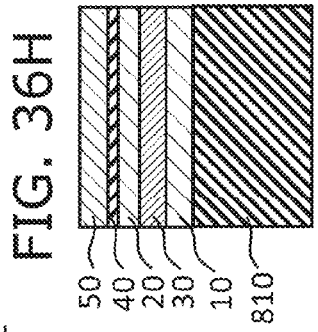
Figure 36I:
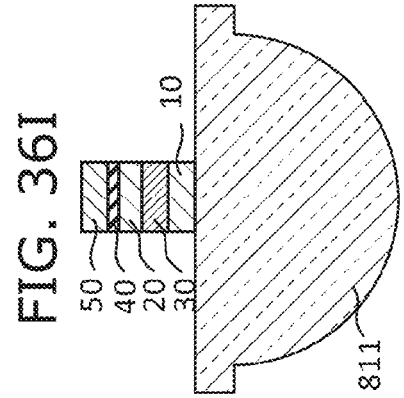
Figure 37G:
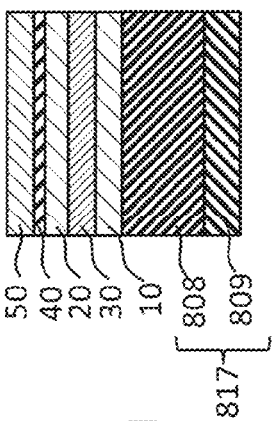
FIGS. 37A to 37G are schematic views illustrating organic electroluminescent elements according to variations of the seventh embodiment.
Figure 37D:
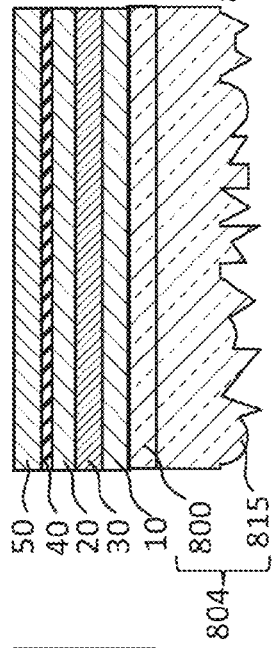
Figure 37E:
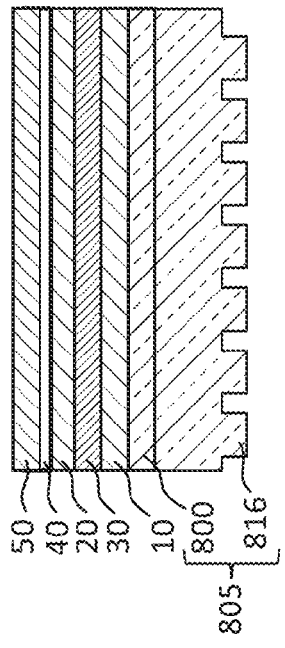
Figure 37F:
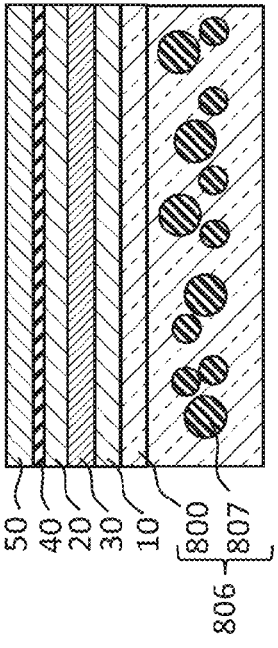
Figure 37A:
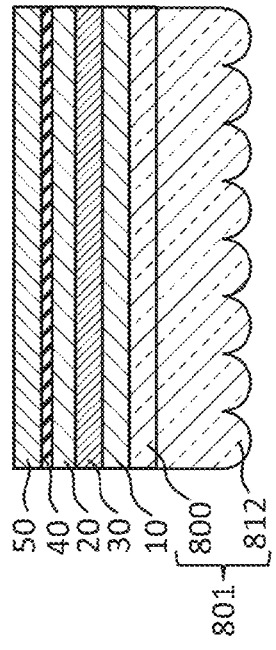
Figure 37B:
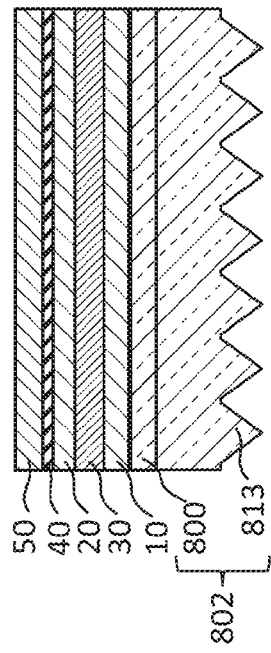
Figure 37C:
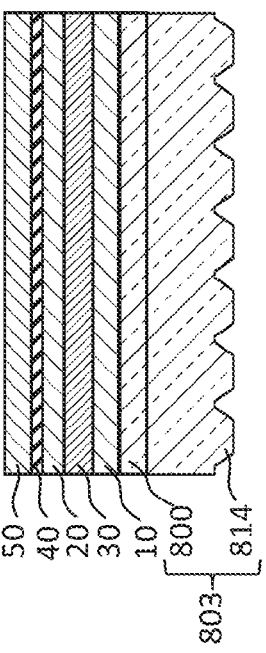

As shown in FIG. 33H, a high refractive index layer 708 may have a low refractive index portion 718 having a refractive index lower than a refractive index of the high refractive index layer 708 in a plane opposing a substrate 628. The convex portion can be arranged as shown in FIGS. 35B to 35E in the AA plane which is one planar surface perpendicular to the stacking direction of the substrate 601, the first electrode 10 and the organic light emitting layer 30 shown in FIG. 35A. That is, as shown in FIGS. 35B to 35E, the low refractive index portion can be a quadratic prism, a triangular prism, a hexagonal prism, a cylinder. The low refractive index portion can be arranged in a square lattice configuration or a hexagonal lattice configuration. As shown in FIGS. 35F to 35G, the low refractive index portion can also be in a stripe configuration or a lattice configuration.

Furthermore, as shown in FIG. 33I, the scattering layer may be provided between the high refractive index layer and the substrate.

Alternatively, as shown in FIG. 33J, the high refractive index layer is not provided and the scattering layer is provided between the first electrode and the substrate to be the light extraction structure.

In FIGS. 33A to 33J, the thin film mode component L3 can be converted to the substrate mode component L2 or the external mode component L1 by the light extraction structure.

Seventh Embodiment

FIGS. 36A to 36I are schematic views illustrating organic electroluminescent elements according to a seventh embodiment. FIGS. 36A to 36I show configuration similar to FIGS. 29A to 29I, respectively, however are different from FIGS. 29A to 29I in a point that the substrate forming the light extraction structure is formed from the high refractive index material having a refractive index equivalent to or more than a refractive index of a refractive index of the first electro 10 or the organic light emitting layer 30. Numerals 801 to 8017 in FIGS. 36A to 36I correspond to numerals 601 to 617 in FIGS. 29A to 29I, respectively.

FIGS. 37A to 37G are schematic views illustrating organic electroluminescent elements according to variations of the seventh embodiment, and correspond to FIGS. 36A to 36G, respectively. As shown in these variations, it is also possible to provide a layer formed from a film or the like including a microlens 812, a pyramidal portion 813, a frustum portion 814, a concavoconvex portion 815 and a diffraction grating portion 816 on the support layer 800 to be a substrate. It is also possible to form the substrate 806 including the microsphere 807 from the film or the like. It is also possible to provide a film formed from the film or the like including the scattering layer 809 on the support layer 808 to be a substrate.

The total internal reflection at an interface between the first electrode and the substrate disappears because of the light extraction structure like this, therefore, the thin film mode component L3 can be converted to the substrate mode component L2, and the substrate mode component L2 can be converted to the external mode component L1.

Eighth Embodiment

FIGS. 38A to 38D are schematic views illustrating organic electroluminescent elements according to an eighth embodiment. In the embodiment, the light extraction structure includes a substrate opposing the first electro 10 and a high refractive index layer provided between the first electrode and the substrate. The substrate can adopt the substrate shapes used in the fifth embodiment and the variations and the sixth embodiment. The high refractive index layer can adopt the substrate shapes used in the seventh embodiment and the variations. Combination of the shape of the substrate and the shape of the high refractive index layer is arbitrary. For example, one of the substrates shown in FIGS. 29A to 29I, FIGS. 32A to 32G, FIGS. 36A to 36I, FIGS. 37A to 37G can be arbitrarily combined with one of the high refractive index layers shown in FIGS. 33A to 33J.

Figure 38A:
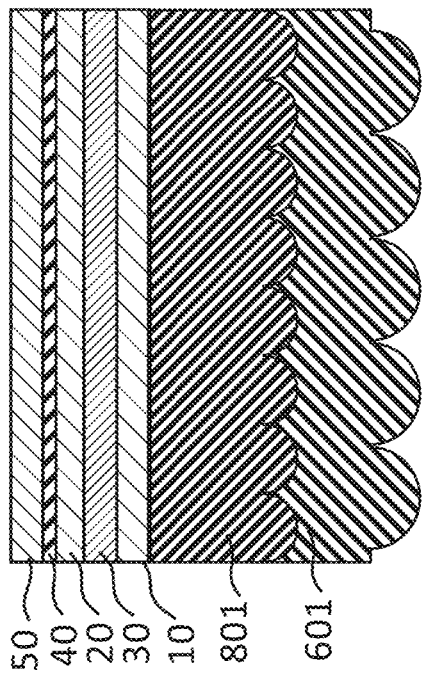
FIGS. 38A to 38D are schematic views illustrating organic electroluminescent elements according to an eighth embodiment.
Figure 38B:
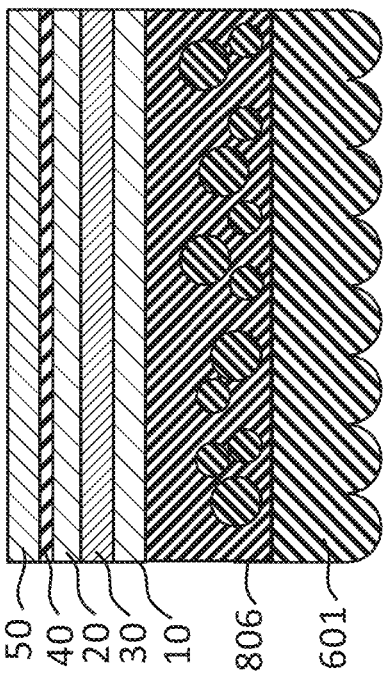
Figure 38C:
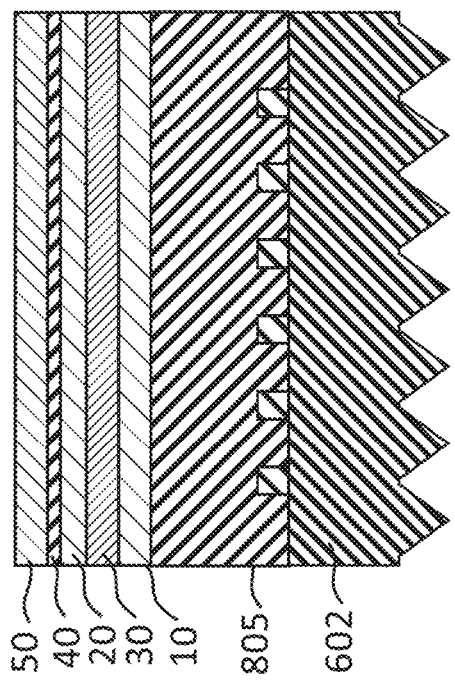
Figure 38D:
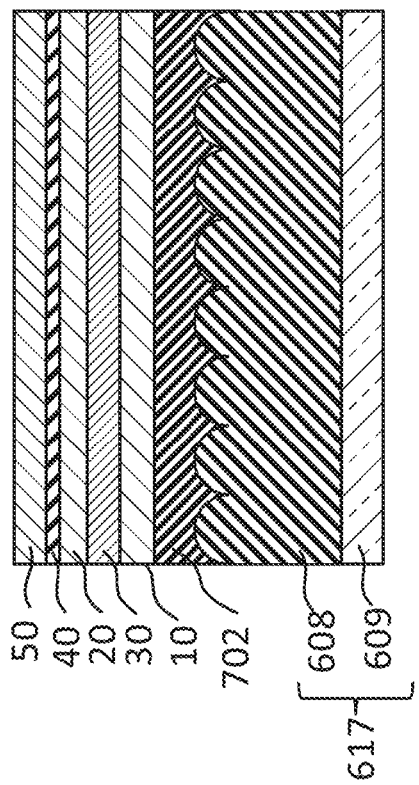
Figure 39A:
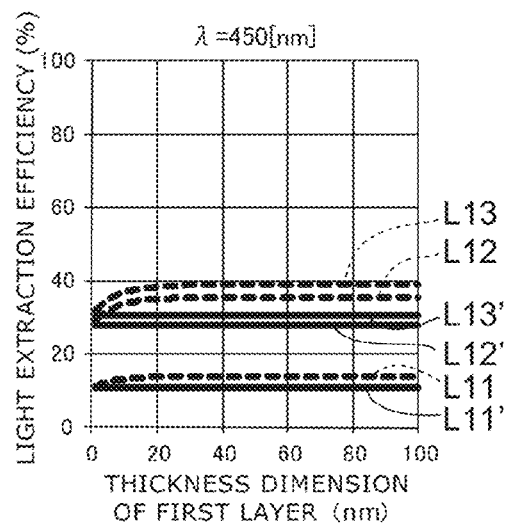
FIGS. 39A to 39D show graphs for illustrating wavelength dependence of light extraction efficiency.
Figure 39B:
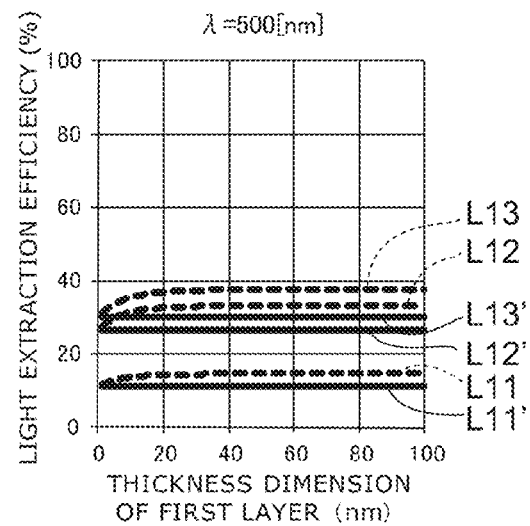
Figure 39C:
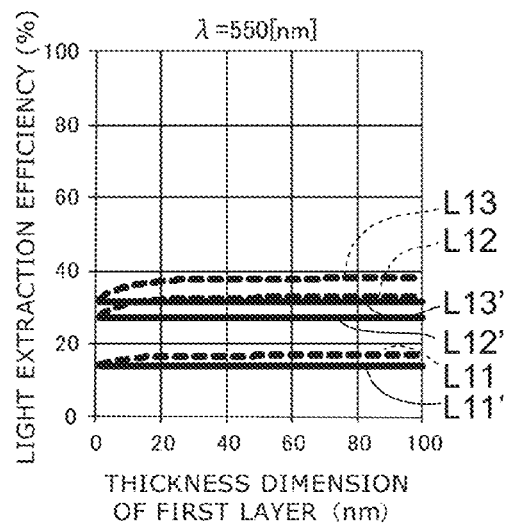
Figure 39D:
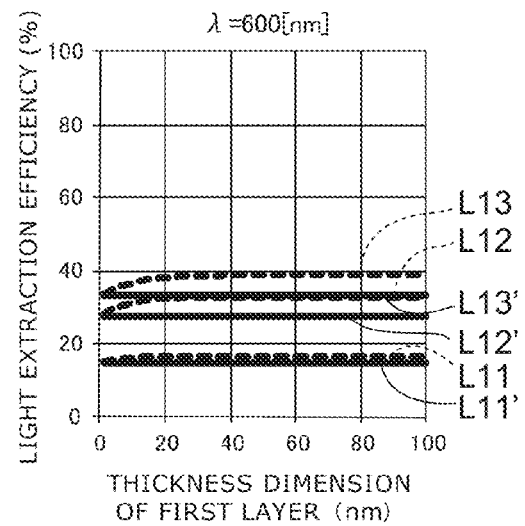
Figure 40A:
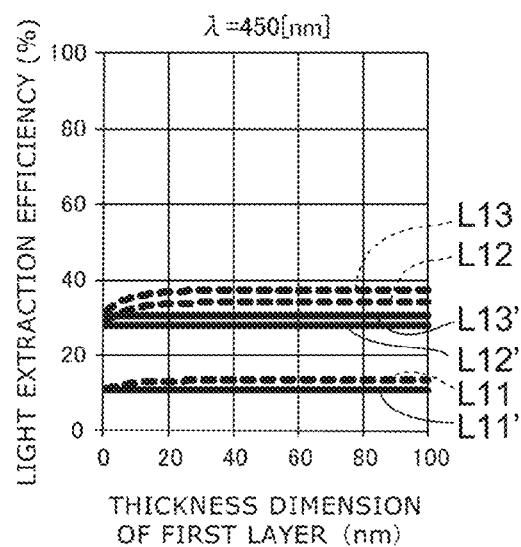
FIGS. 40A to 40D show graphs for illustrating wavelength dependence of light extraction efficiency.
Figure 40B:
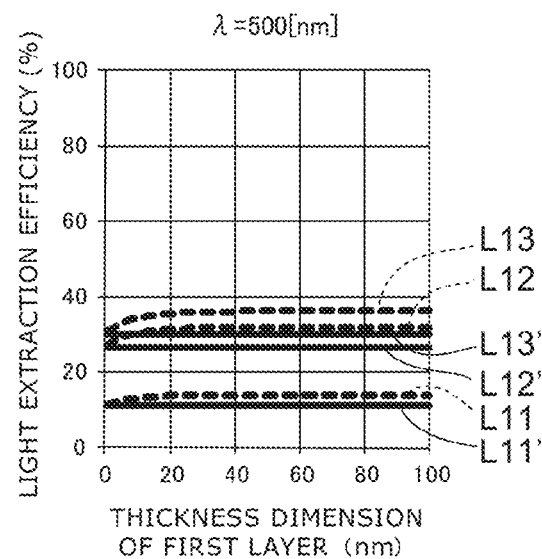
Figure 40C:
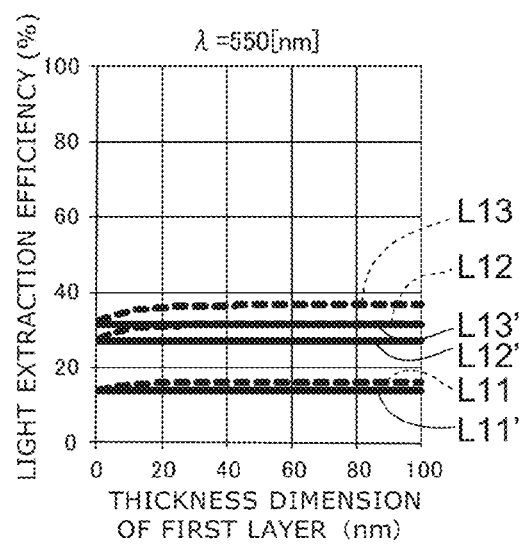
Figure 40D:
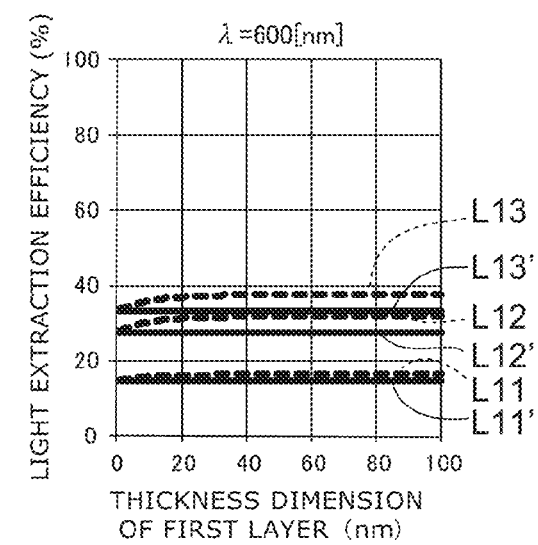
Figure 41A:
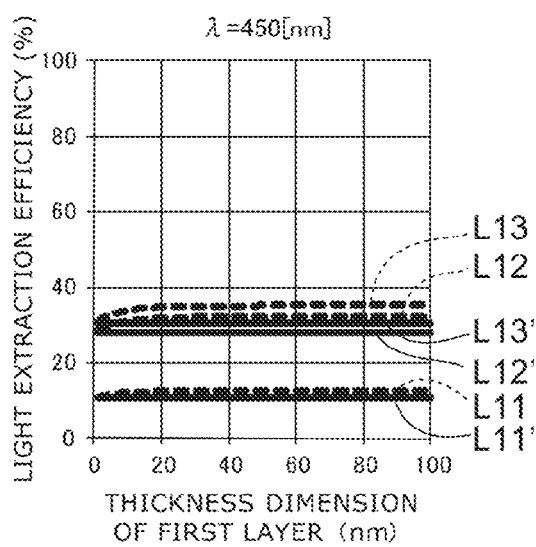
FIGS. 41A to 41D show graphs for illustrating wavelength dependence of light extraction efficiency.
Figure 41B:
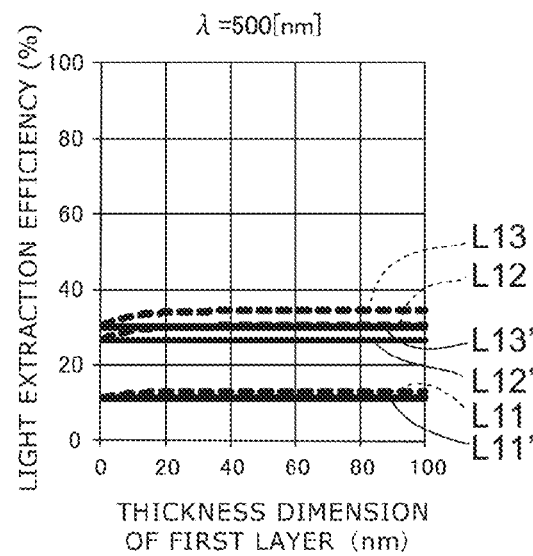
Figure 41C:
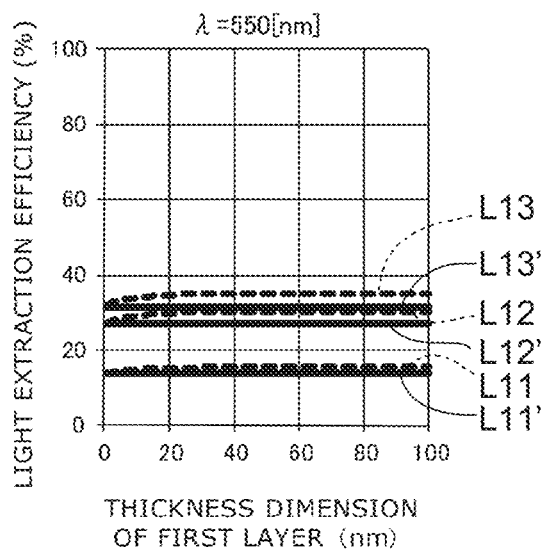
Figure 41D:
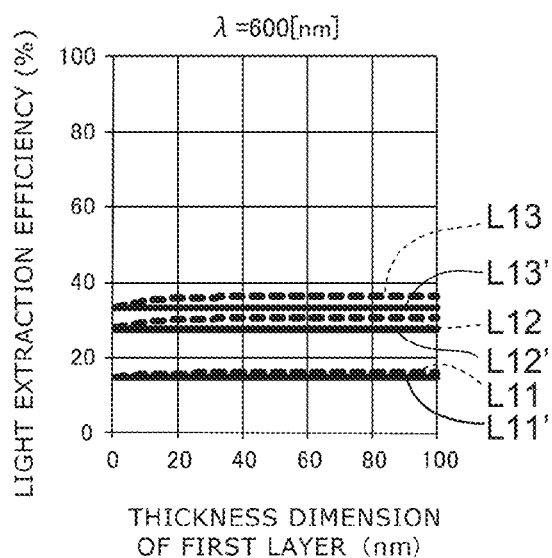
Figure 42A:
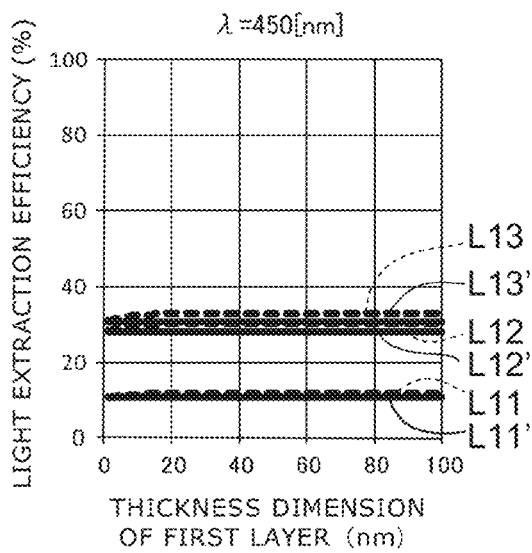
FIGS. 42A to 42D show graphs for illustrating wavelength dependence of light extraction efficiency.
Figure 42B:
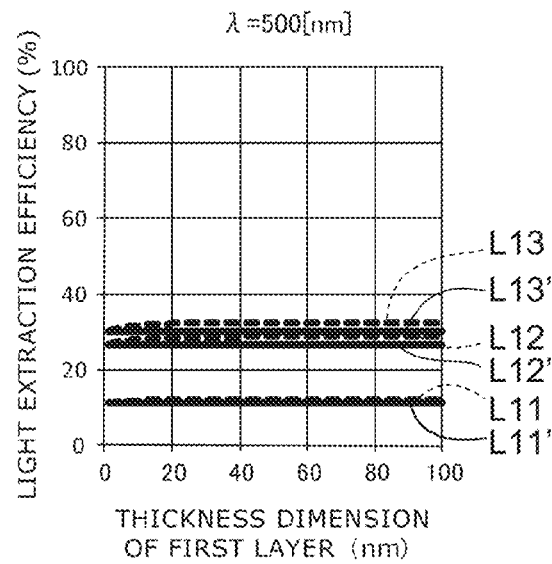
Figure 42C:
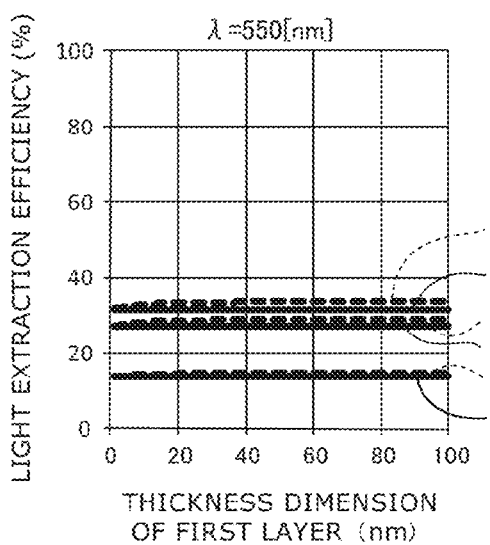
Figure 42D:
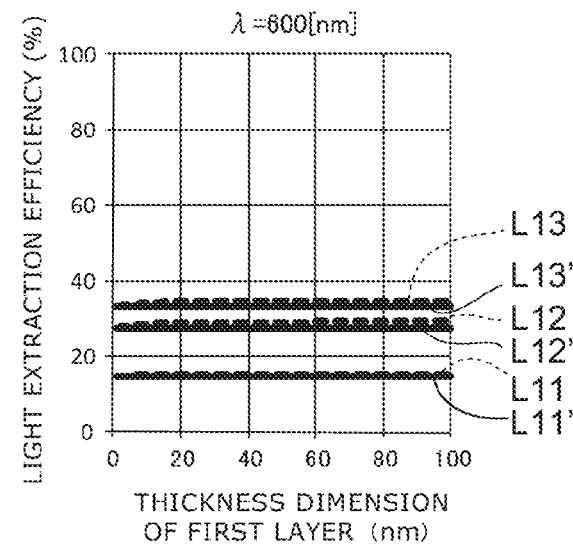
Figure 43A:
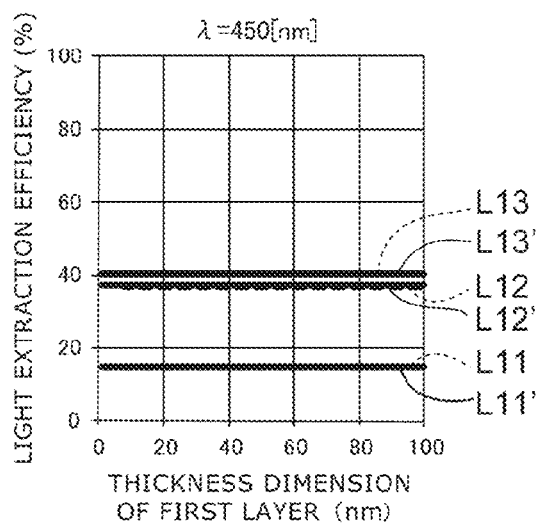
FIGS. 43A to 43D show graphs for illustrating wavelength dependence of light extraction efficiency.
Figure 43B:
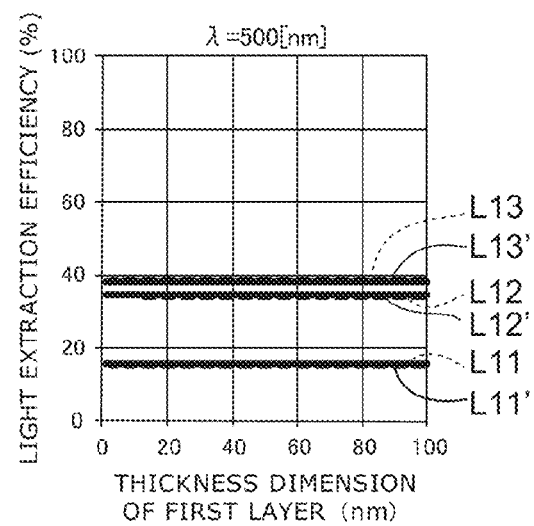
Figure 43C:
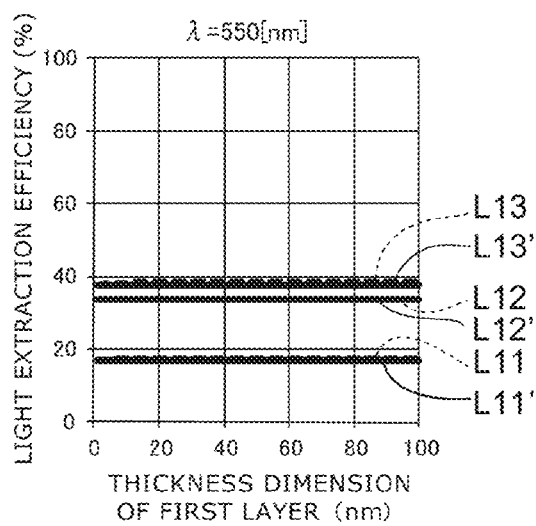
Figure 43D:
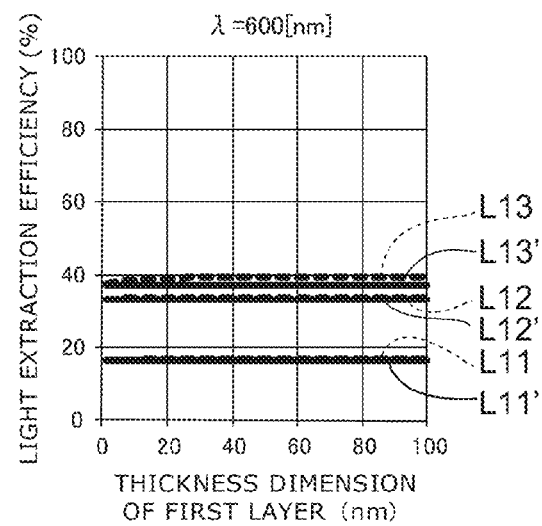
Figure 44A:
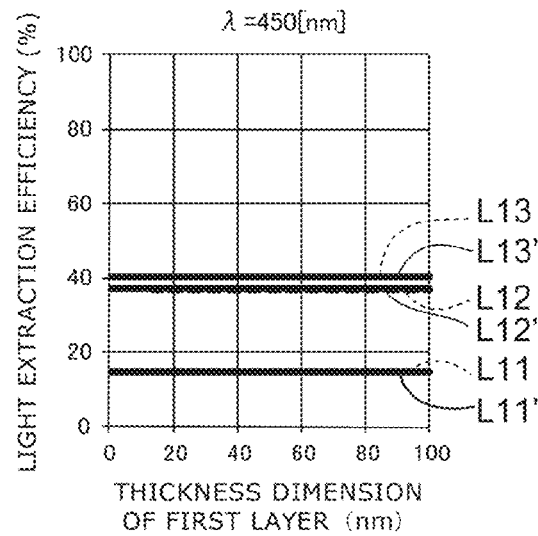
FIGS. 44A to 44D show graphs for illustrating wavelength dependence of light extraction efficiency.
Figure 44B:
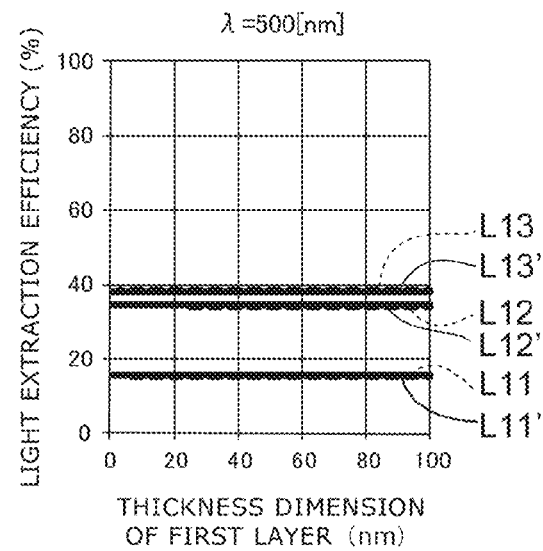
Figure 44C:
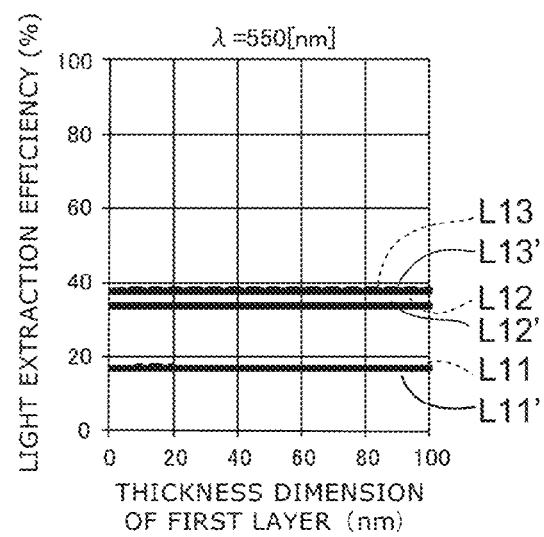
Figure 44D:
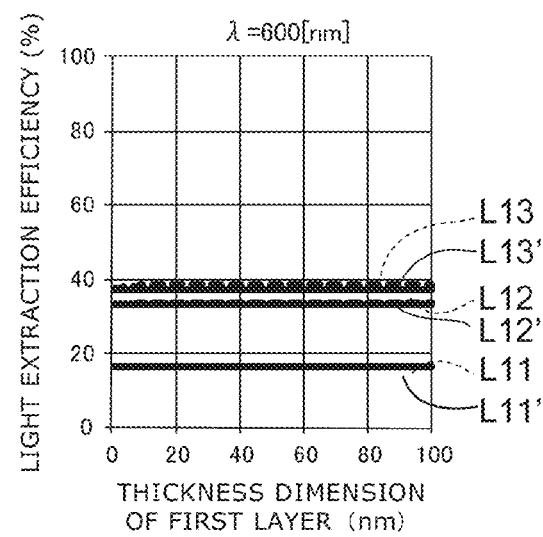
Figure 45A:
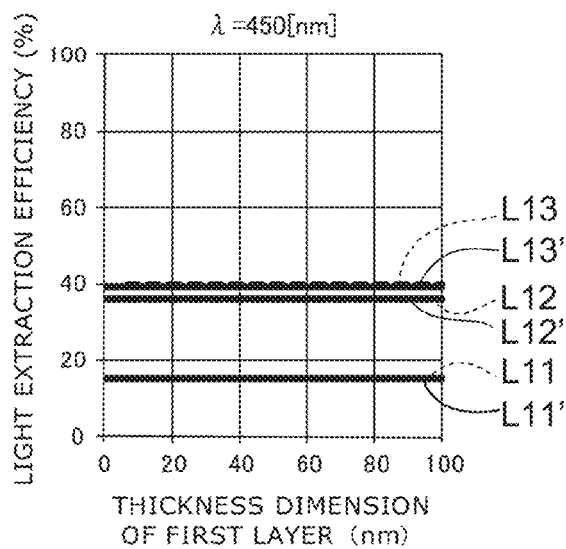
FIGS. 45A to 45D show graphs for illustrating wavelength dependence of light extraction efficiency.
Figure 45B:
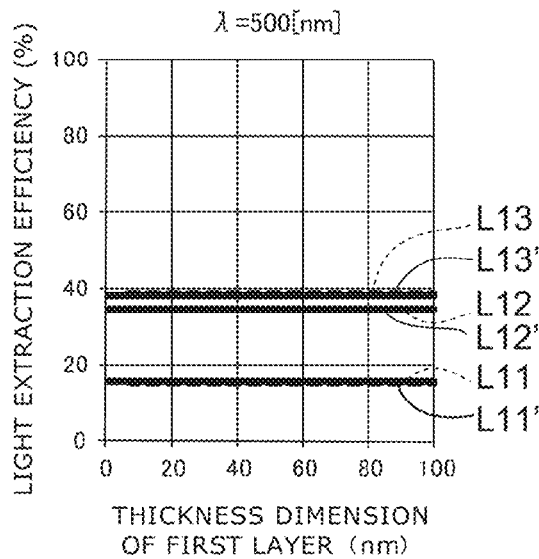
Figure 45C:
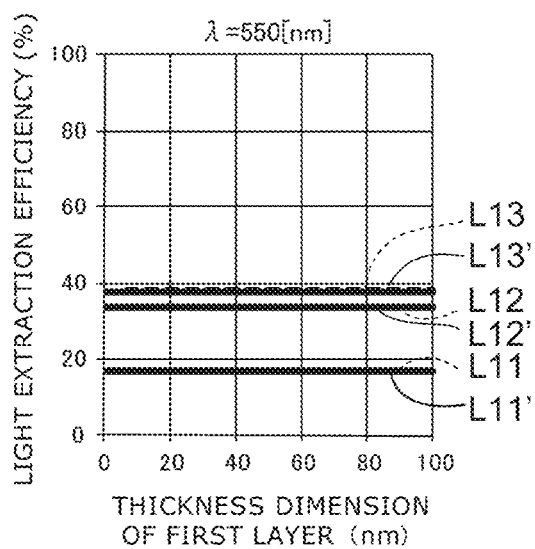
Figure 45D:
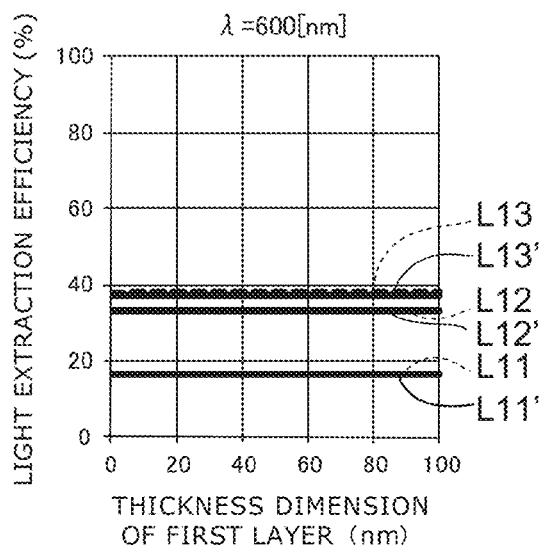
Figure 46A:
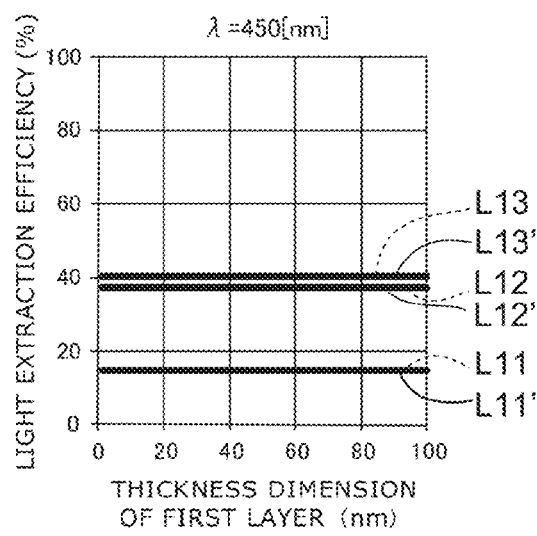
FIGS. 46A to 46D show graphs for illustrating wavelength dependence of light extraction efficiency.
Figure 46B:
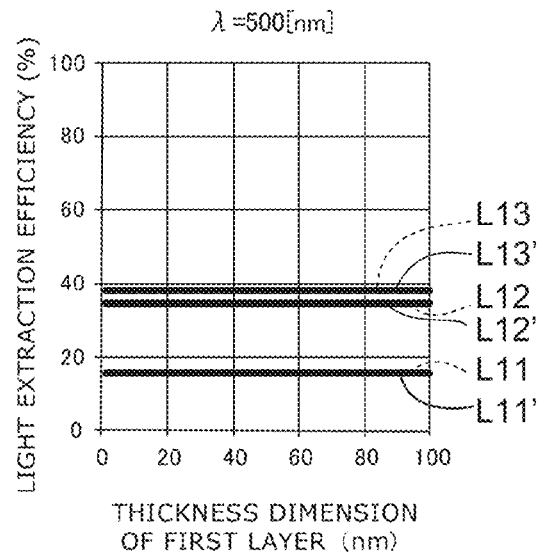
Figure 46C:
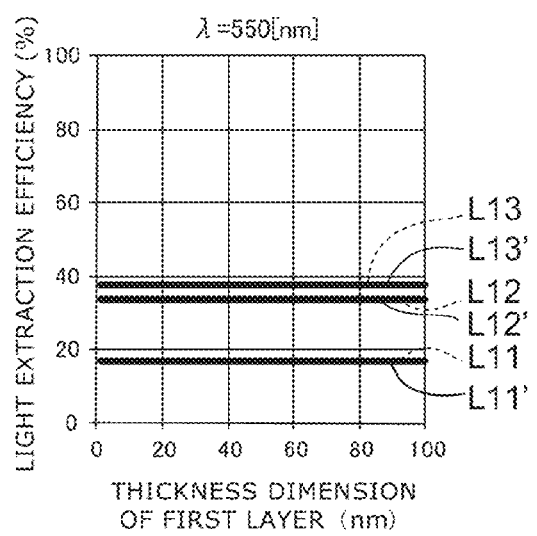
Figure 46D:
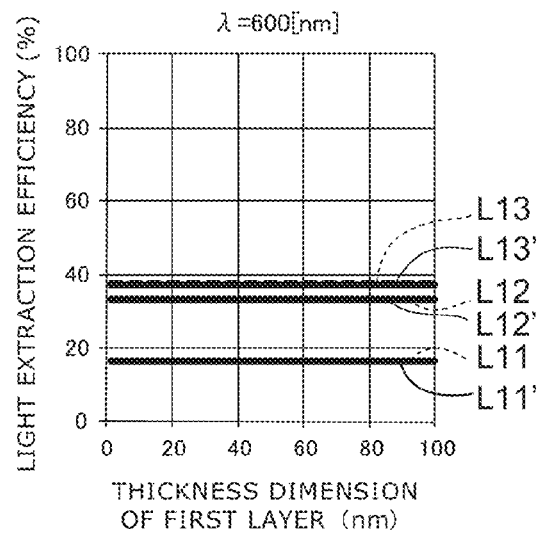

As one example, as shown in FIG. 38A, the light extraction structure including the high refractive index layer having microlenses on the plane opposing the high refractive index and the substrate having microlenses on a plane opposite to a plane opposing the substrate can be used.

The light extraction structure including the high refractive index layer having microspheres and the substrate having microlenses can be used.

The light extraction structure including the high refractive index layer a diffraction grating and the low refractive index layer having a pyramidal portion can be used.

Furthermore, the light extraction structure including the high refractive index layer having concave microlenses, the scattering layer and the substrate provided between the high refractive index layer and the scattering layer can be used.

The thin film mode component L3 can be converted to the substrate mode component L2 by the light extraction structure like this, and the substrate mode component L2 can be converted to the external mode component L1.

Ninth Embodiment

In the ninth embodiment, particularly, the first layer 21 can be made of an alloy of alkali metal and Ag or an alloy of alkaline-earth metal and Ag, the second layer 22 can be made of Ag. Particularly, the first layer 21 can be made of an alloy of alkali metal and Al or an alloy of alkaline-earth metal and Al, and the second layer can be made of Al.

FIG. 39A to FIG. 42D show graphs for illustrating wavelength dependence of light extraction efficiency in the case where the first later 21 is made of an alloy of Mg and Ag and the second layer 22 is made of Ag. FIG. 43A to FIG. 46D show graphs for illustrating wavelength dependence of light extraction efficiency in the case where the first later 21 is made of an alloy of Mg and Al and the second layer 22 is made of Al.

The horizontal axis in FIG. 39A to FIG. 46D represents the thickness dimension of the first layer 21. The vertical axis in FIG. 39A to FIG. 46D represents the light extraction efficiency. The descriptions about L11, L12, L13 and L11', L12', L13' are the same as the descriptions in the first embodiment.

In FIG. 39A to FIG. 46D, the figures with the suffix A show the case where the wavelength of light generated at the light emitting position 33 in the light emitting layer 30 is 450 nanometers (nm). The figures with the suffix B show the case where the wavelength of light is 500 nanometers (nm). The figures with the suffix C show the case where the wavelength of light is 550 nanometers (nm). The figures with the suffix D show the case where the wavelength of light is 600 nanometers (nm). Set values of the organic electroluminescent elements used for simulation in FIG. 39A to FIG. 46D are the same as the values in the first embodiment.

FIGS. 39A to 39D show the case of a volume ratio of Mg:Ag being 0.8:0.2 in the first layer, FIGS. 40A to 40D show the case of the ratio being 0.6:0.4, FIGS. 41A to 41D show the case of the ratio being 0.4:0.6, FIGS. 42A to 42D show the case of the ratio being 0.2:0.8. FIGS. 43A to 43D show the case of a volume ratio of Mg:Al being 0.8:0.2 in the first layer, FIGS. 44A to 44D show the case of the ratio being 0.6:0.4, FIGS. 45A to 45D show the case of the ratio being 0.4:0.6, FIGS. 46A to 46D show the case of the ratio being 0.2:0.8.

As seen from FIGS. 39A to FIG. 42D, plasma loss can be reduced in comparison with the second electrode made of only Ag at any wavelengths, furthermore the light extraction efficiency can be improved. As seen from FIGS. 43A to 46D, plasma loss can be reduced in comparison with the second electrode made of only Al in the case where the wavelength of light generated at the light emitting position 33 is long (particularly, not less than 550 nm), furthermore the light extraction efficiency can be improved.

As just described, the effect similar to the first embodiment can be achieved in the embodiment as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A light emitting element comprising:
a first electrode;
a second electrode provided opposite to the first electrode and including a plurality of layers, the plurality of layers including a first layer;
a light emitting layer provided between the first electrode and the second electrode; and
a conductive section piercing the first layer of the second electrode in a thickness direction of the first layer and including a conductive material,
each of the plurality of layers of the second electrode including at least one selected from the group consisting of Al, Al alloy, Ag, Ag alloy, alkali metals, and alkaline-earth metals and being different from one another.

2. The element according to claim 1, wherein
the second electrode includes the first layer provided on a side provided with the light emitting layer and a second layer provided on an opposite side of the first layer from a side provided with the light emitting layer,
the first layer includes at least one of the alkali metals and the alkaline-earth metals, and
the second layer includes at least one selected from the group consisting of Al, Al alloy, Ag, and Ag alloy.

3. The element according to claim 2, wherein the first layer includes at least one selected from the group consisting of Li, Na, K, Rb, Cs, Mg, and Ca.

4. The element according to claim 2, wherein the first layer includes at least one selected from the group consisting of K, Rb, and Cs.

5. The element according to claim 2, wherein the first layer has a thickness dimension of 1 nanometer (nm) or more and 100 nanometers (nm) or less.

6. The element according to claim 2, wherein the first layer has a thickness dimension of 10 nanometer (nm) or more and 100 nanometers (nm) or less.

7. The element according to claim 2, wherein
the second electrode further includes a third layer on the side provided with the light emitting layer, and
the third layer includes at least one selected from the group consisting of Al, Al alloy, Ag, and Ag alloy.

8. The element according to claim 7, wherein the third layer has a thickness dimension of 30 nanometer (nm) or less.

9. The element according to claim 7, wherein the third layer has a thickness dimension of 10 nanometer (nm) or less.

10. The element according to claim 7, wherein one end portion of the conductive section is in contact with the second layer of the second electrode, and the other end portion is in contact with a first functional layer or the third layer of the second electrode.

11. The element according to claim 10, further comprising:
the first functional layer provided between the light emitting layer and the second electrode.

12. The element according to claim 11, wherein the first functional layer includes at least one of LiF and CsF.

13. The element according to claim 1, wherein the conductive section is provided in a plurality.

14. The element according to claim 1, further comprising:
a light extraction structure opposing the first electrode,
the first electrode being provided between the light extraction structure and the light emitting layer.

15. A light emitting device comprising:
a plurality of light emitting elements each including:
a first electrode;
a second electrode provided opposite to the first electrode and including a plurality of layers, the plurality of layers including a first layer;
a light emitting layer provided between the first electrode and the second electrode; and
a conductive section piercing the first layer of the second electrode in a thickness direction of the first layer and including a conductive material,
the plurality of layers of the second electrode each including at least one selected from the group consisting of Al, Ag, Ag alloy, alkali metals, and alkaline-earth metals and being different from one another,
in at least two of the plurality of light emitting elements, the light emitting layers having different light emission wavelength regions.

16. The device according to claim 15, further comprising:
a substrate having a concavity and a convexity.

17. The device according to claim 15, wherein
the second electrode includes the first layer provided on a side provided with the light emitting layer and a second layer provided on an opposite side of the first layer from a side provided with the light emitting layer,
the first layer includes at least one of the alkali metals and the alkaline-earth metals, and
the second layer includes at least one selected from the group consisting of Al, Ag, and Ag alloy.

18. The device according to claim 17, wherein the first layer includes at least one selected from the group consisting of Li, Na, K, Rb, Cs, Mg, and Ca.

19. The device according to claim 15, wherein
the second electrode further includes a third layer on a side provided with the light emitting layer of the first layer, and
the third layer includes at least one selected from the group consisting of Al, Ag, and Ag alloy.

* * * * *